United States Patent
Inoue et al.

(10) Patent No.: US 9,837,625 B2
(45) Date of Patent: Dec. 5, 2017

(54) ORGANIC ELECTROLUMINESCENT ELEMENT

(71) Applicant: Konica Minolta, Inc., Tokyo (JP)

(72) Inventors: Satoru Inoue, Hino (JP); Hiroshi Kita, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 626 days.

(21) Appl. No.: 14/381,758

(22) PCT Filed: Feb. 19, 2013

(86) PCT No.: PCT/JP2013/053990
§ 371 (c)(1),
(2) Date: Aug. 28, 2014

(87) PCT Pub. No.: WO2013/129183
PCT Pub. Date: Sep. 6, 2013

(65) Prior Publication Data
US 2015/0053949 A1    Feb. 26, 2015

(30) Foreign Application Priority Data

Feb. 29, 2012    (JP) ................. 2012-042708

(51) Int. Cl.
| | |
|---|---|
| *C09K 11/06* | (2006.01) |
| *H05B 33/10* | (2006.01) |
| *H01L 51/50* | (2006.01) |
| *H01L 51/00* | (2006.01) |

(52) U.S. Cl.
CPC .......... *H01L 51/5028* (2013.01); *C09K 11/06* (2013.01); *H01L 51/0085* (2013.01); *H01L 51/5016* (2013.01); *H01L 51/5036* (2013.01); *H05B 33/10* (2013.01); *C09K 2211/1007* (2013.01); *C09K 2211/1011* (2013.01); *C09K 2211/1029* (2013.01); *C09K 2211/1044* (2013.01); *C09K 2211/1088* (2013.01); *C09K 2211/1092* (2013.01); *C09K 2211/185* (2013.01); *H01L 2251/55* (2013.01)

(58) Field of Classification Search
None
See application file for complete search history.

(56) References Cited

U.S. PATENT DOCUMENTS 6,097,147 A       8/2000  Baldo et al.
2011/0057559 A1   3/2011  Xia et al.

FOREIGN PATENT DOCUMENTS

JP    2007-189002 A    7/2007
JP    2010-238880 A    10/2010
WO    WO2008/140115 A1  11/2008

OTHER PUBLICATIONS

Notification of Refusal dated Jul. 5, 2016 from corresponding Japanese Application; Patent Application No. 2014-502146; English translation of Notification of Refusal; Total of 10 pages.
M.A. Baldo, et al; Highly efficient phosphorescent emission from organic electroluminescent devices; Nature; vol. 395; 1998; pp. 151-154.
M.A. Baldo, et al; High-efficiency fluorescent organic light-emitting devices using a phosphorescent sensitizer; Nature; vol. 403; 2000; pp. 750-753.
S. Lamansky, et al; Highly phosphorescent bis-cyclometaiated iridium complexes: synthesis, . . . ; J. Am. Chem. Soc.; vol. 123; 2001; p. 4304-4312.
International Preliminary Report on Patentability dated Sep. 2, 2014 together with English translation for PCT/JP2013/053990.

*Primary Examiner* — Samantha Shterengarts
(74) *Attorney, Agent, or Firm* — Lucas & Mercanti, LLP

(57) ABSTRACT

The organic electroluminescent element prevents degradation of phosphorescent luminescent organic metal complexes in a light emitting layer, has a long life, and has superior color stability during continuously drive. The organic electroluminescent element has a blue light emitting layer with a phosphorescent light emitting organometallic complex (A) with a local maximum phosphorescent light emission wavelength on the short wave side of 480 nm or less, a phosphorescent light emitting organometallic complex (B), and a host compound. The content of complex (A) is greater than the content of the complex (B). The complex (A) and the host are such that a single layer made from complex (A) and the host compound, the value for the ratio ((D)/(C)) of the percent of remaining luminescence (C) which UV irradiation with a wavelength of 365 nm and the percent of remaining luminescence (D) with UV irradiation by a HgXe light source is 0.75-0.95.

10 Claims, 4 Drawing Sheets

ORGANIC ELECTROLUMINESCENT ELEMENT

CROSS REFERENCE TO RELATED APPLICATION

This application is a 371 of PCT/JP2013/053990 filed on Feb. 19, 2013 which, in turn, claimed the priority of Japanese Patent Application No. JP2012-042708 filed on Feb. 29, 2012 both applications are incorporated herein by reference.

TECHNICAL FIELD

The present invention relates to an organic electroluminescent element.

BACKGROUND ART

A typical organic electroluminescent element (hereinafter, also referred to as organic EL element) includes a light-emitting layer containing a light-emitting compound disposed between a cathode and an anode. The organic EL element generates excitons in the light-emitting layer by recombination of holes injected from the anode and electrons injected from the cathode in an applied electric field and emits light (e.g., fluorescent or phosphorescent light) due to deactivation of the excitons. The organic EL element, which is an entire solid-state element composed of electrodes and organic thin films having a total thickness of about submicrons between the electrodes and can emit light at a voltage of about several volts to several tens of volts, is anticipated in application to next-generation flat displays or lighting devices.

Among development of organic EL elements for practical application, Princeton University has reported on an organic EL element by phosphorescence from an excited triplet state in Non-Patent Literature 1. Materials showing phosphorescence at room temperature have been extensively studied (see, for example, Patent Literature 1 and Non-Patent Literature 2.) since then.

The viable emission efficiency in organic EL elements by phosphorescence recently discovered is about four times larger in principle than those of known organic EL elements by fluorescence. Researches and developments of layer configurations and electrodes of light-emitting elements, as well as the developments of materials for the elements, have been actively carried out all over the world. For example, many compounds, mainly, heavy metal complexes such as iridium complexes, have been developed and investigated (see, for example, Non-Patent Literature 3).

Although phosphorescent systems have very high potentials, the excitons in organic EL devices by phosphorescence remain on metal complexes for a long time, which readily deteriorates the materials constituting the devices, compared to organic EL devices by fluorescence. This is believed to be one of the factors causing deterioration of organic EL elements used over a long period of time.

CITATION LIST

Patent Literature

Patent Literature 1: U.S. Pat. No. 6,097,147, Specification
Non-Patent Literature
Non-Patent Literature 1: M. A. Baldo, et al., Nature, Vol. 395, pp. 151-154, (1998)

Non-Patent Literature 2: M. A. Baldo, et al., Nature, Vol. 403, No. 17, pp. 750-753, (2000)
Non-Patent Literature 3: S. Lamansky, et al., J. Am. Chem. Soc., Vol. 123, p. 4304, (2001)

SUMMARY OF INVENTION

Problem to be Solved by the Invention

An object of the present invention, which has been made in view of the above problems, is to provide an organic electroluminescent element having a long lifetime and highly stable chromaticity during continuous driving by solving the above-mentioned problem associated with deterioration of the phosphorescent organic metal complex in the light-emitting layer.

Means for Solving the Problem

The present inventors, who have diligently studied in view of the above-mentioned problems, have found that an organic electroluminescent element has a long lifetime and highly stable chromaticity during continuous driving without deterioration of a phosphorescent organic metal complex in a light-emitting layer and have accomplished the invention wherein the light-emitting layer at least includes a blue light-emitting sublayer containing a phosphorescent organic metal complex (A), a phosphorescent organic metal complex (B), and a host compound; the phosphorescent organic metal complex (A) has a ratio ((D)/(C)) of the brightness persistence (D) in a UV irradiation test using a Hg—Xe light source to the brightness persistence (C) in a UV irradiation test using a light source of a 365-nm wavelength within a specific range and shows a phosphorescent spectrum having a maximum phosphorescent wavelength of 480 nm or less on the shortest wavelength side; and the blue light-emitting sublayer contains the phosphorescent organic metal complex (A) in an amount larger than that of the phosphorescent organic metal complex (B).

That is, the object of the present invention can be achieved by the following aspects:

1. An organic electroluminescent element comprising an anode, a cathode, and a light-emitting layer disposed between the anode and the cathode, on a substrate, wherein
the light-emitting layer at least includes a blue light-emitting sublayer;
the blue light-emitting sublayer satisfies Requirement 1 and contains a phosphorescent organic metal complex (A) showing a phosphorescent spectrum having a maximum phosphorescent wavelength of 480 nm or less on the shortest wavelength side, a phosphorescent organic metal complex (B), and a host compound; and
the blue light-emitting sublayer contains the phosphorescent organic metal complex (A) in an amount larger than that of the phosphorescent organic metal complex (B):
Requirement 1: a blue light-emitting monolayer film composed of the phosphorescent organic metal complex (A) and the host compound formed on a quartz substrate has a ratio ((D)/(C)) within a range of 0.75 to 0.95 of the brightness persistence (D) in a UV irradiation test using a Hg—Xe light source to the brightness persistence (C) in a LUV irradiation test using a light source of a 365-nm wavelength, under the same absorbed UV photon energy.

2. The organic electroluminescent element according to aspect 1, wherein the lowest excited triplet energy level of the phosphorescent organic metal complex (B) is lower than the lowest excited triplet energy level of the host compound and is higher than the lowest excited triplet energy level of the phosphorescent organic metal complex (A).

3. The organic electroluminescent element according to aspect 1 or 2, wherein the phosphorescent organic metal complex (A) shows a phosphorescent spectrum having a maximum phosphorescent wavelength of 475 nm or less on the shortest wavelength side.

4. The organic electroluminescent element according to any one of aspects 1 to 3, wherein the phosphorescent organic metal complex (A) shows a phosphorescent spectrum having a maximum phosphorescent wavelength of 460 nm or less on the shortest wavelength side.

5. The organic electroluminescent element according to any one of aspects 1 to 4, wherein the phosphorescent organic metal complex (A) is a compound represented by Formula (1):

[Chem. 1]

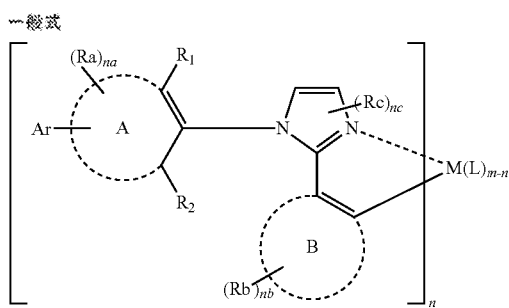

(1)

wherein, rings A and B each independently represent a 5- or 6-membered aromatic hydrocarbon or aromatic heterocyclic ring; Ar represents an aromatic hydrocarbon, aromatic heterocyclic, non-aromatic hydrocarbon, or non-aromatic heterocyclic ring; $R_1$, $R_2$, Ra, Rb, and Rc each independently represent a hydrogen atom, a halogen atom, a cyano group, or an optionally substituted alkyl, alkenyl, alkynyl, alkoxy, amino, silyl, arylalkyl, aryl, heteroaryl, non-aromatic hydrocarbon ring, or non-aromatic heterocyclic group; na and nc each independently represent 1 or 2; nb represents an integer of 1 to 4; L represents one or more monoanionic bidentate ligands coordinated to M; M represents a transition metal atom having an atomic number of 40 or more and belonging to any one of Groups 8 to 10 in the periodic table; m-n represents an integer of 0 to 2; n represents an integer of 1 to 3; and m represents 2 or 3.

6. The organic electroluminescent element according to aspect 5, wherein M in Formula (1) represents iridium.

7. The organic electroluminescent element according to aspect 5 or 6, wherein ring B in Formula (1) represents a benzene ring.

8. The organic electroluminescent element according to any one of aspects 1 to 7, wherein the phosphorescent organic metal complex (B) is a compound represented by Formula (2):

[Chem. 2]

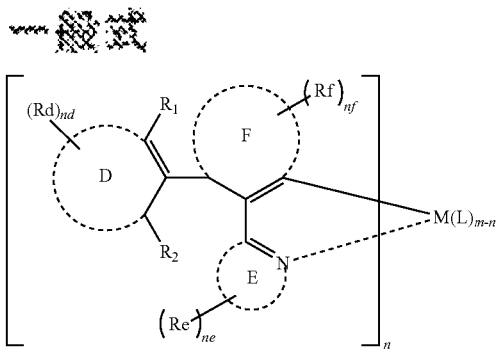

(2)

wherein, rings D, E, and F each independently represent a 5- or 6-membered aromatic hydrocarbon or aromatic heterocyclic ring or a condensed ring of a 5- or 6-membered aromatic hydrocarbon or aromatic heterocyclic ring; $R_1$, $R_2$, Rd, Re, and Rf each independently represents a hydrogen atom, a halogen atom, a cyano group, or an optionally substituted alkyl, alkenyl, alkynyl, alkoxy, amino, silyl, arylalkyl, aryl, heteroaryl, non-aromatic hydrocarbon ring, or non-aromatic heterocyclic group; nd and of each independently represent an integer of 1 to 3; ne represents an integer of 1 to 4; $R_2$ optionally bonds to an atom constituting ring E to form a condensed ring of the 5- or 6-membered aromatic hydrocarbon or aromatic heterocyclic ring; L represents one or more monoanionic bidentate ligands coordinated to M; M represents a transition metal atom having an atomic number of 40 or more and belonging to any one of Groups 8 to 10 in the periodic table; m-n represents an integer of 0 to 2; n represents an integer of 1 to 3; and m represents 2 or 3.

9. The organic electroluminescent element according to any one of aspects 1 to 8, wherein the host compound has a partial structure represented by Formula (3):

[Chem. 3]

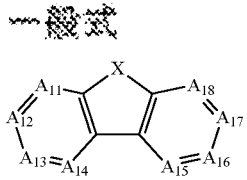

(3)

wherein, X represents an oxygen atom, a sulfur atom, or an $NR_1$ group; and $A_{11}$ to $A_{18}$ each independently represent a nitrogen atom or $CR_2$, wherein $R_1$ and $R_2$ each independently represent a bonding hand, a hydrogen atom, or a substituent; and if there are a plurality of $CR_2$'s, they may be the same or different.

10. The organic electroluminescent element according to aspect 9, wherein X in Formula (3) represents an oxygen atom.

The reason for the solution by the constitution in accordance with the present invention to the above-mentioned problems is surmised as follows:

The use of a phosphorescent organic metal complex emitting blue light, in particular, a phosphorescent organic metal complex emitting light of a wavelength shorter than 480 nm as a dopant, needs a high triplet level of a host compound. It is assumed that in such a case, the reactivity of the host compound is increased, and a system accelerating the deterioration rate is present if the excited state of the host compound exists.

In the system of the constitution in accordance with the present invention, it is assumed that the addition of a different dopant having a higher triple level than the phosphorescent organic metal complex (A) shortens the retention time of the excited state of the host compound and reduces the reactivity of the host compound, resulting in enhancements in light resistance and lifetime.

Advantageous Effects of Invention

The above-described aspects of the present invention can provide an organic electroluminescent element that includes a light-emitting layer containing a phosphorescent organic metal complex not undergoing deterioration and that has a long lifetime and highly stable chromaticity during continuous driving.

MODE FOR CARRYING OUT THE INVENTION

Figure 1:
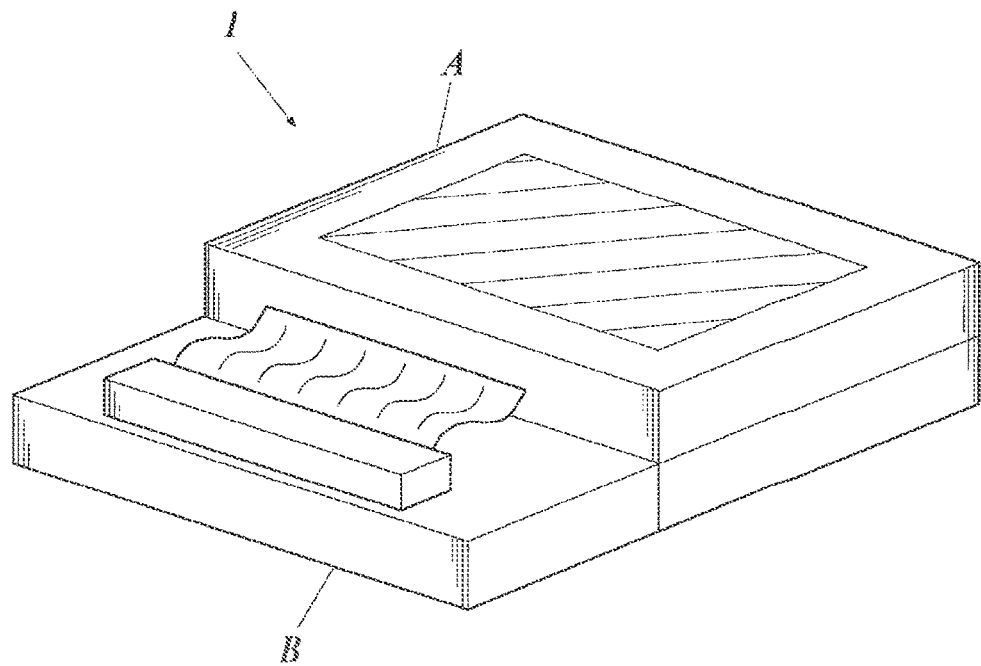
FIG. 1 is a schematic diagram illustrating an example display device composed of organic EL elements.

The organic electroluminescent element of the present invention comprises an anode, a cathode, and a light-emitting layer disposed between the anode and the cathode, on a substrate. The light-emitting layer at least includes a blue light-emitting sublayer. The blue light-emitting sublayer satisfies Requirement 1 defined below and contains a phosphorescent organic metal complex (A) showing a phosphorescent spectrum having a maximum phosphorescent wavelength of 480 nm or less on the shortest wavelength side, a phosphorescent organic metal complex (B), and a host compound. The blue light-emitting sublayer contains the phosphorescent organic metal complex (A) in an amount larger than that of the phosphorescent organic metal complex (B). As a result, the phosphorescent organic metal complex in the light-emitting layer does not deteriorate, and the organic electroluminescent element has a long lifetime and highly stable chromaticity during continuous driving.

Requirement 1: a blue light-emitting monolayer film composed of the phosphorescent organic metal complex (A) and a host compound formed on a quartz substrate has a ratio ((D)/(C)) within a range of 0.75 to 0.95 of the brightness persistence (D) in a UV irradiation test using a Hg—Xe light source to the brightness persistence (C) in a UV irradiation test using a light source of a 365-nm wavelength, under the same absorbed UV photon energy.

This is a technical feature common to the inventions according to claims 1 to 10.

In a preferred embodiment of the present invention, from the viewpoint of capable of more fully developing the advantageous effects of the present invention, the lowest excited triplet energy level of the phosphorescent organic metal complex (B) is lower than the lowest excited triplet energy level of the host compound and is higher than the lowest excited triplet energy level of the phosphorescent organic metal complex (A). In addition, it is preferred that the phosphorescent organic metal complex (A) shows a phosphorescent spectrum having a maximum phosphorescent wavelength of 475 nm or less on the shortest wavelength side. The maximum phosphorescent wavelength on the shortest wavelength side is more preferably 460 nm or less. Furthermore, the phosphorescent organic metal complex (A) is preferably a compound represented by Formula (1); M in Formula (1) preferably iridium; and ring B in Formula (1) is preferably a benzene ring. The phosphorescent organic metal complex (B) is preferably a compound represented by Formula (2). The host compound is preferably a compound having a partial structure represented by Formula (3).

The present invention, its components, and embodiments of the present invention will now be described in detail. Throughout the description below, a numerical range defined with "to" is meant to include the numbers preceding and following the "to" as the lower limit and the upper limit, respectively.

<<Organic EL Element>>

The organic EL element of the present invention is characterized in that the light-emitting layer at least includes a blue light-emitting sublayer satisfying Requirement 1 described below and containing a phosphorescent organic metal complex (A) showing a phosphorescent spectrum having a maximum phosphorescent wavelength of 480 nm or less on the shortest wavelength side.

Requirement 1 herein states that a blue light-emitting monolayer film composed of only the phosphorescent organic metal complex (A) and a host compound formed on a quartz substrate has a ratio ((D)/(C)) within a range of 0.75 to 0.95 of the brightness persistence (D) in a UV irradiation test using a Hg—Xe light source to the brightness persistence (C) in a UV irradiation test using a light source of a 365-nm wavelength, under the same absorbed UV photon energy.

In order to achieve light emission from the phosphorescent organic metal complex (A) according to the present invention showing a phosphorescent spectrum having a maximum phosphorescent wavelength of 480 nm or less on the shortest wavelength side (hereinafter, the maximum phosphorescent wavelength on the shortest wavelength side is abbreviated to shortest wavelength side maximum phosphorescent wavelength), an improvement in high lowest excited triplet energy level ($T_1$) of the host compound is essential. It is assumed that in such a case, the excitons of the host compound have higher reactivity with the phosphorescent organic metal complex capable of generating excitons having a longer lifetime than fluorescent light-emitting materials. In the present invention, the blue light-emitting sublayer contains different phosphorescent organic metal complexes to shorten the retention time of the excited state of the host compound, resulting in improved performance.

The absorbed UV photon energy E in the present invention is a value calculated by the following Expression (1):

式 (1)

$$E = \int [Abs(\lambda) \times Em(\lambda) \times hc/\lambda] d\lambda \qquad \text{[Expression 1]}$$

In Expression (1), λ represents the wavelength (nm), Em(λ) represents the emission intensity of the light source at the wavelength λ, Abs(λ) represents the absorbance of a sample at the wavelength λ, h represents the Planck constant, and c represents the speed of light.

The brightness persistence (C) in a UV irradiation test using a light source of a 365-nm wavelength and the brightness persistence (D) in a UV irradiation test using a Hg—Xe light source according to Requirement 1 defined in the present invention can be determined in accordance with the following procedure.

A blue light-emitting monolayer composed of only a phosphorescent organic metal complex (A) and a host compound is formed on a quartz substrate, and the resulting film is subjected to an ultraviolet light resistance test.

In the ultraviolet light resistance test, the brightness persistence (C) in a UV irradiation test using a light source of a 365-nm wavelength and the brightness persistence (D) in a UV irradiation test using a Hg—Xe light source are each measured from the change in brightness before and after the irradiation with ultraviolet light under the following conditions.

The UV irradiation test using a light source of a 365-nm wavelength is performed with a mercury-xenon lamp UV irradiation device LC2 manufactured by Hamamatsu Photonics K.K. The UV irradiation test using a Hg—Xe light source is performed with a mercury-xenon lamp UV irradiation device LC8 manufactured by Hamamatsu Photonics K.K.

An irradiation fiber and samples (blue light-emitting monolayers) are disposed such that the light exiting surface of the fiber and the glass cover surface of each sample are parallel to each other with a distance of 1 cm therebetween without a UV-cut filter. Each sample is irradiated for 20 minutes. The illuminance of the light at the irradiated surface is measured with a UV power meter C6080-365 manufactured by Hamamatsu Photonics K.K.

The illuminometer used for measuring the illuminance of the light-receiving surface of a sample is calibrated with a standard light source certificated for illuminance based on the national standard or international standard by JIS Z 8103 "an established process leading to the national standard or international standard through sequential calibration of a measuring standard or measuring equipment with a higher measurement standard" or is indirectly calibrated with a reference light source or illuminometer of which value is transferred from the standard light source. Visually distinct deterioration is relatively evaluated by visual investigation, and very similar results of the evaluation can be distinguished from each other by complementarily digitizing a slight or no change by, for example, measuring the transmittance or yellow index (YI) value with a transmissometer or microspectrophotometer, measuring the turbidity with a haze meter, or digitizing the chromaticity in a color difference system. In these measuring methods, if the sample area irradiated with ultraviolet light is small, such as spot irradiation, an apparatus capable of measuring a small area corresponding to the irradiation area is selected.

The brightness persistences (C) and (D) according to the present invention are determined by continuously irradiating a sample with light from a light source of a 365-nm wavelength or a Hg—Xe light source for 20 minutes and dividing the brightness after the irradiation for 20 minutes by the initial brightness. The brightness is measured at an angle of 45 degrees from the axis of the irradiation fiber with a spectral emission brightness meter CS-1000 (manufactured by Konica Minolta, Inc.). A value closer to 1.00 means less variation.

The present invention is characterized in that the phosphorescent organic metal complex (A) having a shortest wavelength side maximum phosphorescent wavelength of 480 nm or less has a ratio ((D)/(C)) within a range of 0.75 to 0.95 of the brightness persistence (D) in a UV irradiation test using a Hg—Xe light source, measured with a mercury-xenon lamp UV irradiation device LC8 manufactured by Hamamatsu Photonics K.K. according to the method described above, to the brightness persistence (C) in a UV irradiation test using a light source of a 365-nm wavelength, measured with a mercury-xenon lamp UV irradiation device LC2 manufactured by Hamamatsu Photonics K.K. according to the method described above, under the same absorbed UV photon energy.

The shortest wavelength side maximum phosphorescent wavelength of the phosphorescent organic metal complex (A) in the present invention is measured in accordance with the following method.

A sample solution is prepared by dissolving the phosphorescent organic metal complex (A) in toluene into a concentration of 1.0% by mass.

The prepared solution of the phosphorescent organic metal complex (A) in toluene is then placed into the measuring unit of a spectrophotofluorometer (F-2500) manufactured by Hitachi High-Technologies Corporation, which is used as a fluorophotometer, and the spectrum from the ultraviolet to the visible region is measured to determine the maximum phosphorescent wavelength (nm) on the shortest wavelength side.

<<Constitutive Layers of Organic EL Element>>

The constitutive layers of the organic EL element of the present invention will now be described. Non-limiting examples of the preferred layer configuration of the organic EL element in the present invention are shown below:

(i) anode/light-emitting layer/electron-transporting layer/cathode;

(ii) anode/hole-transporting layer/light-emitting layer/electron-transporting layer/cathode;

(iii) anode/hole-transporting layer/light-emitting layer/hole-blocking layer/electron-transporting layer/cathode;

(iv) anode/hole-transporting layer/light-emitting layer/hole-blocking layer/electron-transporting layer/cathode buffer layer/cathode;

(v) anode/anode buffer layer/hole-transporting layer/light-emitting layer/hole-blocking layer/electron-transporting layer/cathode buffer layer/cathode;

(vi) anode/hole-transporting layer/anode buffer layer/light-emitting layer/hole-blocking layer/electron-transporting layer/cathode buffer layer/cathode; and (vii) anode/anode buffer layer/hole-transporting layer/light-emitting layer/electron-transporting layer/cathode buffer layer/cathode.

In the case of an organic EL element including a plurality of light-emitting layers, a nonluminescent intermediate layer may be disposed between any two adjoining light-emitting layers. Among the layer configurations mentioned above, the organic layers including the light-emitting layer (other than the anode and cathode) are collectively defined as a light-emitting unit; and a plurality of light-emitting units may be stacked. The stacked light-emitting units may include a nonluminescent intermediate layer between any two adjoining light-emitting units. The intermediate layer may further include a charge-generating layer.

<<Light-Emitting Layer>>

The light-emitting layer according to the present invention emits light by recombination of electrons and holes injected from electrodes or an electron-transporting layer and a hole-transporting layer. The light emission site may be inside the light-emitting layer or may be the interface between the light-emitting layer and an adjoining layer thereof.

The light-emitting layer may have any total thickness, which is preferably controlled within a range of 2 nm to 5 μm, more preferably 2 to 200 nm, most preferably 5 to 100 nm, from the viewpoints of homogeneity of the film, prevention of application of unnecessarily high voltage during luminescence, and an improvement in stability of emission color regardless of a variable driving current.

The light-emitting layer can be produced by forming a film from a luminescent dopant or a host compound described below by, for example, vacuum deposition or a wet method (also referred to as wet process) such as spin coating, casting, die coating, blade coating, roll coating, ink jetting, printing, spray coating, curtain coating, or Langmuir Blodgett method (LB deposition).

[1: Phosphorescent Organic Metal Complex]

The organic EL element of the present invention is characterized in that the blue light-emitting sublayer contains a phosphorescent organic metal complex (A) that satisfies Requirement 1 and emits light having a peak wavelength of 480 nm or less on the shortest wavelength side and also contains a phosphorescent organic metal complex (B) different from the phosphorescent organic metal complex (A) and a host compound.

The phosphorescent organic metal complex (hereinafter, also referred to as light-emitting dopant, phosphorescent light-emitting dopant compound, phosphorescent material, phosphorescent compound, or phosphorescent light-emitting compound) according to the present invention will be described.

(1.1: Phosphorescent Organic Metal Complex (A))

The phosphorescent organic metal complex according to the present invention is a compound that emits light from the excited triplet, specifically, a compound that emits phosphorescence at room temperature (25° C.) and is defined as a compound having a phosphorescence quantum yield of 0.01 or more at 25° C. The phosphorescence quantum yield is preferably 0.1 or more.

The phosphorescence quantum yield can be measured by the method described in page 398 of Bunkoh II of Dai 4 Han Jikken Kagaku Koza 7 (Spectroscopy II of The 4th Series of Experimental Chemistry 7) (1992, published by Maruzen Co., Ltd.). The phosphorescence quantum yield in a solution can be measured using appropriate solvents. The only requirement for the phosphorescent organic metal complex according to the present invention is to achieve the above-mentioned phosphorescence quantum yield (0.01 or more) in any appropriate solvent.

There are two emission principles by a phosphorescent organic metal complex. One is an energy transfer-type, wherein the recombination of carriers occurs on a host compound onto which the carriers are transferred to produce an excited state of the luminescent host compound, and then emission occurs from a phosphorescent organic metal complex via transfer of this energy to the phosphorescent organic metal complex. The other is a carrier trap-type, wherein a phosphorescent organic metal complex serves as a carrier trap to cause recombination of carriers on the phosphorescent organic metal complex, and thereby emission from the phosphorescent organic metal complex compound occurs. In each type, it is essential that the energy in the excited state of the phosphorescent organic metal complex be lower than that in the excited state of the host compound.

The phosphorescent organic metal complex (A) according to the present invention has a shortest wavelength side maximum phosphorescent wavelength of 480 nm or less and has a ratio ((D)/(C)) within a range of 0.75 to 0.95 of the brightness persistence (D) in a UV irradiation test using a Hg—Xe light source to the brightness persistence (C) in a UV irradiation test using a light source of a 365-nm wavelength, under the same absorbed UV photon energy, measured by the method described above when it is formed together with a host compound into a blue light-emitting monolayer on a quartz substrate.

The phosphorescent organic metal complex (A) according to the present invention preferably has a shortest wavelength side maximum phosphorescent wavelength of 475 nm or less and more preferably 460 nm or less.

The phosphorescent organic metal complex (A) according to the present invention is preferably represented by Formula (1):

[Chem. 4]

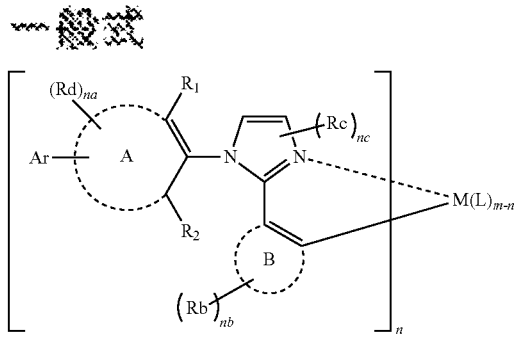

(1)

In Formula (1), rings A and B each independently represent a 5- or 6-membered aromatic hydrocarbon or aromatic heterocyclic ring.

In Formula (1), the 5- or 6-membered aromatic hydrocarbon ring represented by ring A or B is, for example, a benzene ring.

In Formula (1), examples of the 5- or 6-membered aromatic heterocyclic ring represented by ring A or B include furan, thiophene, oxazole, pyrrole, pyridine, pyridazine, pyrimidine, pyrazine, triazine, oxadiazole, triazole, imidazole, pyrazole, and thiazole rings.

Preferably, ring B is a benzene ring. More preferably, ring A is a benzene ring.

In Formula (1), Ar represents an aromatic hydrocarbon, aromatic heterocyclic, non-aromatic hydrocarbon, or non-aromatic heterocyclic ring.

In Formula (1), examples of the aromatic hydrocarbon ring represented by Ar include benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthranthrene rings.

In Formula (1), examples of the aromatic heterocyclic ring represented by Ar include silole, furan, thiophene, oxazole, pyrrole, pyridine, pyridazine, pyrimidine, pyrazine, triazine, oxadiazole, triazole, imidazole, pyrazole, thiazole, indole, benzimidazole, benzothiazole, benzoxazole, quinoxaline, quinazoline, phthalazine, thienothiophene, and carbazole rings, and azacarbazole rings (referring to rings each having one or more nitrogen atoms substituted for carbon atom(s) on a carbazole ring), and dibenzosilole, dibenzofuran, dibenzothiophene, and benzothiophene rings, and rings each having one or more nitrogen atoms substituted for carbon atom(s) on a dibenzofuran ring, and benzodifuran, benzodithiophene, acridine, benzoquinoline, phenazine, phenanthridine, phenanthroline, cyclazine, quindoline, thebenidine, quinindoline, triphenodithiazine, triphenodioxazine, phenanthrazine, anthrazine, perimidine, naphthofuran, naphthothiophene, naphthodifuran, naphthodithiophene, anthrafuran, anthradifuran, anthrathiophene, anthradithiophene, thianthrene, phenoxathiin, dibenzocarbazole, indolocarbazole, and dithienobenzene rings.

In Formula (1), examples of the non-aromatic hydrocarbon ring represented by Ar include cycloalkane groups (e.g., cyclopentane and cyclohexane rings), cycloalkoxy groups (e.g., cyclopentyloxy and cyclohexyloxy groups), cycloalkylthio groups (e.g., cyclopentylthio and cyclohexylthio groups), a cyclohexylaminosulfonyl group, and tetrahydronaphthalene, 9,10-dihydroanthracene, and biphenylene rings.

In Formula (1), examples of the non-aromatic heterocyclic ring represented by Ar include epoxy, aziridine, thiirane, oxetane, azetidine, thietane, tetrahydrofuran, dioxolane, pyrrolidine, pyrazolidine, imidazolidine, oxazolidine, tetrahydrothiophene, sulfolane, thiazolidine, ε-caprolactone, ε-caprolactam, piperidine, hexahydropyridazine, hexahydropyrimidine, piperazine, morpholine, tetrahydropyran, 1,3-dioxane, 1,4-dioxane, trioxane, tetrahydrothiopyran, thiomorpholine, thiomorpholine-1,1-dioxide, pyranose, diazabicyclo[2,2,2]-octane, phenoxazine, phenothiazine, oxanthrene, thioxanthene, and phenoxathiin rings.

These rings represented by Ar in Formula (1) may further include the following substituents (hereinafter, each referred to as substituent Rx), and such substituents may be bonded to each other to form a ring.

Examples of the substituent Rx include alkyl groups (e.g., methyl, ethyl, propyl, isopropyl, tert-butyl, pentyl, hexyl, octyl, dodecyl, tridecyl, tetradecyl, and pentadecyl groups), alkenyl groups (e.g., vinyl and aryl groups), alkynyl groups (e.g., ethynyl and propargyl groups), non-aromatic hydrocarbon ring groups (for example, cycloalkyl groups (e.g., cyclopentyl and cyclohexyl groups), cycloalkoxy groups (e.g., cyclopentyloxy and cyclohexyloxy groups), cycloalkylthio groups (e.g., cyclopentylthio and cyclohexylthio groups), and monovalent groups derived from, for example, tetrahydronaphthalene, 9,10-dihydroanthracene, and biphenylene rings), non-aromatic heterocyclic groups (e.g., monovalent groups derived from, for example, epoxy, aziridine, thiirane, oxetane, azetidine, thietane, tetrahydrofuran, dioxolane, pyrrolidine, pyrazolidine, imidazolidine, oxazolidine, tetrahydrothiophene, sulfolane, thiazolidine, εε-caprolactone, ε-caprolactam, piperidine, hexahydropyridazine, hexahydropyrimidine, piperazine, morpholine, tetrahydropyran, 1,3-dioxane, 1,4-dioxane, trioxane, tetrahydrothiopyran, thiomorpholine, thiomorpholine-1,1-dioxide, pyranose, diazabicyclo[2,2,2]-octane, phenoxazine, phenothiazine, oxanthrene, thioxanthene, and phenoxathiin rings), aromatic hydrocarbon groups (e.g., monovalent groups derived from, for example, benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthranthrene rings), aromatic heterocyclic groups (e.g., silole, furan, thiophene, oxazole, pyrrole, pyridine, pyridazine, pyrimidine, pyrazine, triazine, oxadiazole, triazole, imidazole, pyrazole, triazole, indole, benzimidazole, benzothiazole, benzoxazole, quinoxaline, quinazoline, phthalazine, thienothiophene, and carbazole rings, and azacarbazole rings (referring to rings each having one or more nitrogen atoms substituted for carbon atom(s) on a carbazole ring), and dibenzosilole, dibenzofuran, dibenzothiophene, and benzothiophene rings, and rings each having one or more nitrogen atoms substituted for carbon atom(s) on a dibenzofuran ring, and benzodifuran, benzodithiophene, acridine, benzoquinoline, phenazine, phenanthridine, phenanthroline, cyclazine, quindoline, thebenidine, quinindoline, triphenodithiazine, triphenodioxazine, phenanthrazine, anthrazine, perimidine, naphthofuran, naphthothiophene, naphthodifuran, naphthodithiophene, anthrafuran, anthradifuran, anthrathiophene, anthradithiophene, thianthrene, phenoxathiin, dibenzocarbazole, indolocarbazole, and dithienobenzene rings), alkoxy groups (e.g., methoxy, ethoxy, propyloxy, pentyloxy, hexyloxy, octyloxy, and dodecyloxy groups), aryloxy groups (e.g., phenoxy and naphthyloxy groups), alkylthio groups (e.g., methylthio, ethylthio, propylthio, pentylthio, hexylthio, octylthio, and dodecylthio groups), arylthio groups (e.g., phenylthio and naphthylthio groups), alkoxycarbonyl groups (e.g., methyloxycarbonyl, ethyloxycarbonyl, butyloxycarbonyl, octyloxycarbonyl, and dodecyloxycarbonyl groups), aryloxycarbonyl groups (e.g., phenyloxycarbonyl and naphthyloxycarbonyl groups), sulfamoyl groups (e.g., aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups), acyl groups (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups), acyloxy groups (e.g., acetyloxy, ethylcarbonyloxy, butylcarbonyloxy, octylcarbonyloxy, dodecylcarbonyloxy, and phenylcarbonyloxy groups), amido groups (e.g., methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups), carbamoyl groups (e.g., aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups), ureido groups (e.g., methylureido, ethylureido, pentylureido, cyclohexylureido, octylureido, dodecylureido, phenylureido, naphthylureido, and 2-pyridylaminoureido groups), sulfinyl groups (e.g., methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups), alkylsulfonyl groups (e.g., methylsulfonyl, ethylsulfonyl, butylsulfonyl, cyclohexylsulfonyl, 2-ethylhexylsulfonyl, and dodecylsulfonyl groups), arylsulfonyl or heteroarylsulfonyl groups (e.g., phenylsulfonyl, naphthylsulfonyl, and 2-pyridylsulfonyl groups), amino groups (e.g., amino, ethylamino, dimethylamino, butylamino, cyclopentylamino, 2-ethylhexylamino, dodecylamino, anilino, naphthylamino, and 2-pyridylamino groups), halogen atoms (e.g., fluorine, chlorine, and bromine atoms), fluorohydrocarbon groups (e.g., fluoromethyl, trifluoromethyl, pentafluoroethyl, and pentafluorophenyl groups), a cyano group, a nitro group, a hydroxy group, a mercapto group, silyl groups (e.g., trimethylsilyl, triisopropylsilyl, triphenylsilyl, and phenyldiethylsilyl groups), and a phosphono group.

The ring represented by Ar in Formula (1) is preferably an aromatic hydrocarbon ring or an aromatic heterocyclic ring, more preferably an aromatic hydrocarbon ring, and most preferably a benzene ring.

In Formula (1), $R_1$ and $R_2$ each independently represent a hydrogen atom, a halogen atom, a cyano, or an optionally substituted alkyl, alkenyl, alkynyl, alkoxy, amino, silyl, arylalkyl, aryl, heteroaryl, non-aromatic hydrocarbon ring, or non-aromatic heterocyclic group. At least one of the $R_1$ and $R_2$ is an alkyl or cycloalkyl group having two or more carbon atoms.

Examples of the aryl group and the heteroaryl group represented by $R_1$ or $R_2$ in Formula (1) include monovalent groups derived from aromatic hydrocarbon or aromatic heterocyclic rings represented by Ar in Formula (1).

Examples of the non-aromatic hydrocarbon ring group and the non-aromatic heterocyclic group represented by $R_1$ or $R_2$ in Formula (1) include monovalent groups derived from non-aromatic hydrocarbon or non-aromatic heterocyclic rings represented by Ar in Formula (1).

$R_1$ and $R_2$ are preferably both alkyl or cycloalkyl groups having two or more carbon atoms, and at least one of the $R_1$ and $R_2$ is more preferably a branched alkyl group having three or more carbon atoms. More preferably, $R_1$ and $R_2$ are both branched alkyl groups having three or more carbon atoms.

In Formula (1), Ra, Rb, and Rc each independently represent a hydrogen atom, a halogen atom, a cyano group, or an optionally substituted alkyl, alkenyl, alkynyl, alkoxy, amino, silyl, arylalkyl, aryl, heteroaryl, non-aromatic hydrocarbon ring, or non-aromatic heterocyclic group.

Examples of the aryl group and the heteroaryl group represented by Ra, Rb, or Rc in Formula (1) include monovalent groups derived from aromatic hydrocarbon or aromatic heterocyclic rings represented by Ar in Formula (1).

Examples of the non-aromatic hydrocarbon ring group and the non-aromatic heterocyclic group represented by Ra, Rb, or Rc in Example (1) include monovalent groups derived from non-aromatic hydrocarbon or non-aromatic heterocyclic rings represented by Ar in Formula (1).

In Formula (1), $n_a$ and $n_c$ each independently represent 1 or 2; and $n_b$ represents an integer of 1 to 4.

In Formula (1), L represents one or more monoanionic bidentate ligands coordinated to M; M represents a transition metal atom having an atomic number of 40 or more and belonging to any one of Groups 8 to 10 in the periodic table; m-n represents an integer of 0 to 2; n represents an integer of 1 to 3; and m represents 2 or 3. Preferably, n is 3 or 2, and m-n is 0.

In Formula (1), examples of the monoanionic bidentate ligand L coordinated to M include the following ligands:

[Chem. 5]

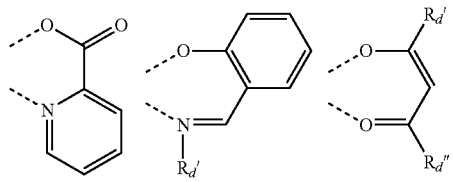

[Chem. 6]

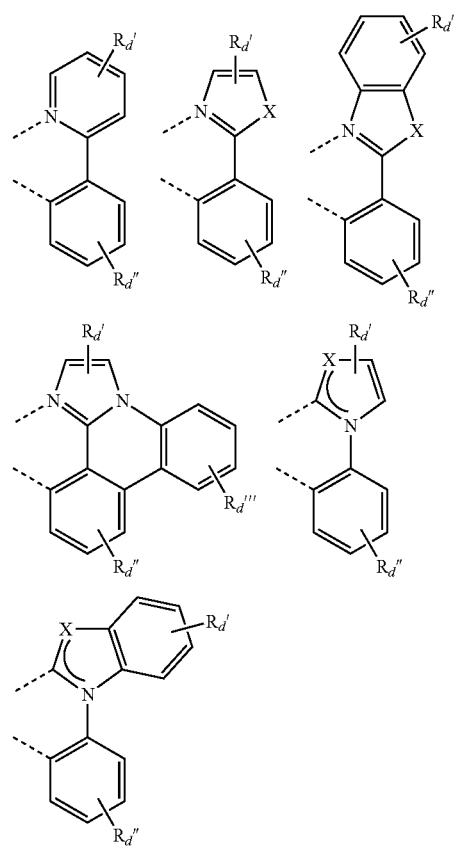

wherein Rd', Rd", and Rd'" each independently represent a hydrogen atom or a substituent. Examples of the substituent represented by Rd', Rd", or Rd'" include those exemplified as the substituent Rx represented by Ar in Formula (1).

In Formula (1), M is a transition metal atom having an atomic number of 40 or more and belonging to any one of Groups 8 to 10 in the periodic table and is preferably Os, Ir, or Pt and more preferably Ir.

The compounds represented by Formula (1) according to the present invention can be synthesized in accordance with a known method, as is described in International Patent Publication No. WO2006-121811.

Non-limiting examples of the phosphorescent organic metal complex (A) that can be preferably used in the present invention are shown below:

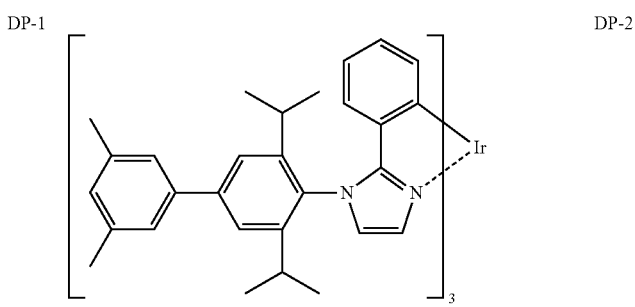

-continued
DP-3
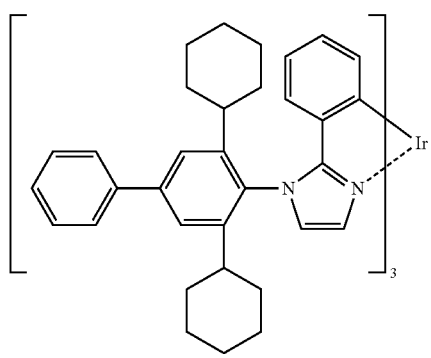
DP-4
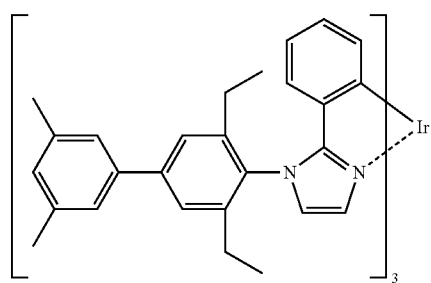
DP-5
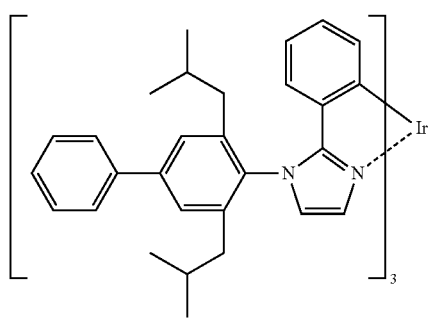
DP-6
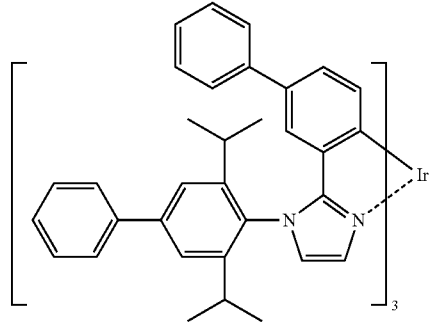
DP-7
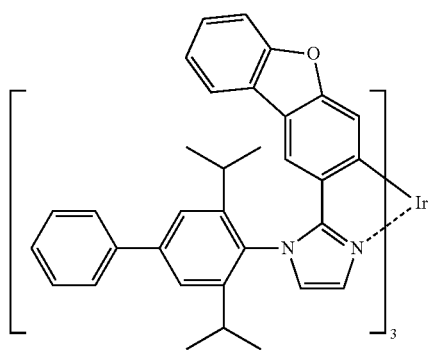
DP-8
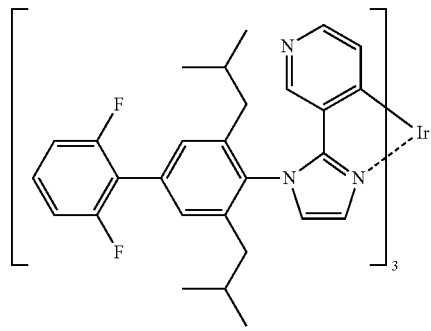
[Chem. 7]
DP-9
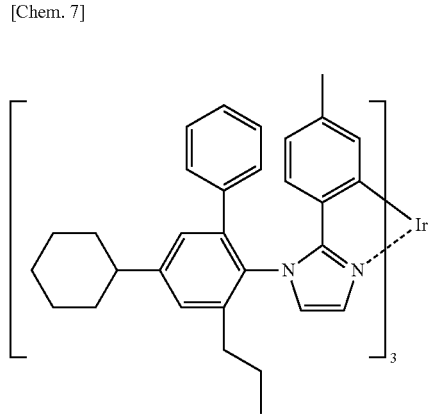
DP-10

-continued
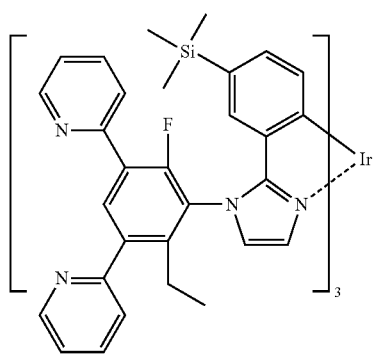
DP-11
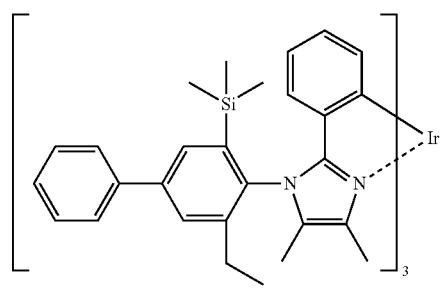
DP-12
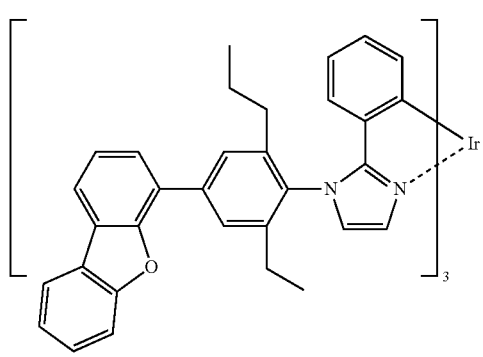
DP-13
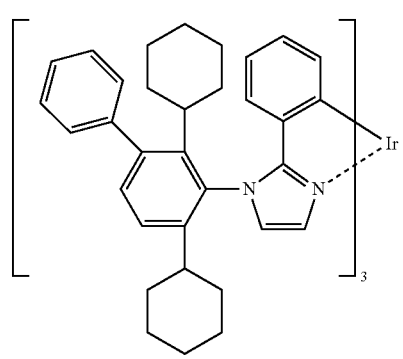
DP-14
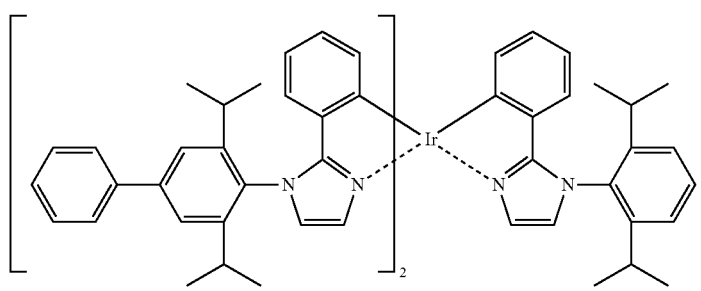
DP-15
[Chem. 8]
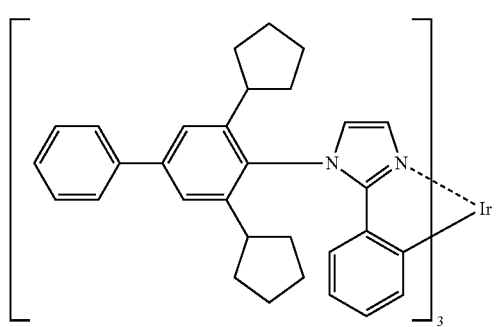
DP-16
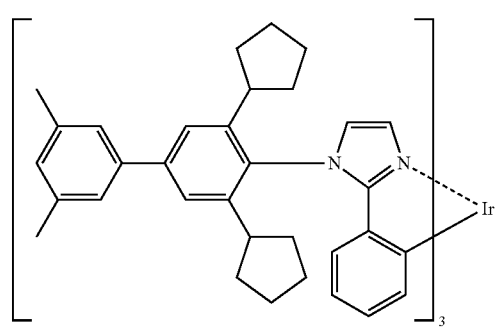
DP-17

-continued
DP-18
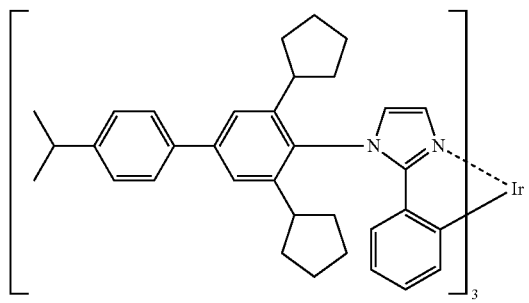
DP-19
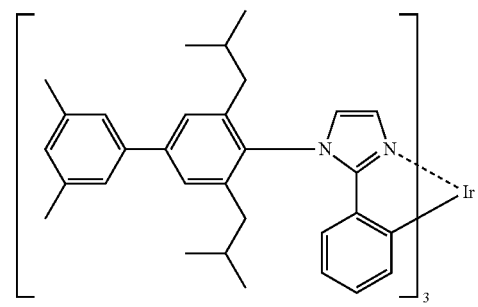
DP-20
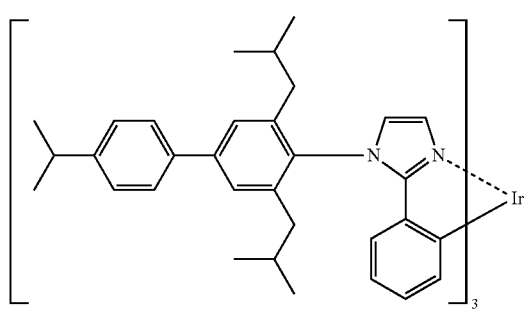
DP-21
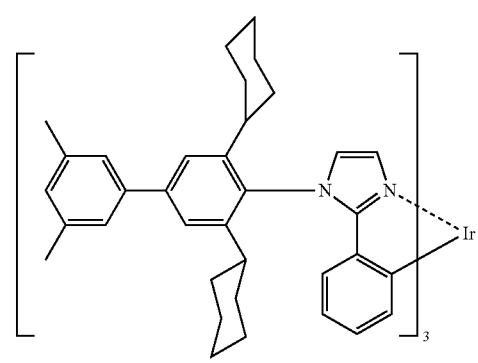
DP-22
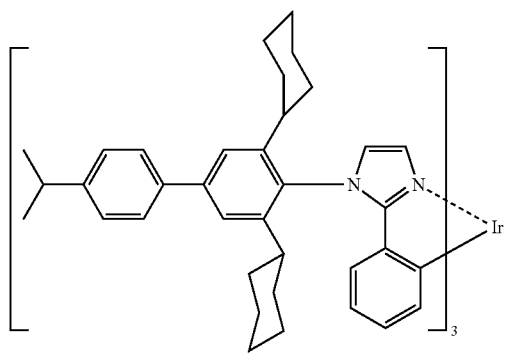
DP-23
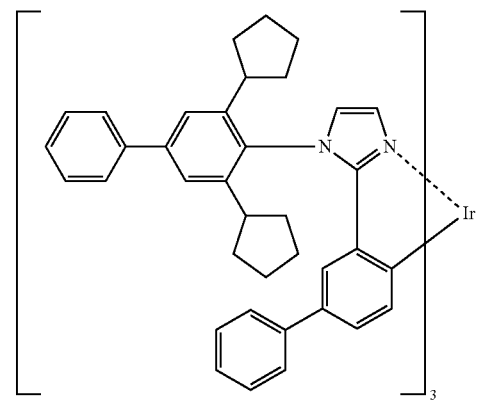
[Chem. 9]
DP-24
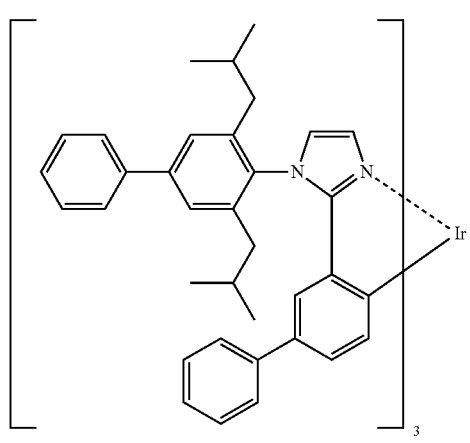
DP-25
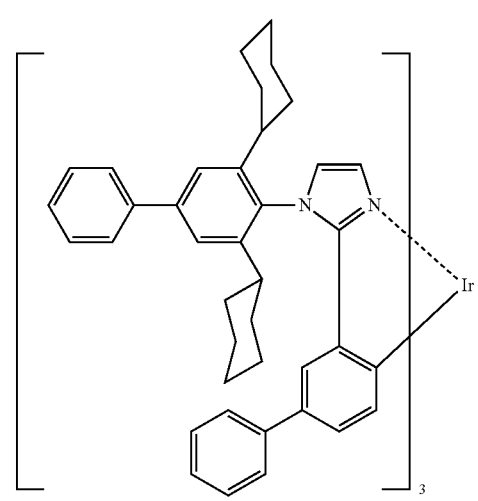

-continued
DP-26
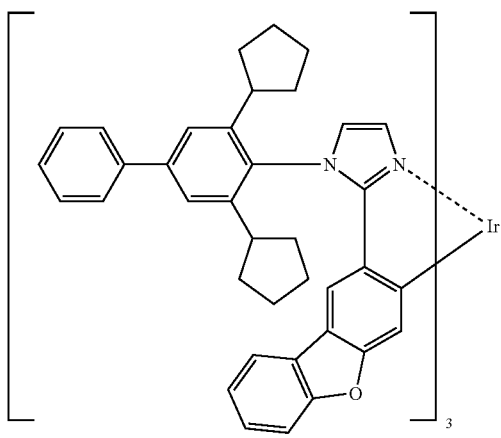
DP-27
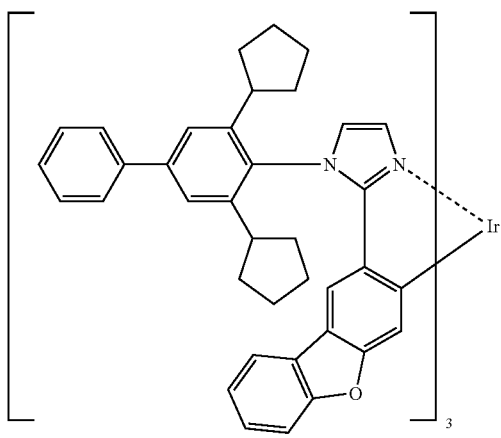
DP-28
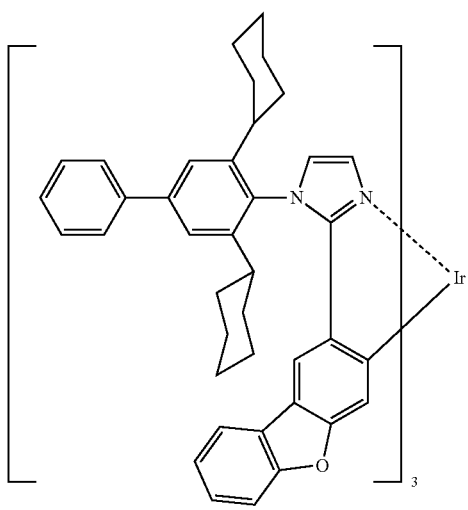
DP-29
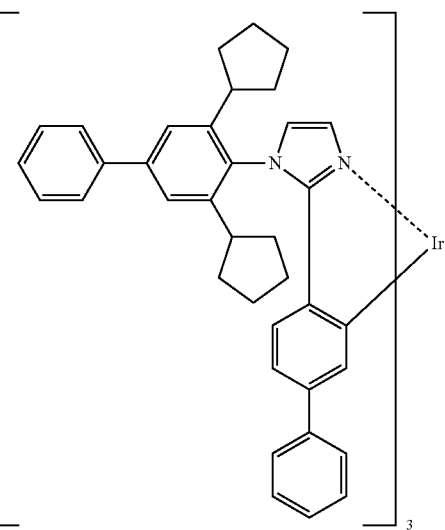
[Chem. 10]
DP-30
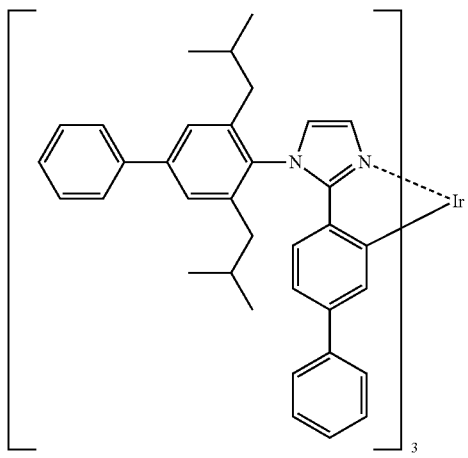
DP-31
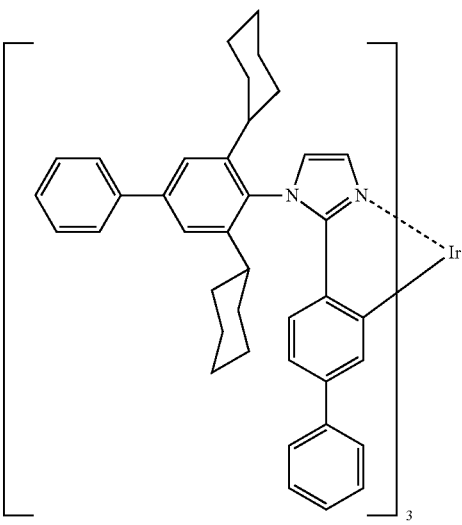

-continued
DP-32
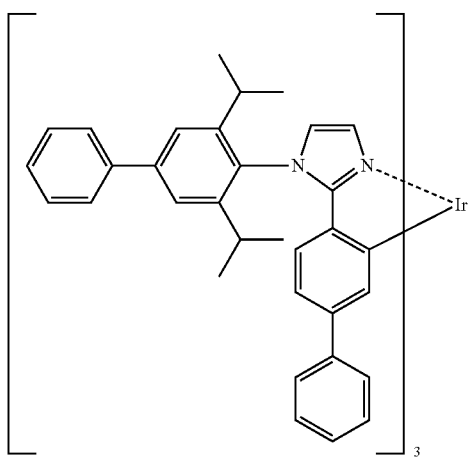
DP-33
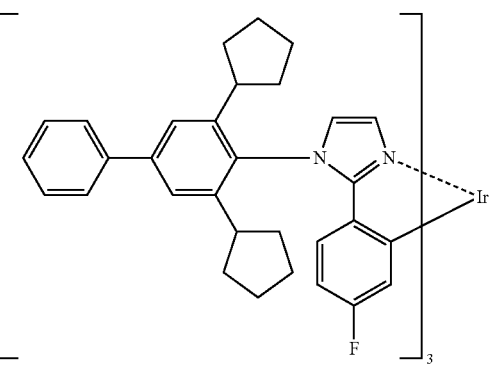
DP-34
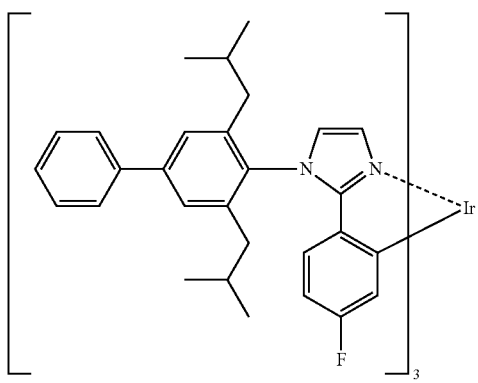
DP-35
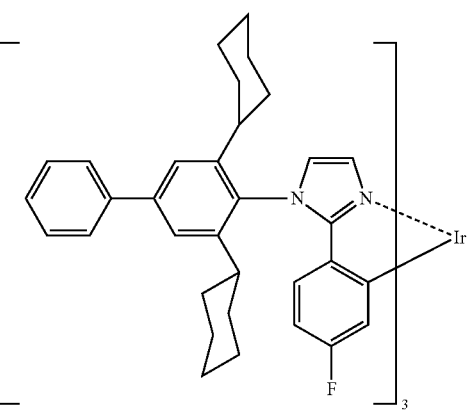
[Chem. 11]
DP-36
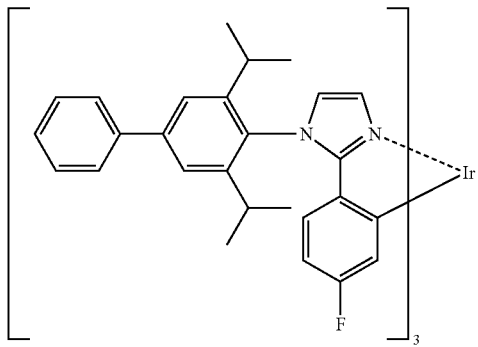
DP-37
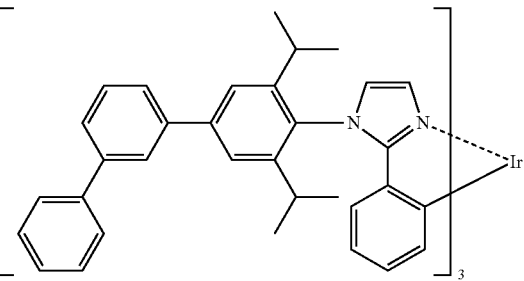
DP-38
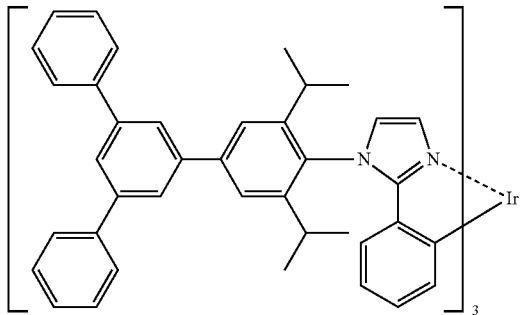
DP-39
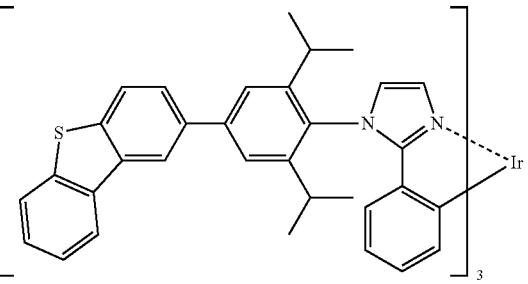

-continued
DP-40
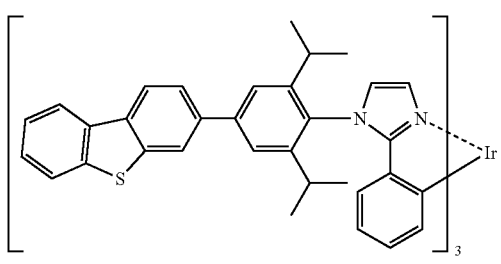
DP-41
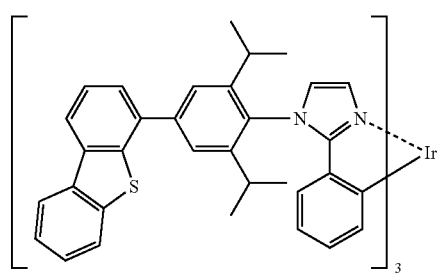
DP-42
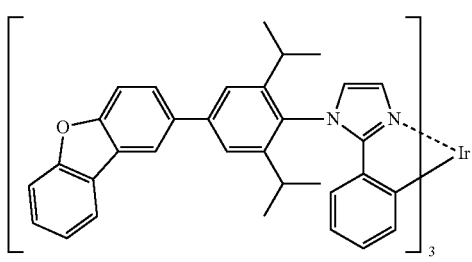
DP-43
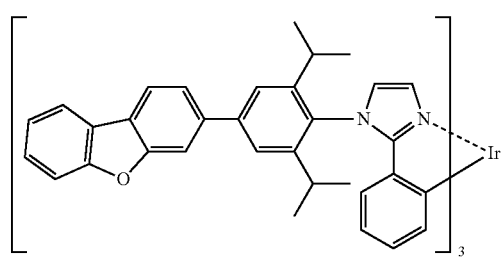
[Chem. 12]
DP-44
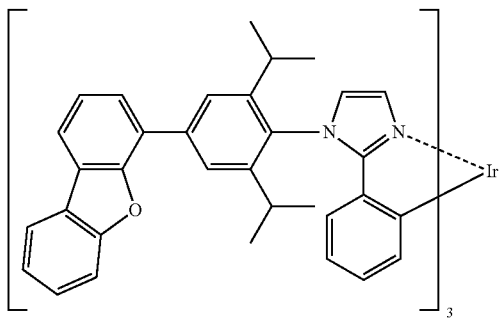
DP-45
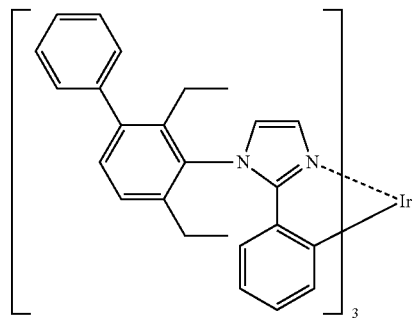
DP-46
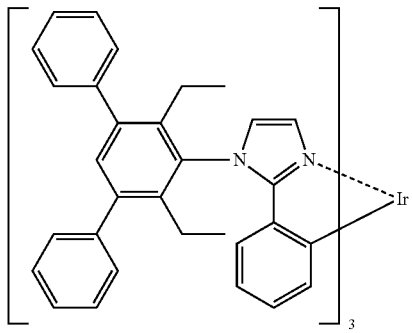
DP-47
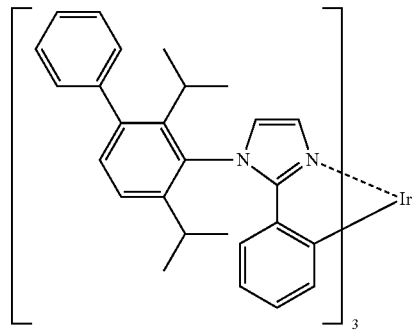
DP-48
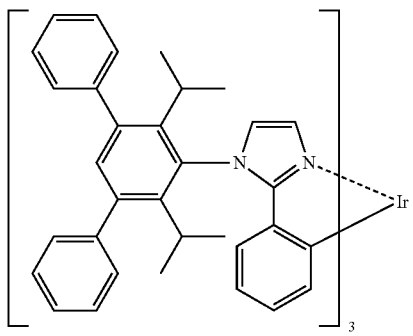
DP-49
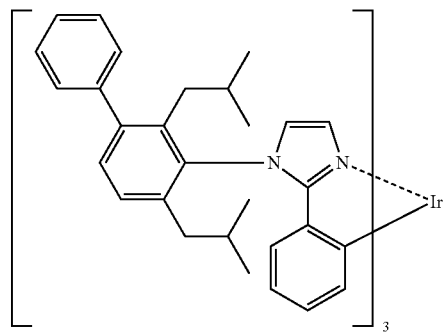

-continued
DP-50
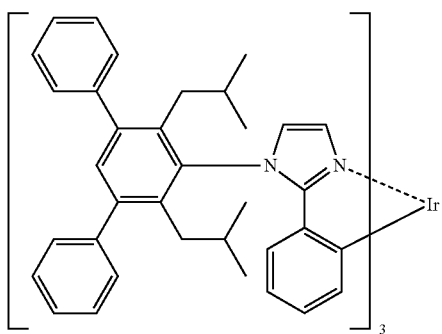
DP-51
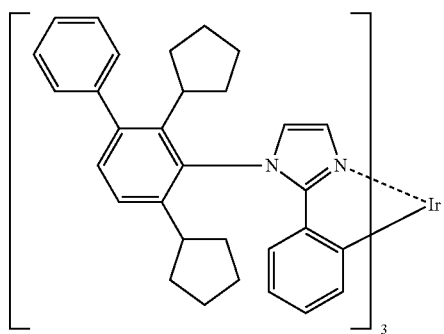
[Chem. 13]
DP-52
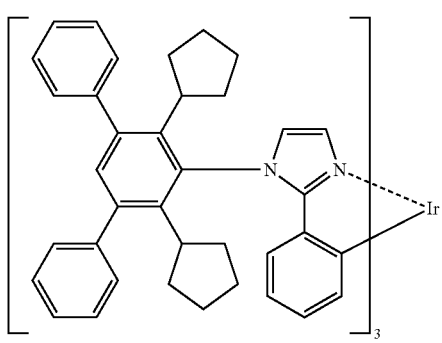
DP-53
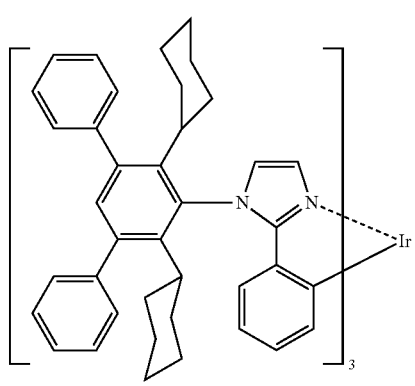
DP-54
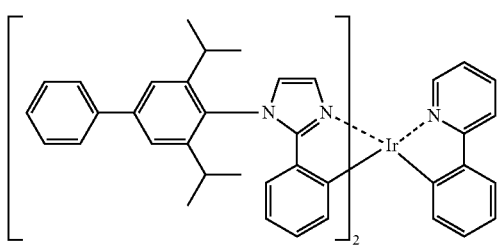
DP-55
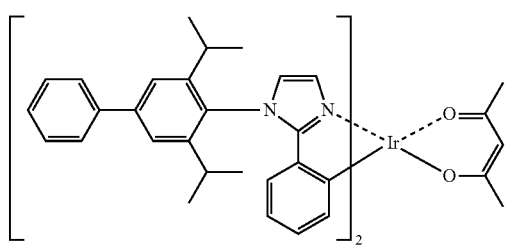
DP-56
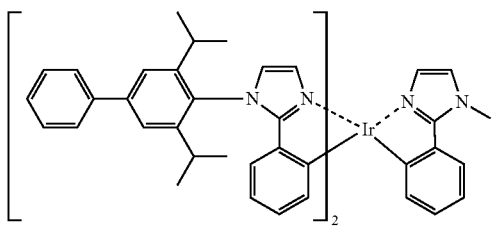
DP-57
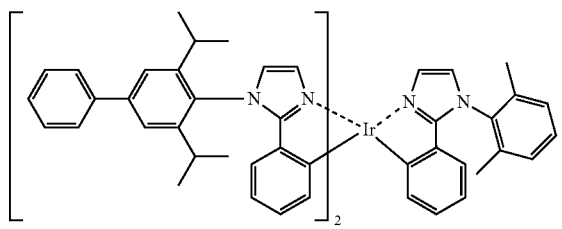
[Chem. 14]
DP-58
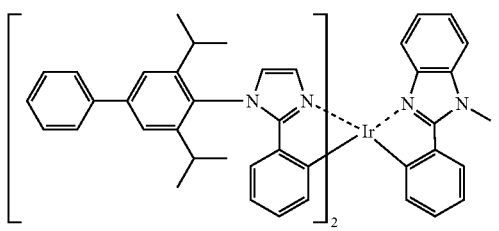
DP-59
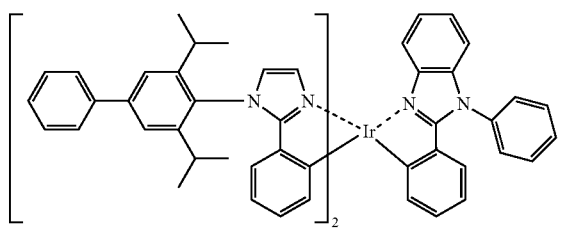

-continued
DP-60
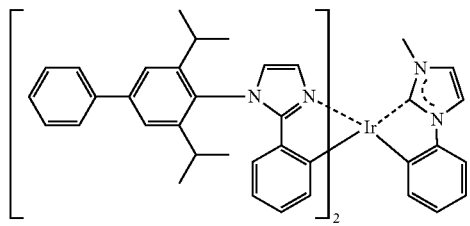
DP-61
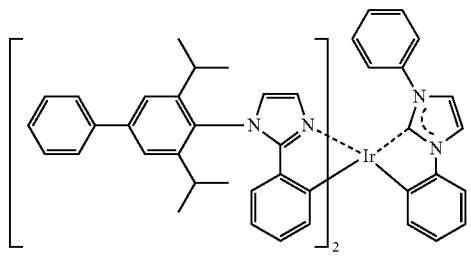
DP-62
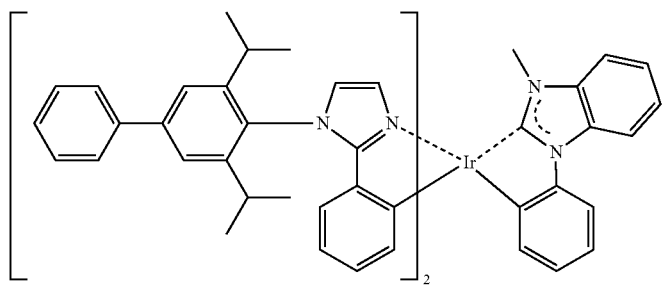
[Chem. 15]
DP-63
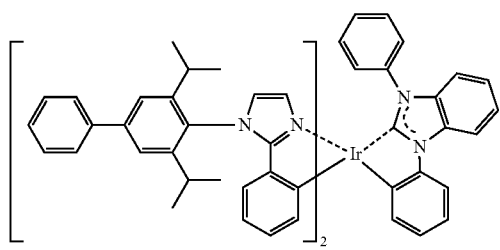
DP-64
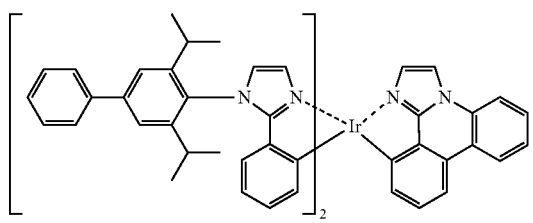
DP-65
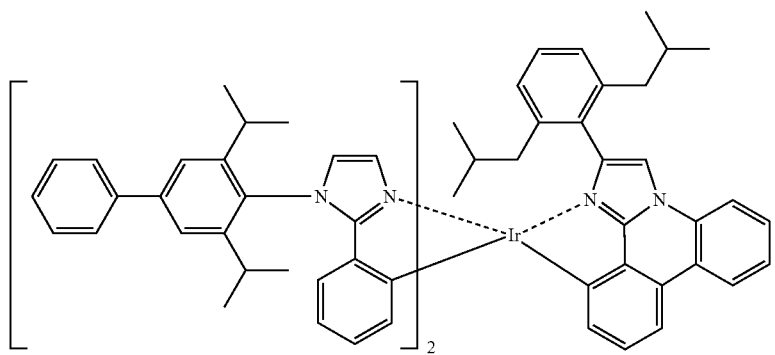
DP-66
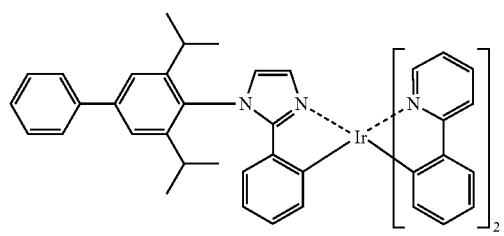
DP-67
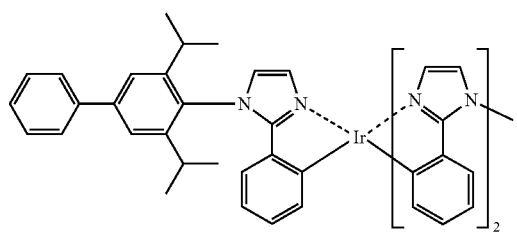

DP-68
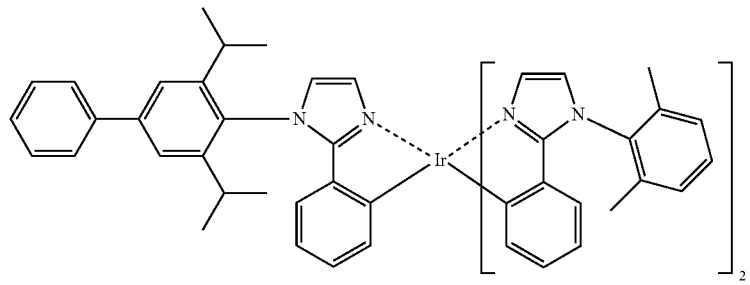
DP-69
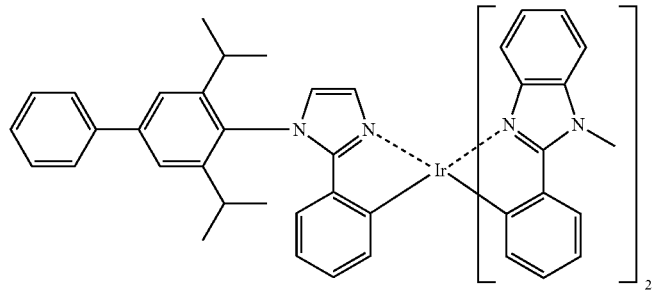
DP-70
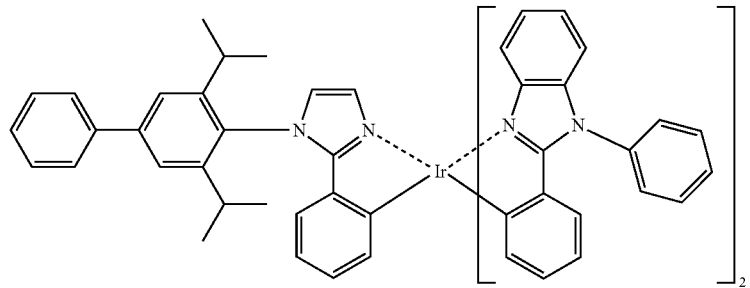
DP-71 DP-72
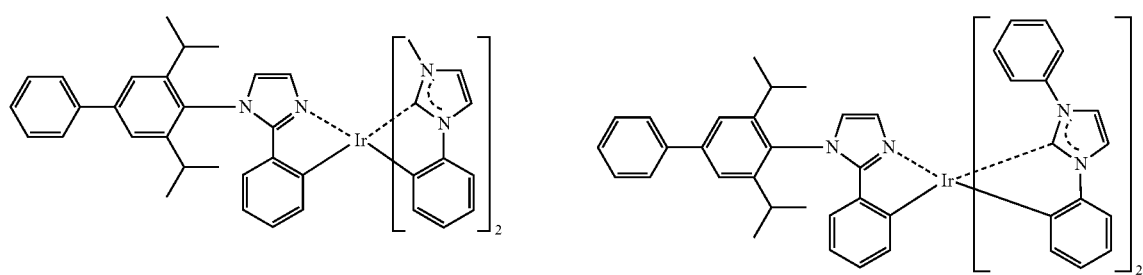
DP-73 DP-74
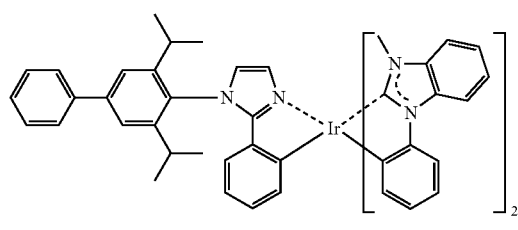
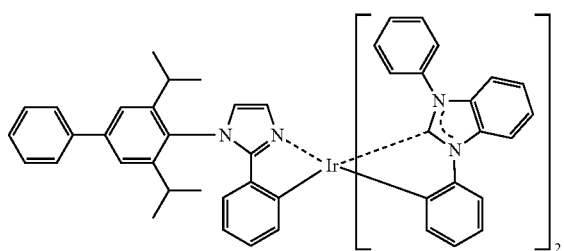

DP-75
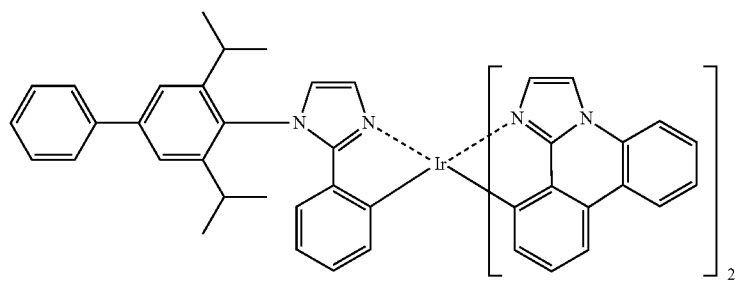
DP-76
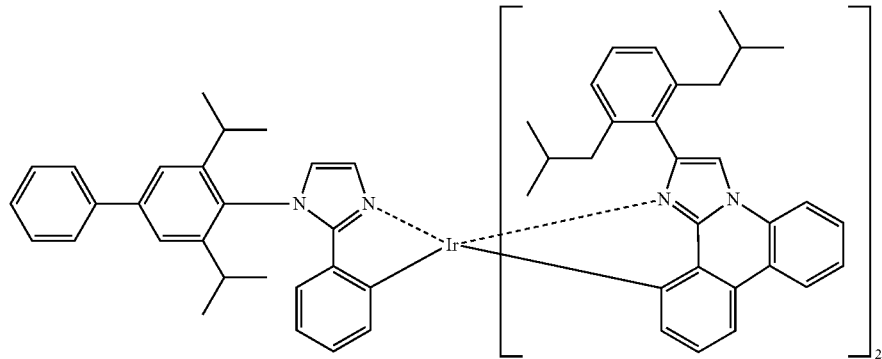
[Chem. 18]
DP-77
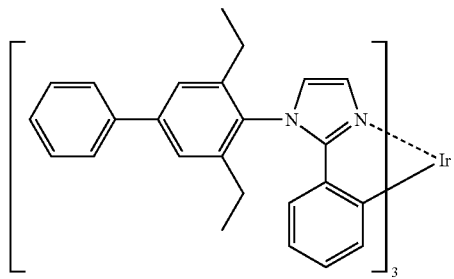
DP-78
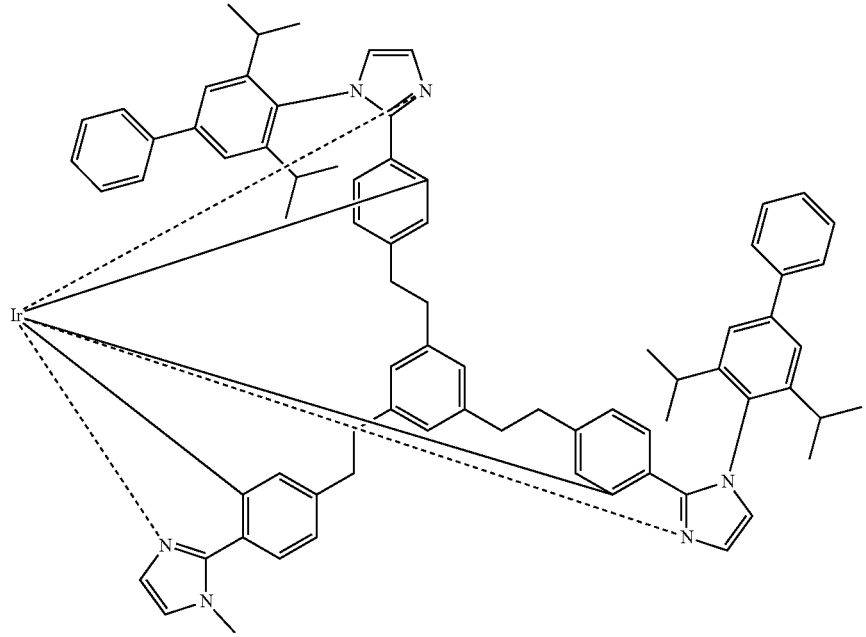

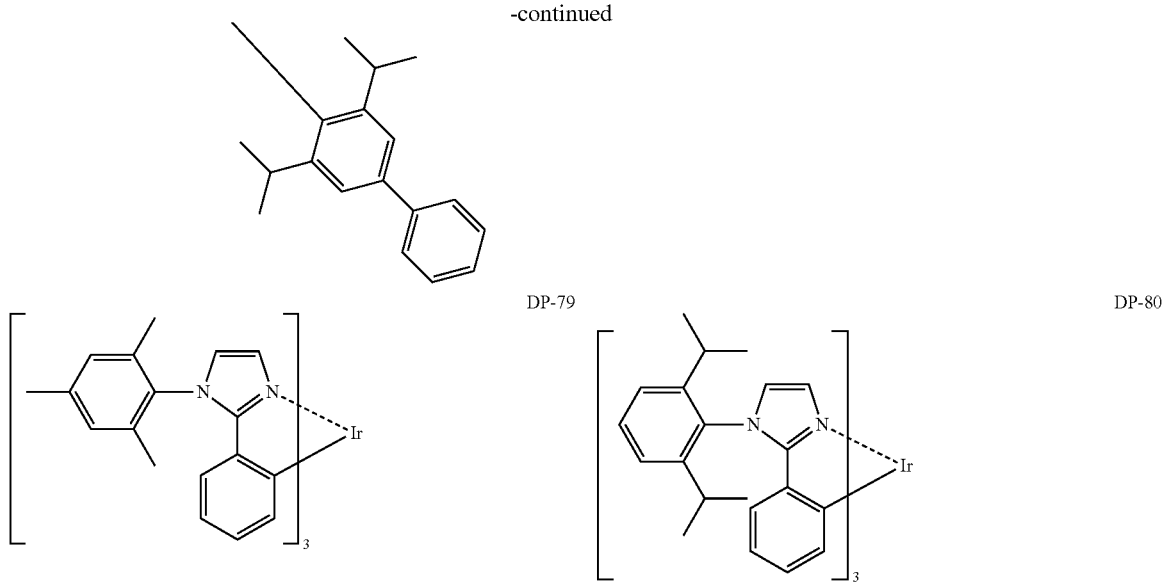

DP-79
DP-80

(1-2: Phosphorescent Organic Metal Complex (B))

The organic EL element of the present invention is characterized in that the blue light-emitting sublayer according to the present invention contains a phosphorescent organic metal complex (B) different from the phosphorescent organic metal complex (A) described above, in addition to the phosphorescent organic metal complex (A), and that the content of the phosphorescent organic metal complex (A) in the blue light-emitting sublayer is higher than that of the phosphorescent organic metal complex (B).

The phosphorescent organic metal complex (B) according to the present invention may be any phosphorescent organic metal complex having a structure different from that of the phosphorescent organic metal complex (A) according to the present invention and is preferably a phosphorescent organic metal complex represented by Formula (2):

[Chem. 19]

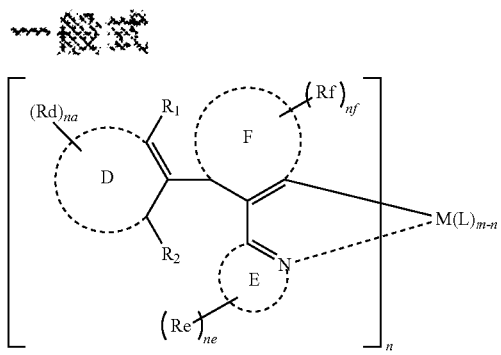

(2)

In Formula (2), rings D, E, and F each independently represent a 5- or 6-membered aromatic hydrocarbon or aromatic heterocyclic ring or a condensed ring of a 5- or 6-membered aromatic hydrocarbon or aromatic heterocyclic ring, and the 5- or 6-membered aromatic hydrocarbon or aromatic heterocyclic ring or the condensed ring of a 5- or 6-membered aromatic hydrocarbon or aromatic heterocyclic ring are synonymous with the groups represented by rings A or B in Formula (1). $R_1$, $R_2$, Rd, Re, and Rf each independently represents a hydrogen atom, a halogen atom, a cyano group, or an optionally substituted alkyl, alkenyl, alkynyl, alkoxy, amino, silyl, arylalkyl, aryl, heteroaryl, non-aromatic hydrocarbon ring, or non-aromatic heterocyclic group. The halogen atom, the cyano, alkyl, alkenyl, alkynyl, alkoxy, amino, silyl, arylalkyl, aryl, heteroaryl, non-aromatic hydrocarbon ring, and non-aromatic heterocyclic groups, and the substituent represented by $R_1$, $R_2$, Rd, Re, or Rf are synonymous with those represented by $R_1$, $R_2$, Ra, Rb, or Rc in Formula (1). nd and of each independently represent an integer of 1 to 3. ne represents an integer of 1 to 4.

$R_2$ optionally bonds to an atom constituting ring E to form a condensed ring of the 5- or 6-membered aromatic hydrocarbon or aromatic heterocyclic ring.

L represents one or more monoanionic bidentate ligands coordinated to M; M represents a transition metal atom having an atomic number of 40 or more and belonging to any one of Groups 8 to 10 in the periodic table. L and M are synonymous with L and M described in Formula (1). m-n represents an integer of 0 to 2; n represents an integer of 1 to 3; and m represents 2 or 3.

The phosphorescent organic metal complex (B) according to the present invention preferably has the lowest excited triplet energy level ($T_1$) lower than that of the host compound and higher than that of the phosphorescent organic metal complex (A) according to the present invention.

Herein, the value $T_1$ of a compound according to the present invention is calculated with molecular orbital calculation software, Gaussian 98 (Gaussian 98, Revision A.11.4, M. J. Frisch, et al., Gaussian, Inc., Pittsburgh Pa., 2002) manufactured by Gaussian, Inc. in U.S.A. and is defined as a value (eV unit conversion value) calculated by structural optimization using B3LYP/6-31G* as a keyword. This calculated value is valid because of a high correlation between the calculated values determined by such a method and experimental values.

The compounds represented by Formula (2) according to the present invention can be synthesized in accordance with a known method, as is described in International Patent Publication No. WO2006-121811.

Non-limiting examples of the phosphorescent organic metal complex (B) containing a compound represented by Formula (2) that can be preferably used in the present invention are shown below:
[Chem. 20]
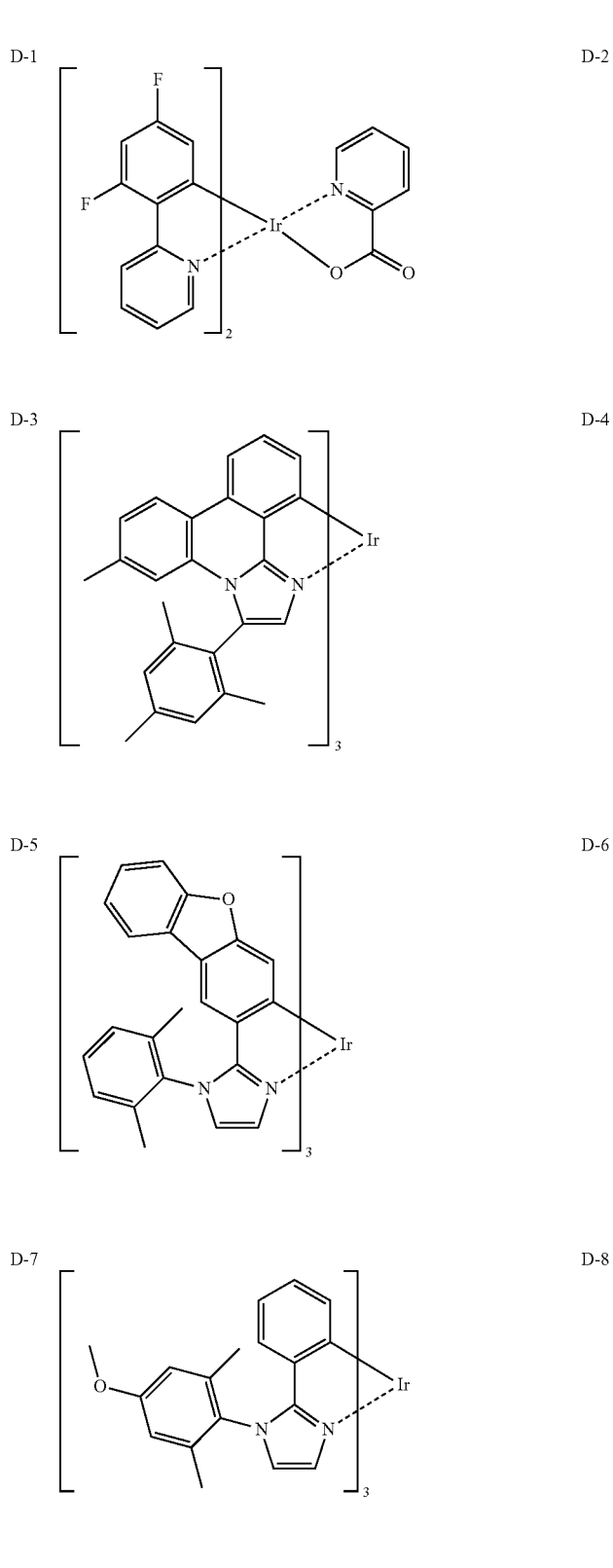

[Chem. 21]
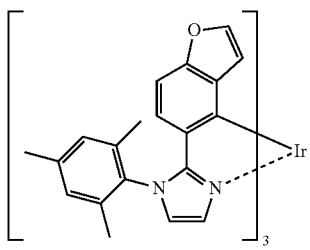
D-9
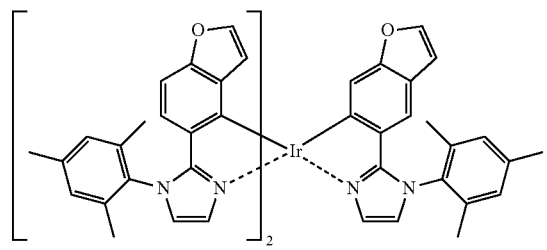
D-10
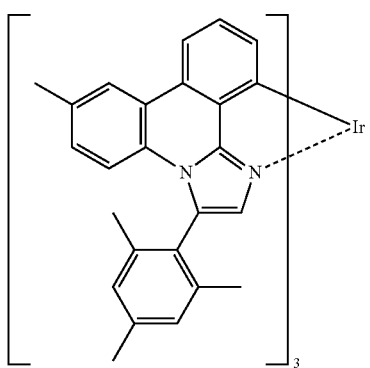
D-11
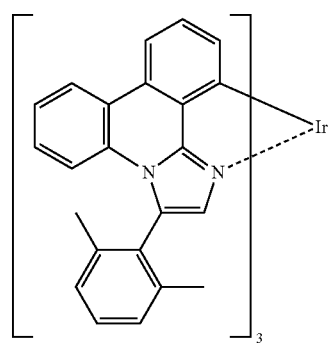
D-12
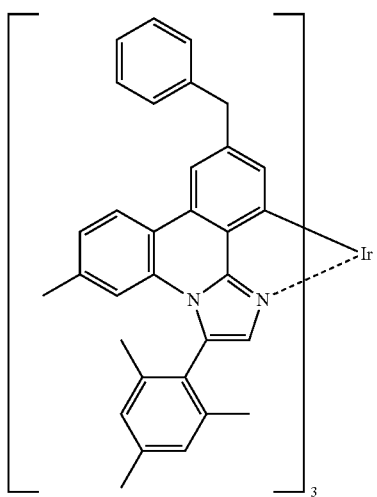
D-13
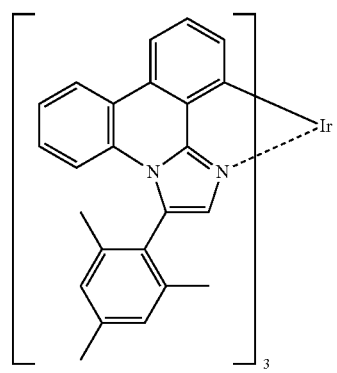
D-14

-continued
D-15
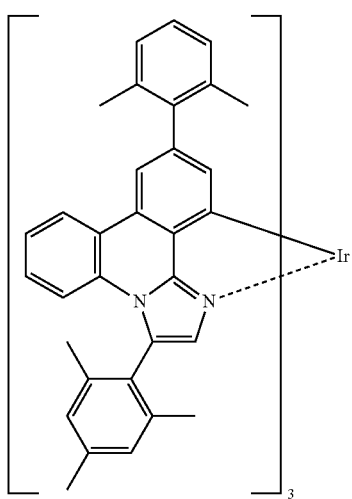
D-16
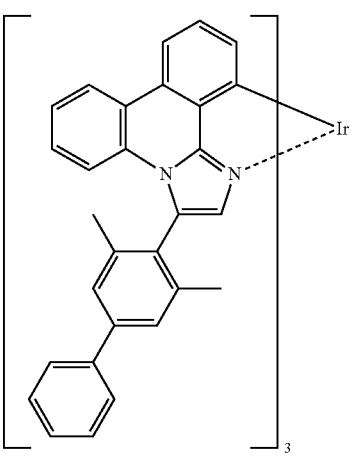
[Chem. 22]
D-17
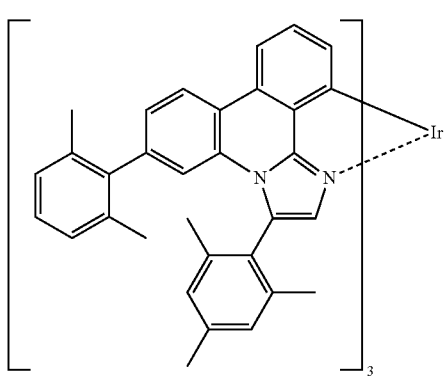
D-18
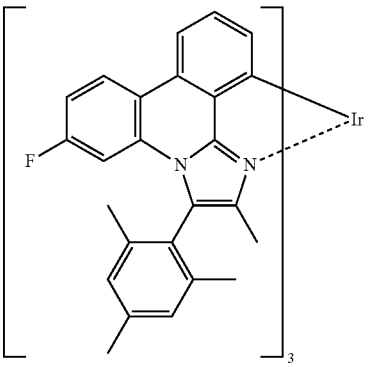
D-19
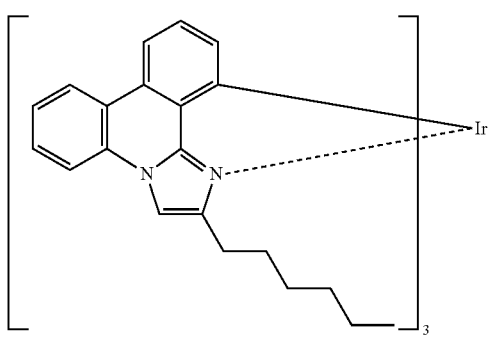
D-20
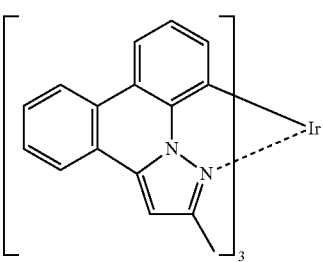
D-21
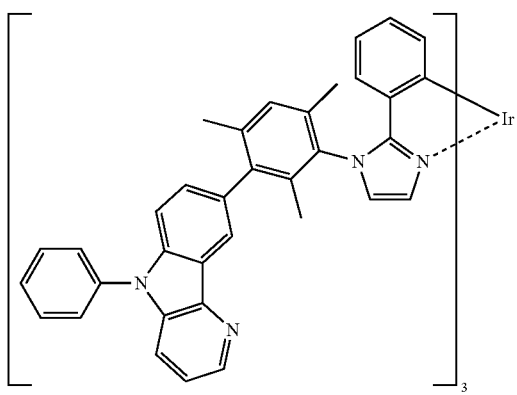
D-22
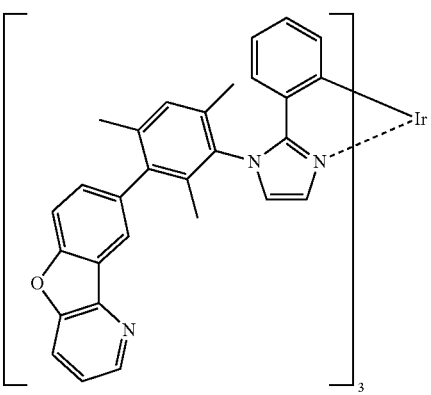

D-23 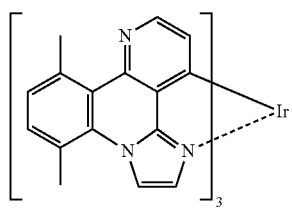
D-24 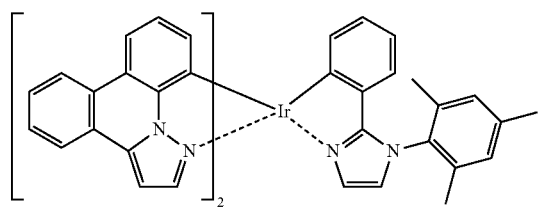
[Chem. 23]
D-25 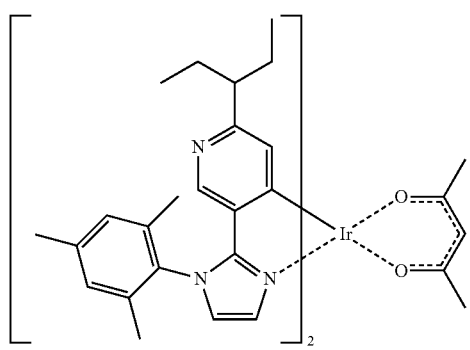
D-26 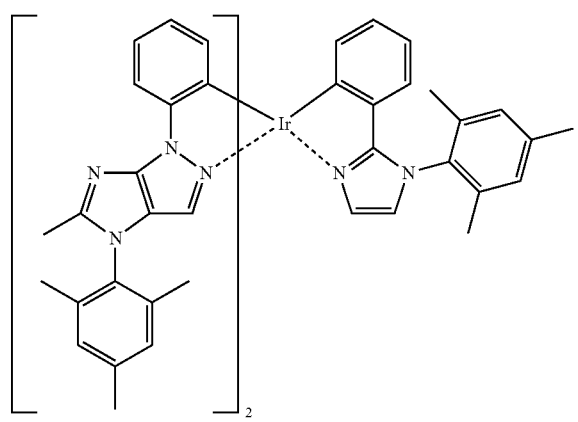
D-27 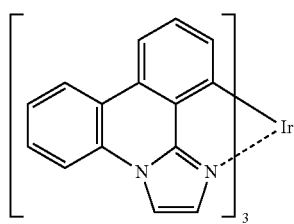
D-28 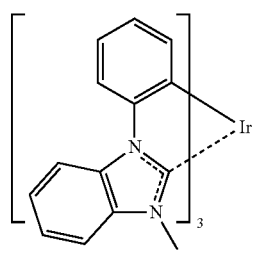
D-29 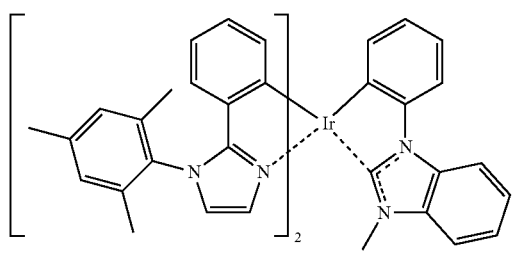
D-30 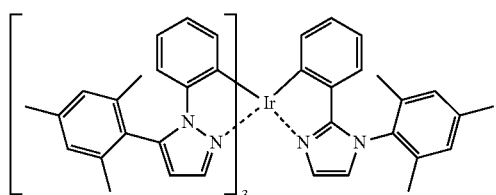
D-31 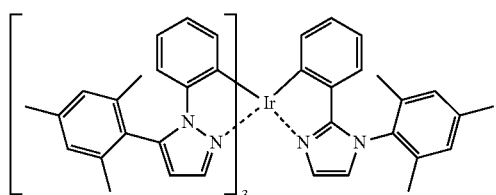
D-32 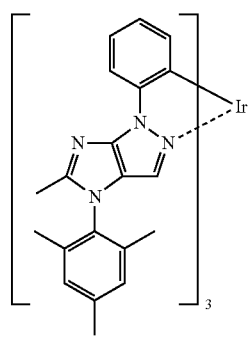

-continued
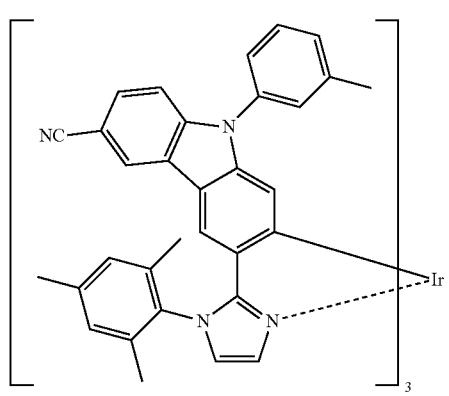
D-33
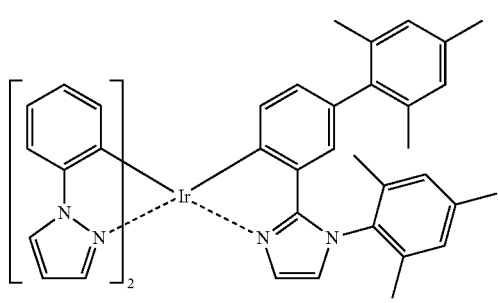
D-34
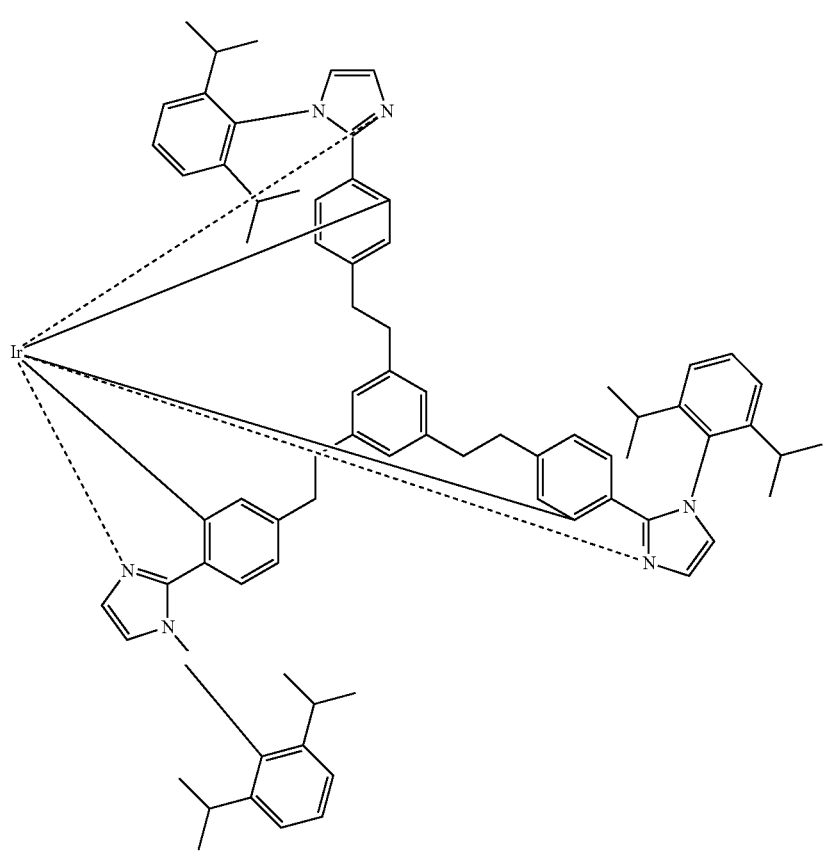
D-36

-continued
[Chem. 25]
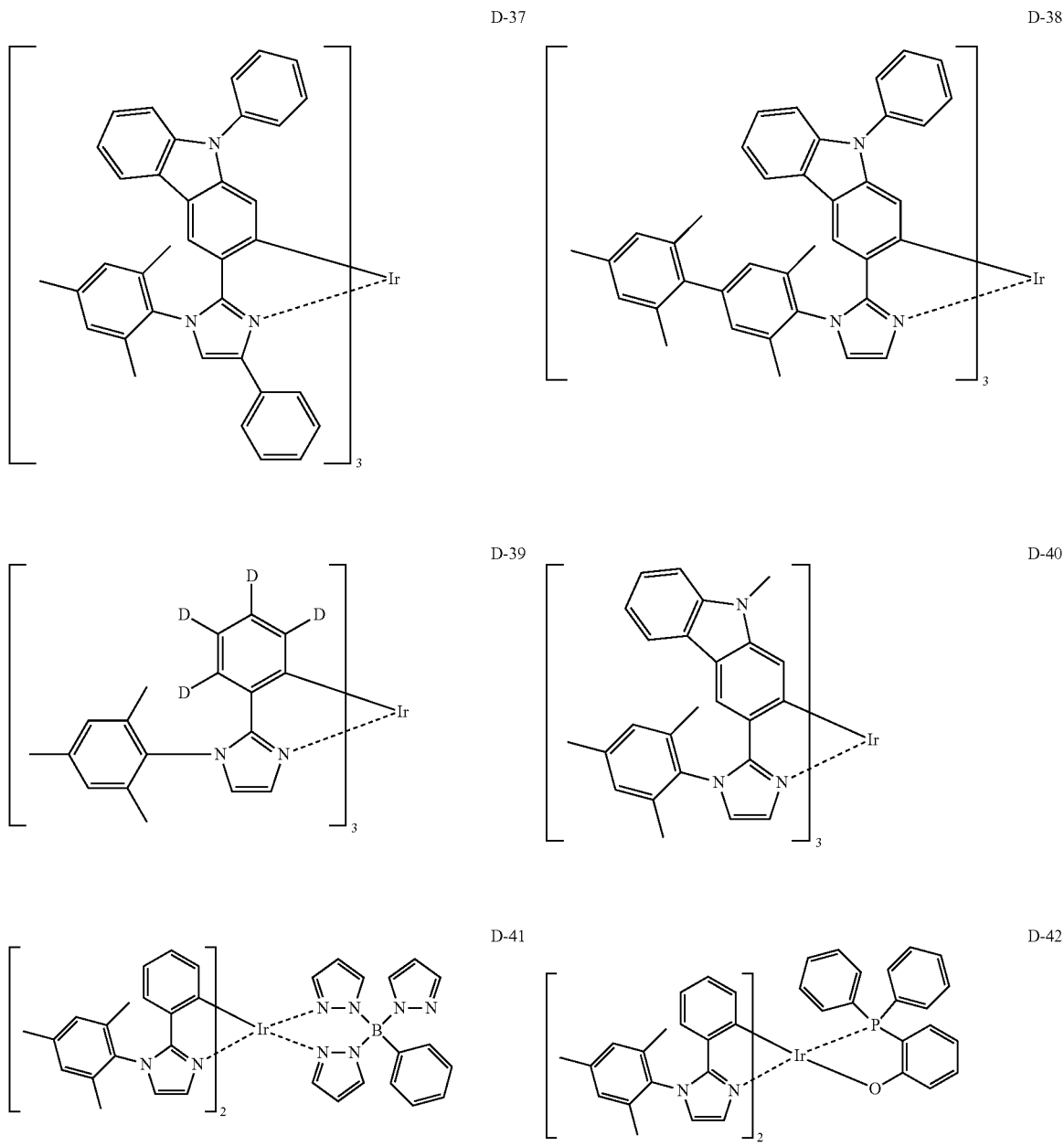
[Chem. 26]
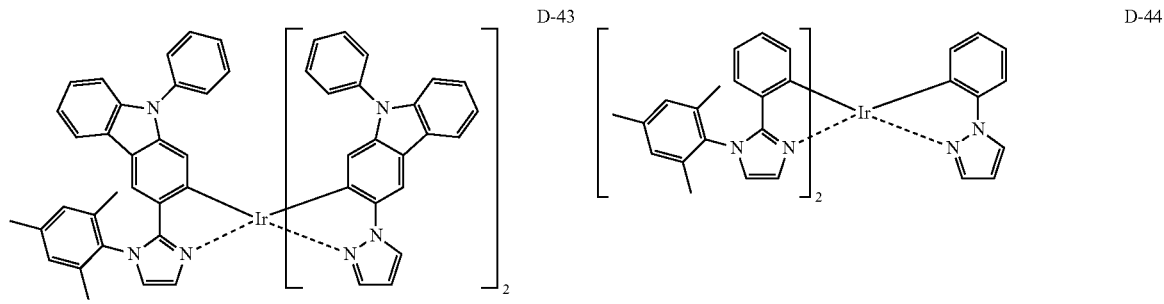

-continued
D-45
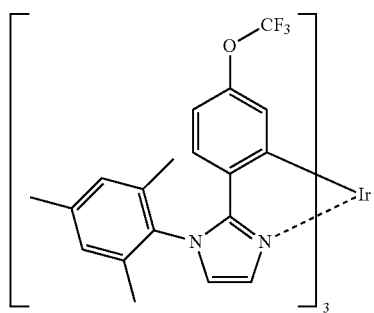
D-46
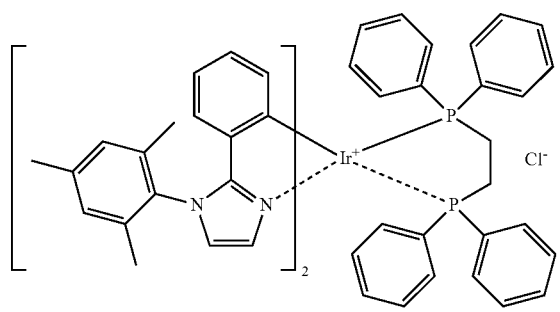
D-47
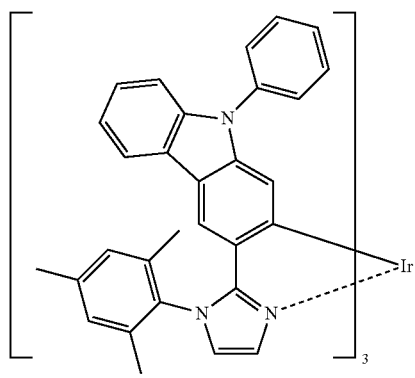
D-48
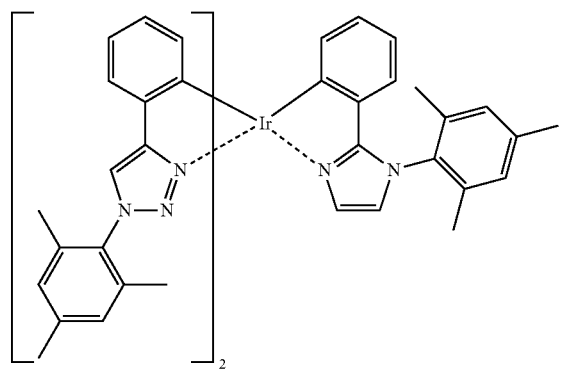
[Chem. 27]
D-49
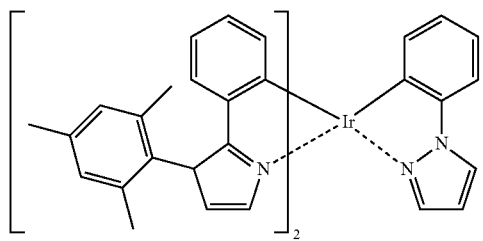
D-50
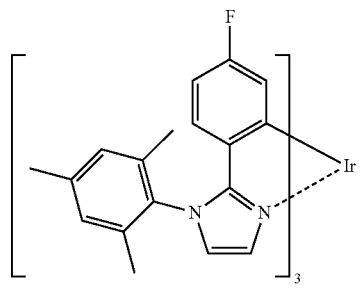
D-51
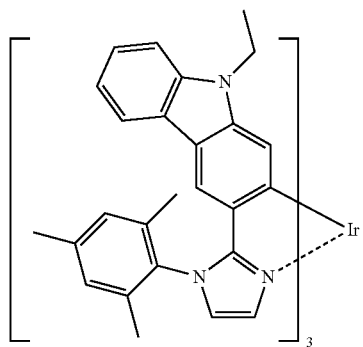
D-52
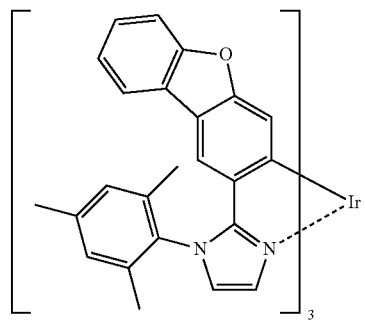

-continued

D-53

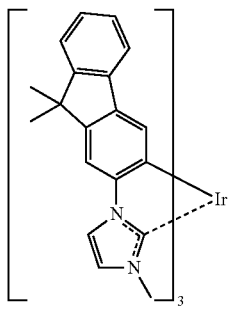

D-54

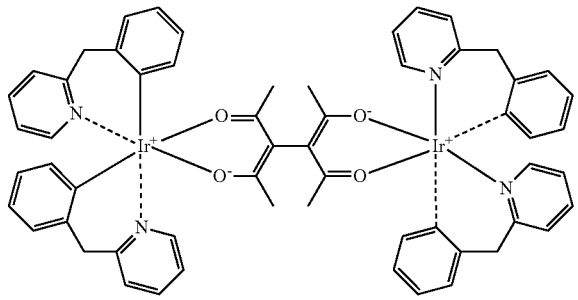

D-55

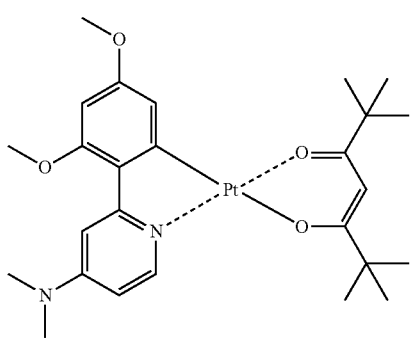

D-56

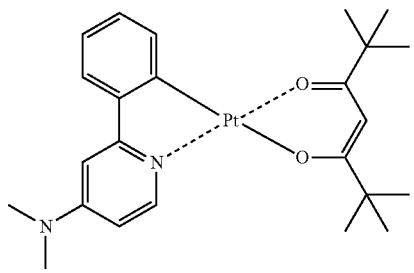

D-57

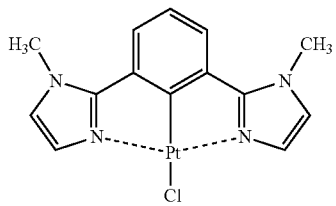

D shown in exemplary compound D-39 represents deuterium.

[2: Host Compound]

The host compound according to the present invention is defined as a compound that is contained in the light-emitting layer in a mass ratio of 20% or more in the layer and that has a phosphorescence quantum yield of less than 0.1, preferably less than 0.01, at room temperature (25° C.)

Typical examples of the host compound include carbazole derivatives, triarylamine derivatives, aromatic compounds, nitrogen-containing heterocyclic compounds, thiophene derivatives, furan derivatives, compounds having basic skeletons of, for example, oligoarylene compounds, carboline derivatives, and diazacarbazole derivatives (herein, the diazacarbazole derivative is a compound having at least one nitrogen atom substituted for any of the carbon atoms on the hydrocarbon ring constituting the carboline ring of a carboline derivative).

The known luminescent host that can be used in the present invention is preferably a compound having hole transportability and electron transportability, preventing the shift of luminescence to the longer wavelength side, and having a high glass transition temperature (Tg). The luminescent host more preferably has a Tg of 100° C. or more.

Use of a plurality of luminescent hosts facilitates the control of the transportation of charge and enhances the efficiency of the organic EL element.

Furthermore, use of a plurality of known compounds as the phosphorescent dopants can generate any intended emission color by mixing different luminescent colors.

The luminescent host used in the present invention may be a low-molecular-weight compound, a high-molecular-weight compound having a repeating unit, a low-molecular-weight compound having a polymerizable group such as a vinyl group or an epoxy group (polymerizable luminescent host), or a mixture of these compounds.

The host compound according to the present invention preferably has a partial structure represented by Formula (3):

[Chem. 28]

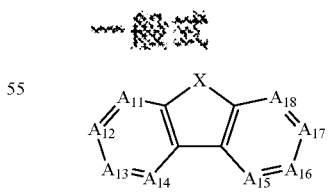

(3)

In Formula (3), X represents an oxygen atom, a sulfur atom, or an $NR^1$ group; and $A_{11}$ to $A_{18}$ each independently represent a nitrogen atom or $CR^2$, wherein $R^1$ and $R^2$ each independently represent a bonding hand, a hydrogen atom, or a substituent; and if there are a plurality of $CR^2$'s, they may be the same or different.

In Formula (3), examples of the substituent represented by $R^1$ or $R^2$ include alkyl groups (e.g., methyl, ethyl, propyl, isopropyl, tert-butyl, pentyl, hexyl, octyl, dodecyl, tridecyl, tetradecyl, and pentadecyl groups), alkenyl groups (e.g., vinyl and aryl groups), alkynyl groups (e.g., ethynyl and propargyl groups), non-aromatic hydrocarbon ring groups (for example, cycloalkyl groups (e.g., cyclopentyl and cyclohexyl groups), cycloalkoxy groups (e.g., cyclopentyloxy and cyclohexyloxy groups), cycloalkylthio groups (e.g., cyclopentylthio and cyclohexylthio groups), and monovalent groups derived from, for example, tetrahydronaphthalene, 9,10-dihydroanthracene, and biphenylene rings), non-aromatic heterocyclic groups (e.g., monovalent groups derived from, for example, epoxy, aziridine, thiirane, oxetane, azetidine, thietane, tetrahydrofuran, dioxolane, pyrrolidine, pyrazolidine, imidazolidine, oxazolidine, tetrahydrothiophene, sulfolane, thiazolidine, ε-caprolactone, ε-caprolactam, piperidine, hexahydropyridazine, hexahydropyrimidine, piperazine, morpholine, tetrahydropyran, 1,3-dioxane, 1,4-dioxane, trioxane, tetrahydrothiopyran, thiomorpholine, thiomorpholine-1,1-dioxide, pyranose, diazabicyclo[2,2,2]-octane, phenoxazine, phenothiazine, oxanthrene, thioxanthene, and phenoxathiin rings), aromatic hydrocarbon groups (e.g., monovalent groups derived from, for example, benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthranthrene rings), aromatic heterocyclic groups (e.g., silole, furan, thiophene, oxazole, pyrrole, pyridine, pyridazine, pyrimidine, pyrazine, triazine, oxadiazole, triazole, imidazole, pyrazole, triazole, indole, benzimidazole, benzothiazole, benzoxazole, quinoxaline, quinazoline, phthalazine, thienothiophene, and carbazole rings, and azacarbazole rings (referring to rings each having one or more nitrogen atoms substituted for carbon atom(s) on a carbazole ring), and dibenzosilole, dibenzofuran, dibenzothiophene, and benzothiophene rings, and rings each having one or more nitrogen atoms substituted for carbon atom(s) on a dibenzofuran ring, and benzodifuran, benzodithiophene, acridine, benzoquinoline, phenazine, phenanthridine, phenanthroline, cyclazine, quindoline, thebenidine, quinindoline, triphenodithiazine, triphenodioxazine, phenanthrazine, anthrazine, perimidine, naphthofuran, naphthothiophene, naphthodifuran, naphthodithiophene, anthrafuran, anthradifuran, anthrathiophene, anthradithiophene, thianthrene, phenoxathiin, dibenzocarbazole, indolocarbazole, and dithienobenzene rings), alkoxy groups (e.g., methoxy, ethoxy, propyloxy, pentyloxy, hexyloxy, octyloxy, and dodecyloxy groups), aryloxy groups (e.g., phenoxy and naphthyloxy groups), alkylthio groups (e.g., methylthio, ethylthio, propylthio, pentylthio, hexylthio, octylthio, and dodecylthio groups), arylthio groups (e.g., phenylthio and naphthylthio groups), alkoxycarbonyl groups (e.g., methyloxycarbonyl, ethyloxycarbonyl, butyloxycarbonyl, octyloxycarbonyl, and dodecyloxycarbonyl groups), aryloxycarbonyl groups (e.g., phenyloxycarbonyl and naphthyloxycarbonyl groups), sulfamoyl groups (e.g., aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups), acyl groups (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups), acyloxy groups (e.g., acetyloxy, ethylcarbonyloxy, butylcarbonyloxy, octylcarbonyloxy, dodecylcarbonyloxy, and phenylcarbonyloxy groups), amido groups (e.g., methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups), carbamoyl groups (e.g., aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups), ureido groups (e.g., methylureido, ethylureido, pentylureido, cyclohexylureido, octylureido, dodecylureido, phenylureido, naphthylureido, and 2-pyridylaminoureido groups), sulfinyl groups (e.g., methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups), alkylsulfonyl groups (e.g., methylsulfonyl, ethylsulfonyl, butylsulfonyl, cyclohexylsulfonyl, 2-ethylhexylsulfonyl, and dodecylsulfonyl groups), arylsulfonyl or heteroarylsulfonyl groups (e.g., phenylsulfonyl, naphthylsulfonyl, and 2-pyridylsulfonyl groups), amino groups (e.g., amino, ethylamino, dimethylamino, butylamino, cyclopentylamino, 2-ethylhexylamino, dodecylamino, anilino, naphthylamino, and 2-pyridylamino groups), halogen atoms (e.g., fluorine, chlorine, and bromine atoms), fluorohydrocarbon groups (e.g., fluoromethyl, trifluoromethyl, pentafluoroethyl, and pentafluorophenyl groups), a cyano group, a nitro group, a hydroxy group, a mercapto group, silyl groups (e.g., trimethylsilyl, triisopropylsilyl, triphenylsilyl, and phenyldiethylsilyl groups), and a phosphono group.

From the viewpoint of temporal stability and producibility of element production, a higher glass transition temperature (Tg) of the host compound is preferred. The compound represented by Formula (3) preferably has a Tg of 100° C. or more, more preferably 120° C. or more, and most preferably 130° C. or more.

The host compound represented by Formula (3) also preferably has the lowest excited triplet energy level ($T_1$) higher than that of the blue phosphorescent organic metal complex that is used together with the host compound. The $T_1$ of the host compound is preferably 2.7 eV or more, more preferably 2.75 eV or more, and most preferably 2.8 eV or more.

The compound represented by Formula (3) preferably has a molecular weight within a range of 500 to 2000 and more preferably 700 to 1500.

Non-limiting examples of the host compound that can be preferably used in the present invention are shown below:

[Chem. 29]
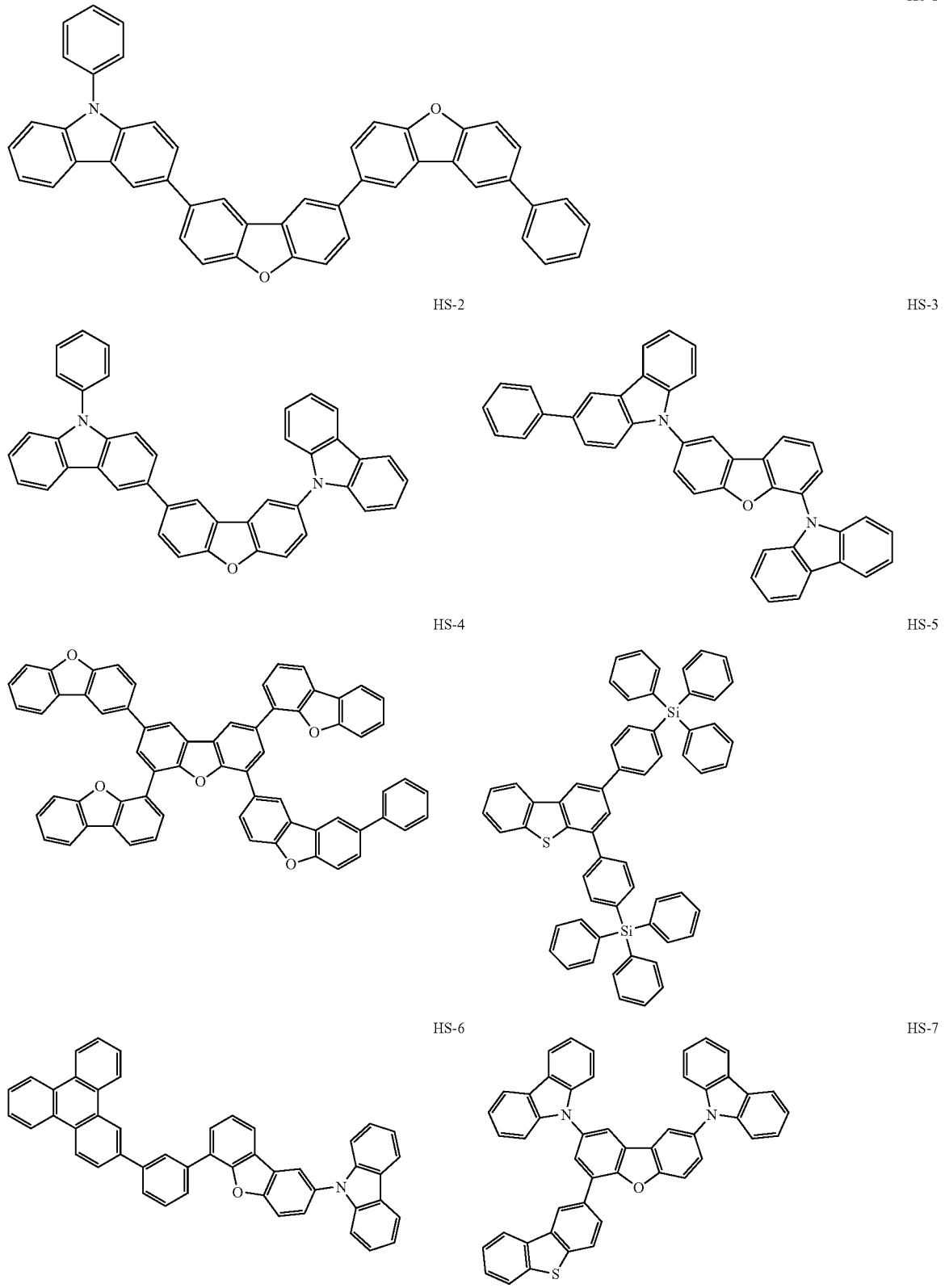

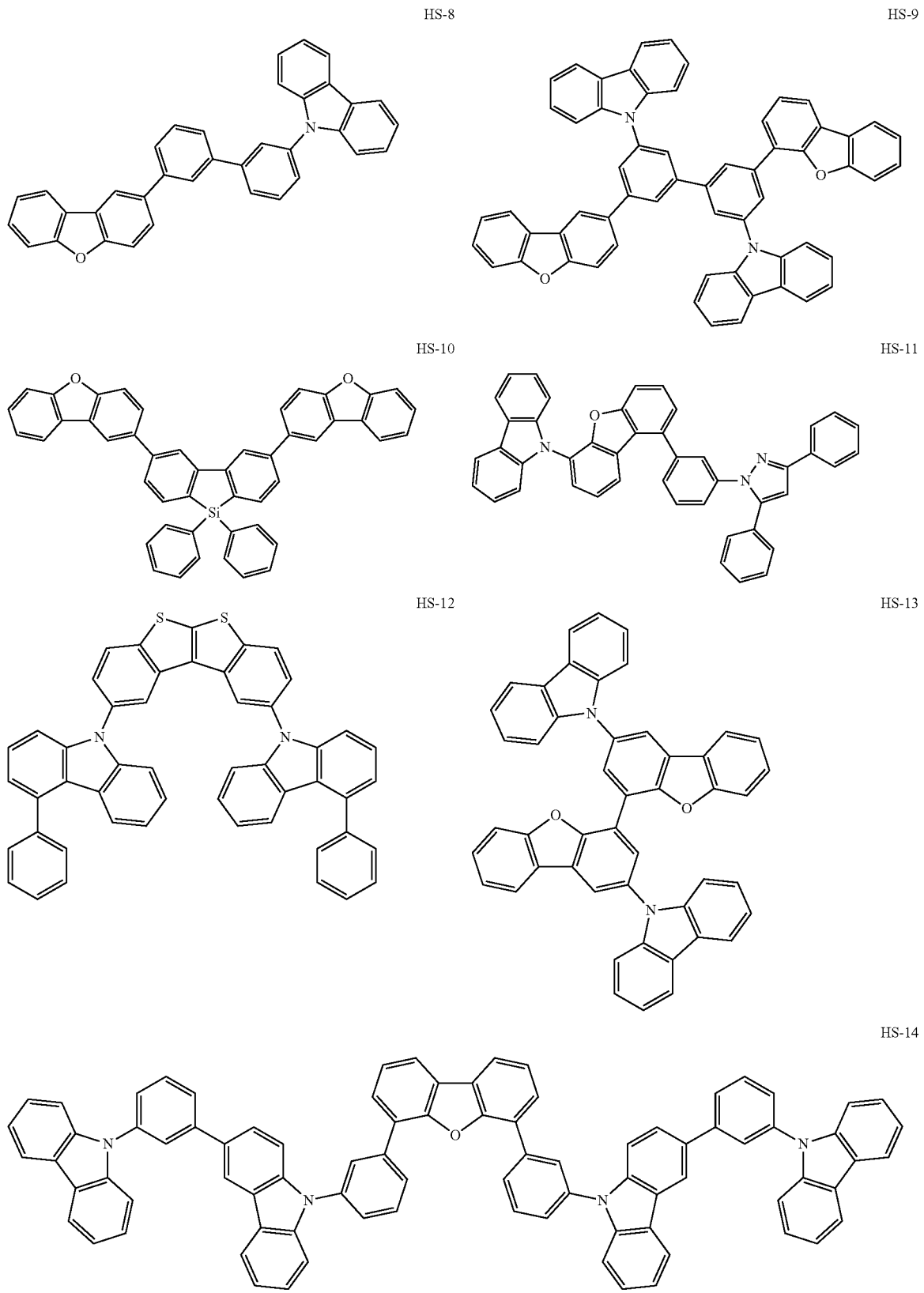

[Chem. 31]
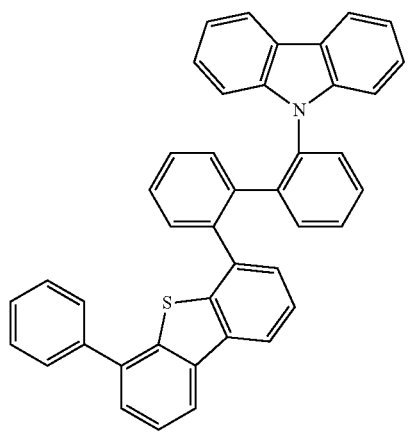
HS-15
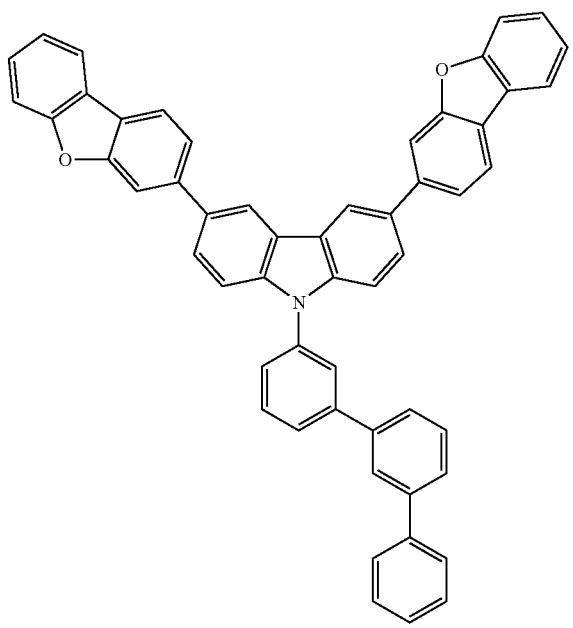
HS-16
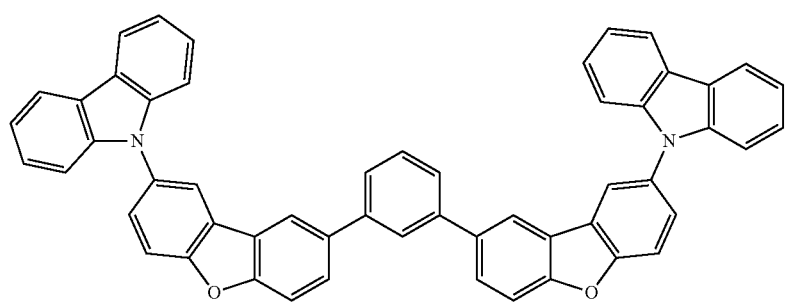
HS-17
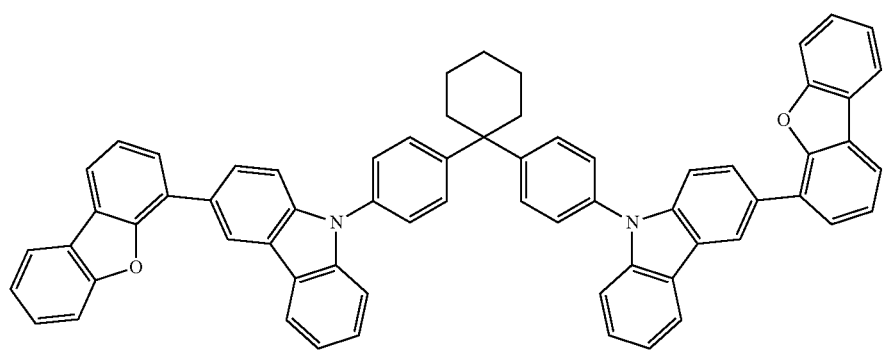
HS-18

-continued
HS-19
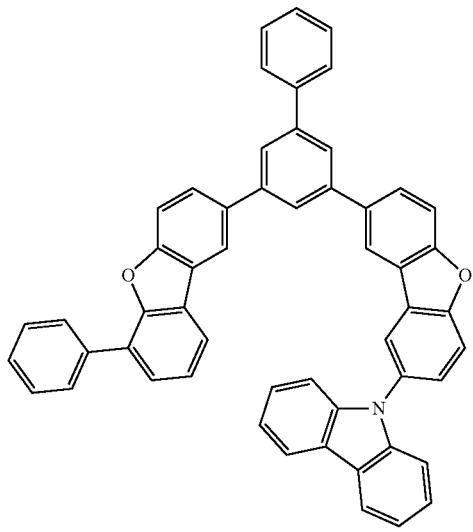
HS-20
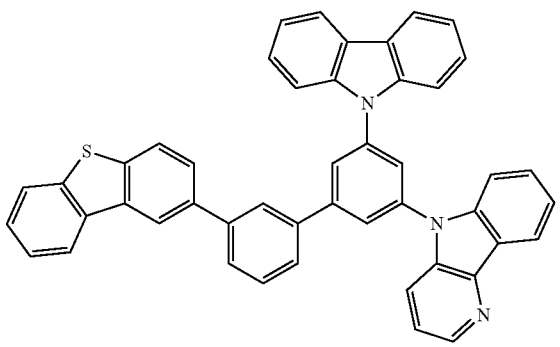
[Chem. 32]
HS-21
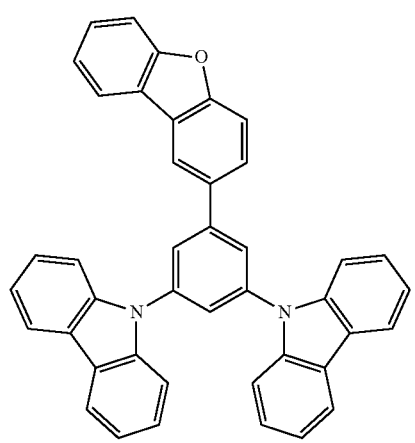
HS-22
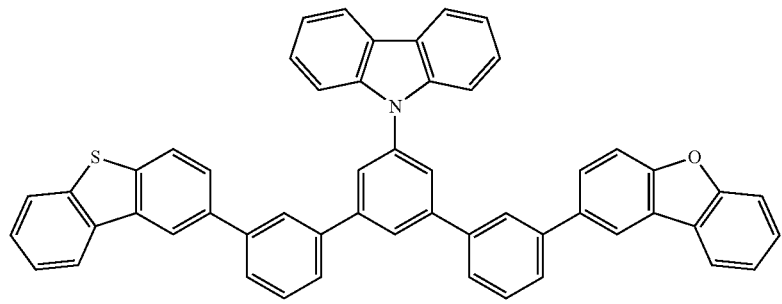

-continued
HS-23
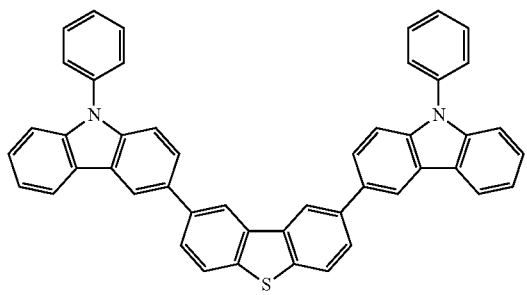
HS-24
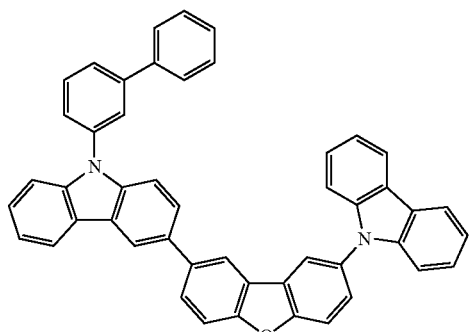
HS-25
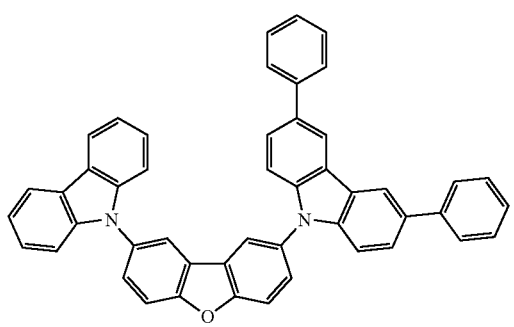
HS-26
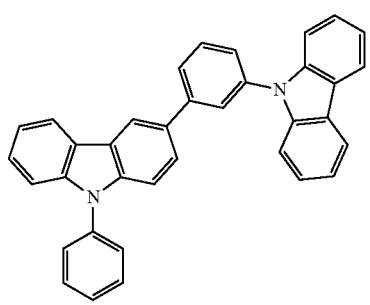
HS-27
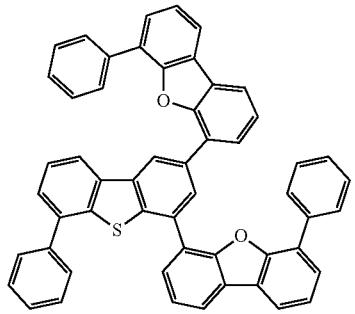
HS-28
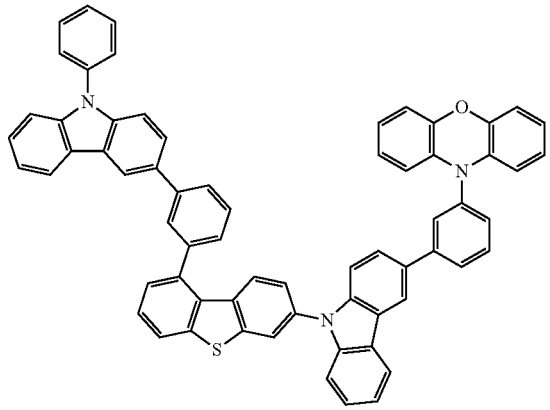
[Chem. 33]
HS-29
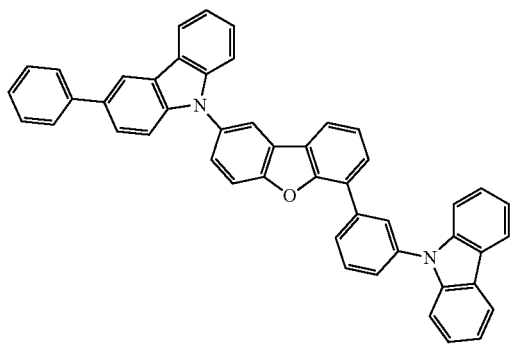
HS-30
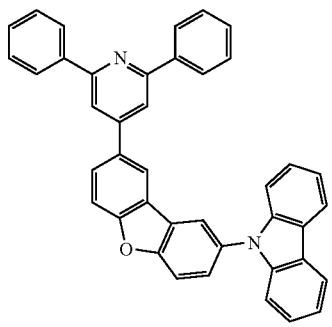

HS-31
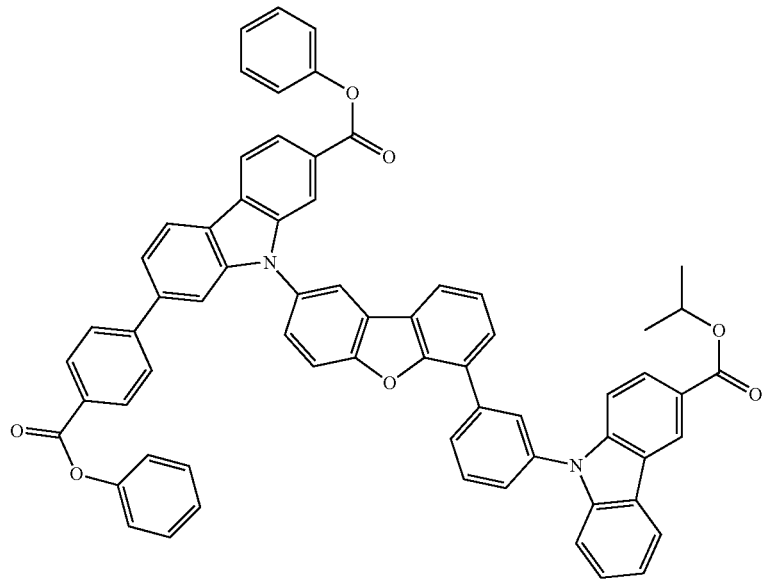
HS-32
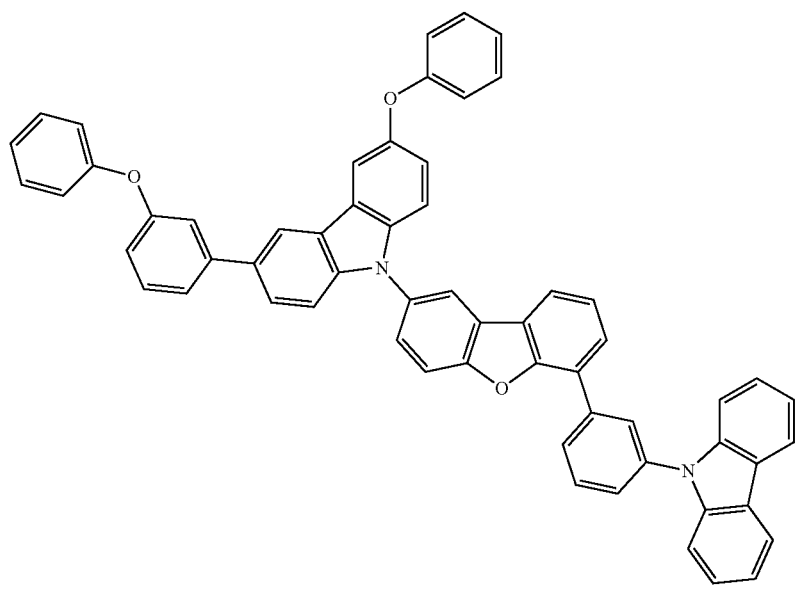
HS-33
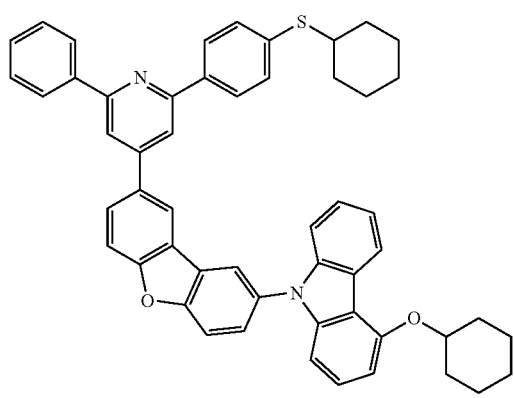

-continued
[Chem. 34]
HS-34
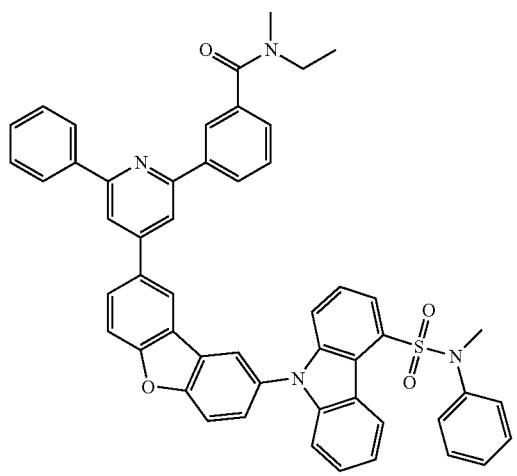
HS-35
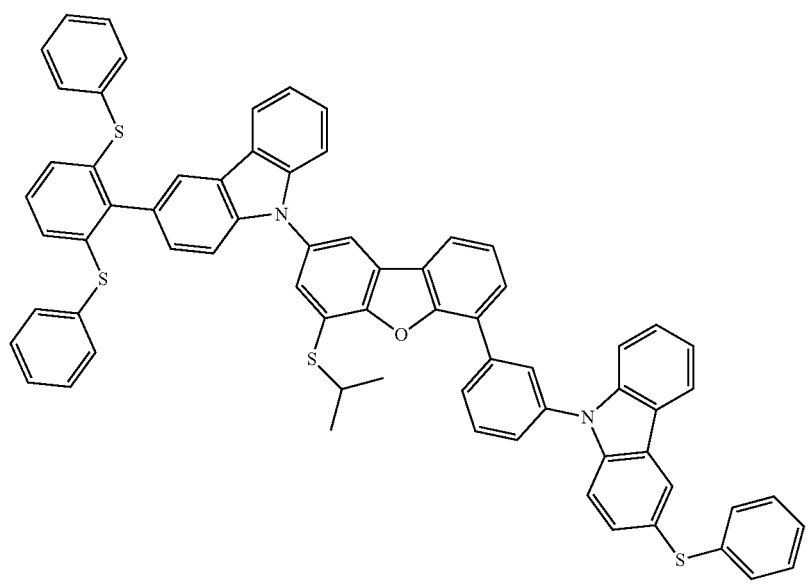
HS-36
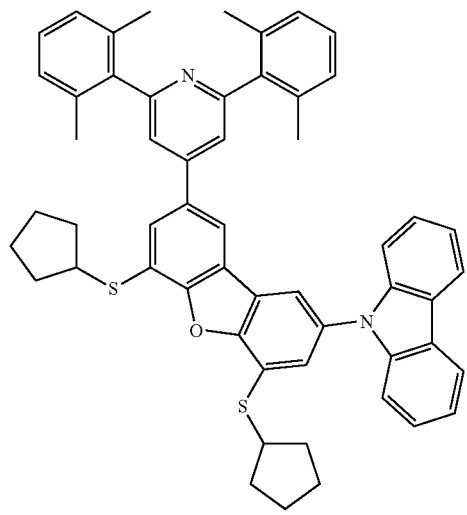

HS-37
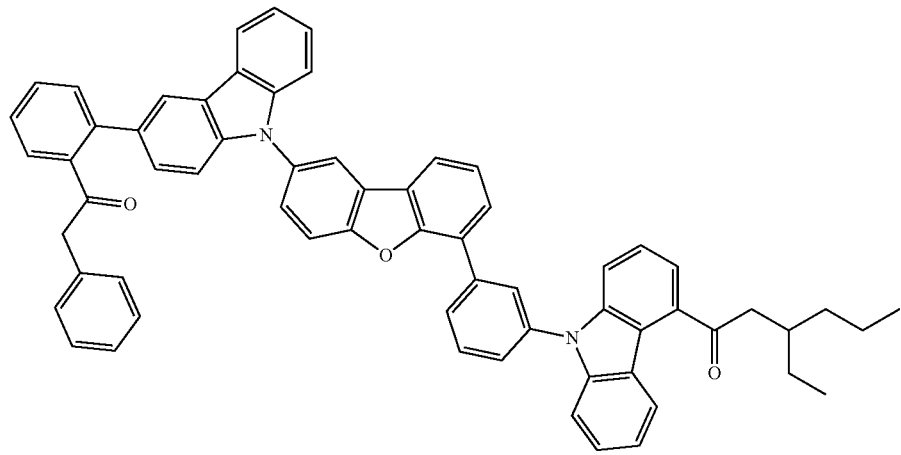
HS-38
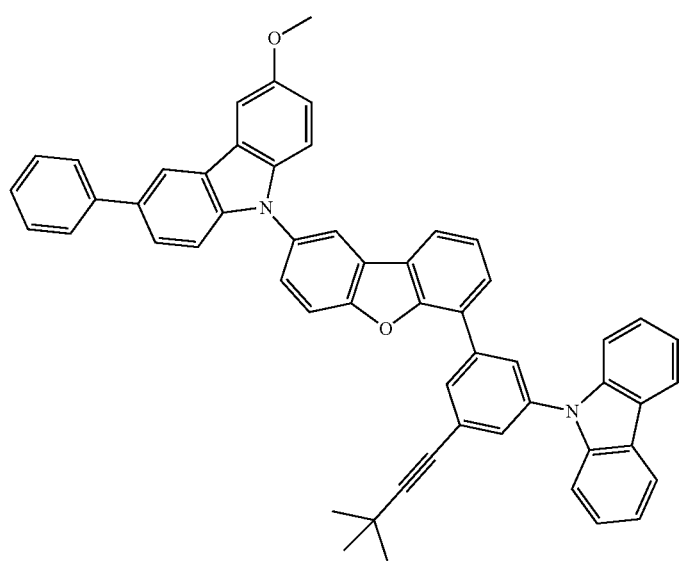
[Chem. 35]
HS-39
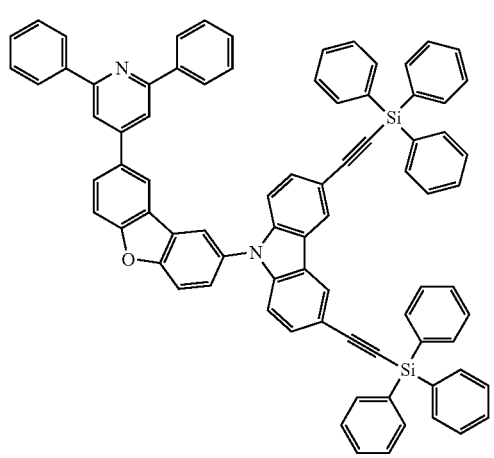
HS-40
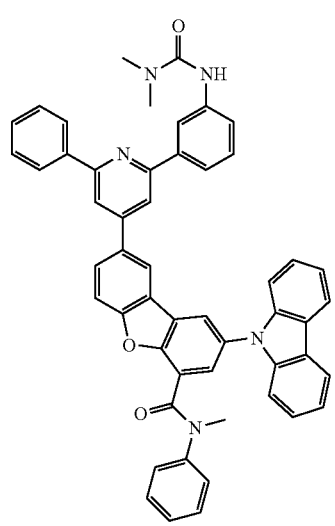

-continued
HS-41
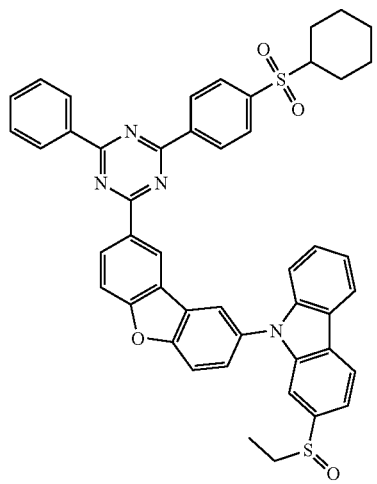
HS-42
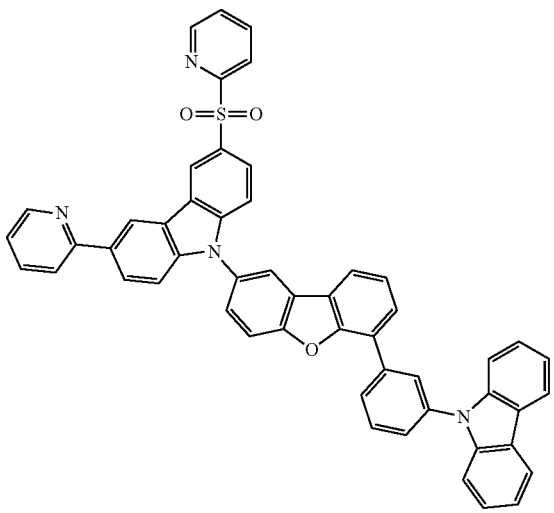
HS-43
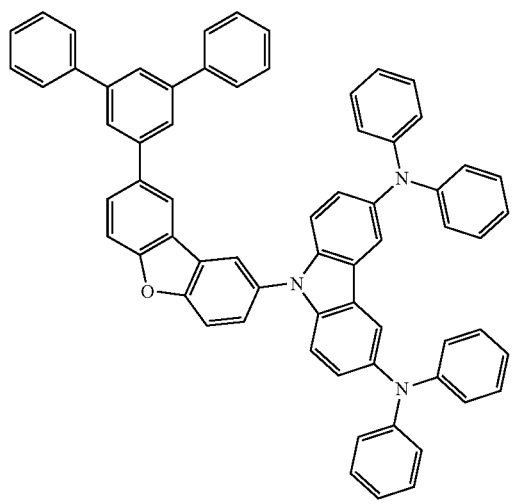
[Chem. 36]
HS-44
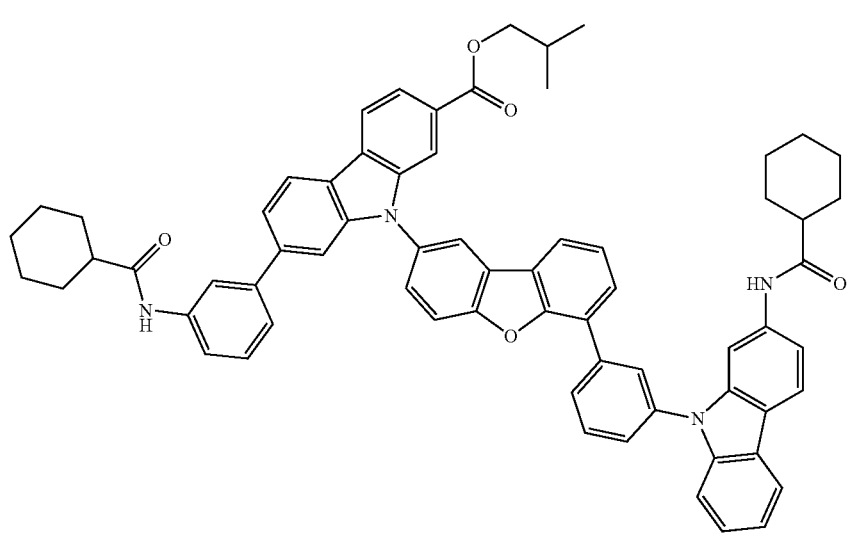

-continued
HS-45
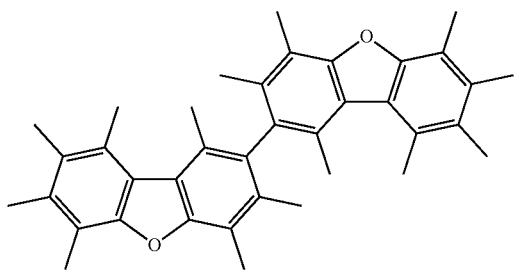
HS-46
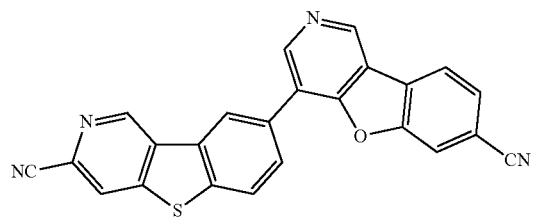
HS-47
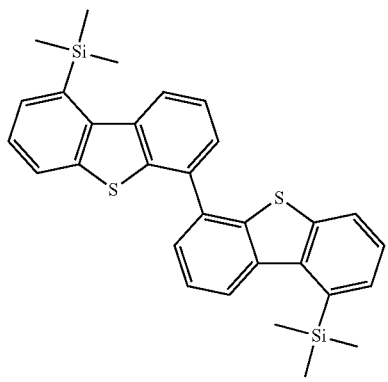
HS-48
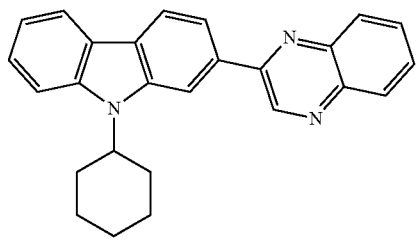
HS-49
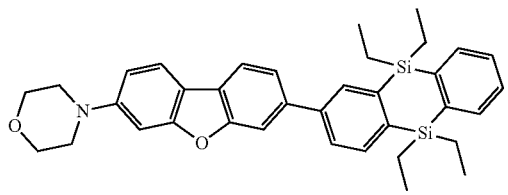
HS-50
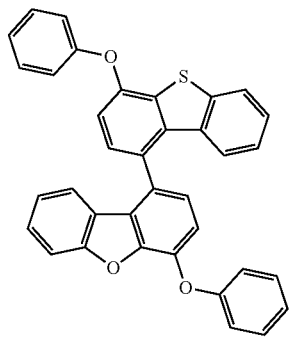
HS-51
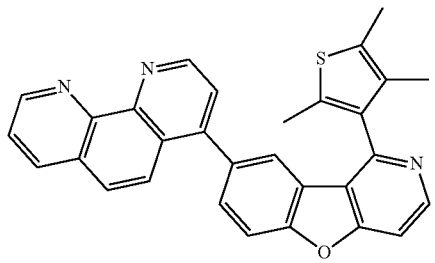
HS-52
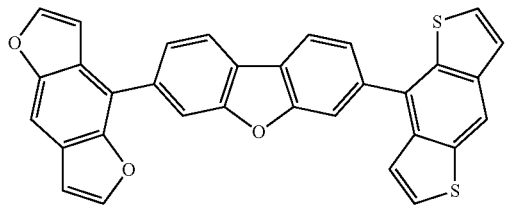
[Chem. 37]
HS-53
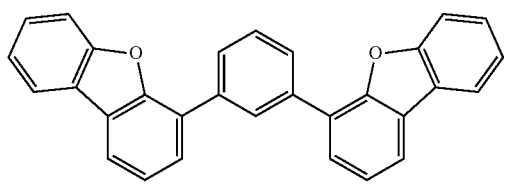
HS-54
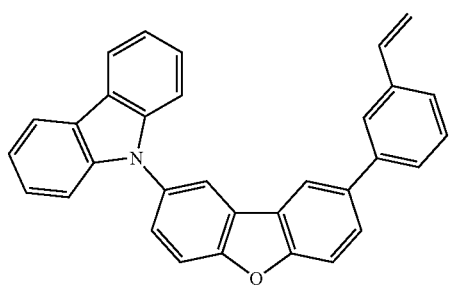

-continued
HS-55
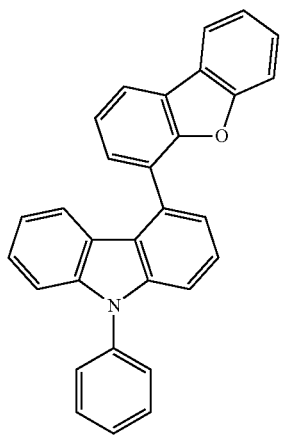
HS-56
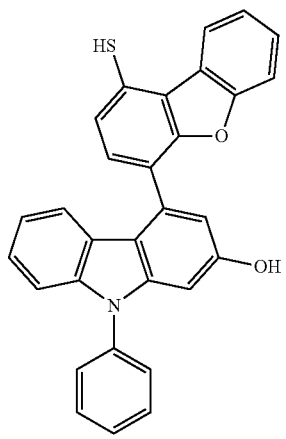
HS-57
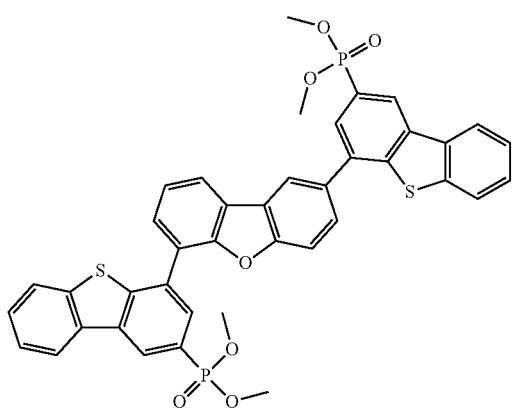
HS-58
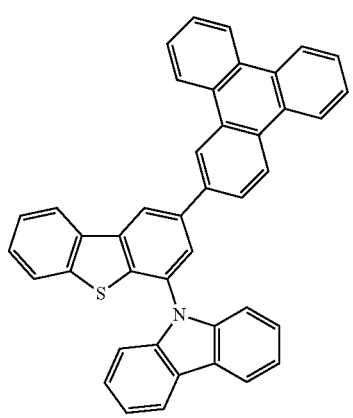
HS-59
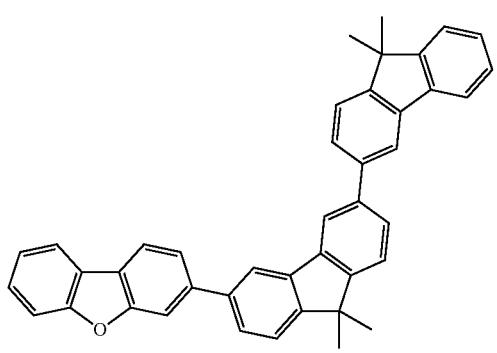
HS-60
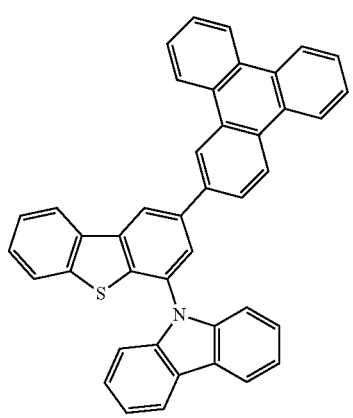
HS-61
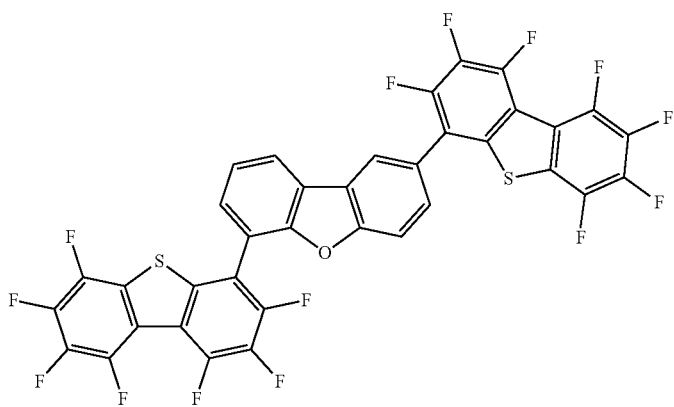

[Chem. 38]
HS-62
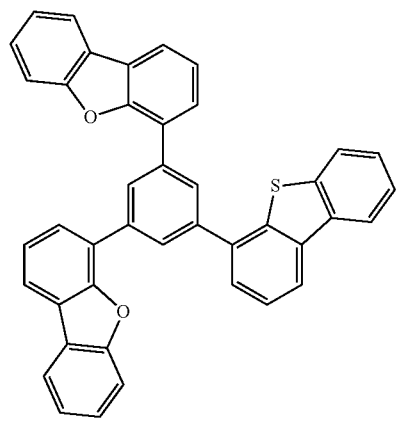
HS-63
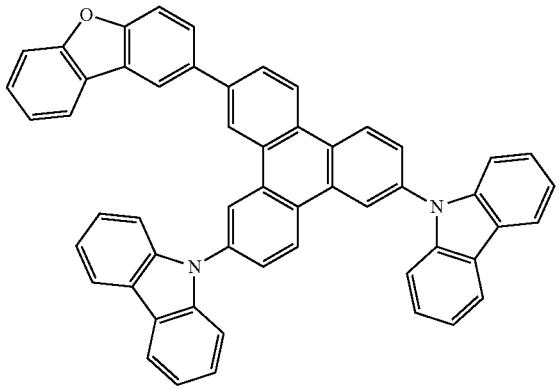
HS-64
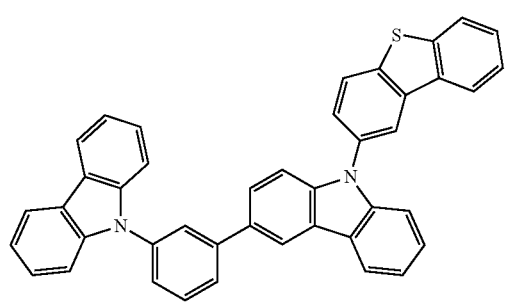
HS-65
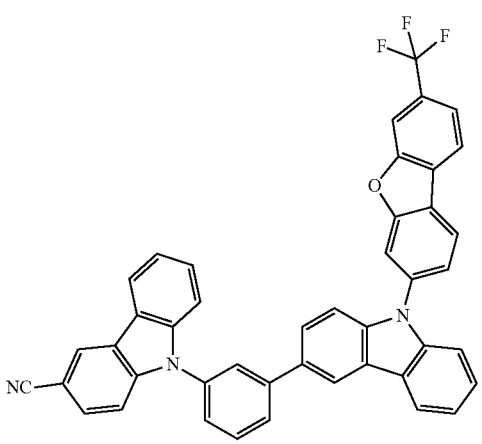
HS-66
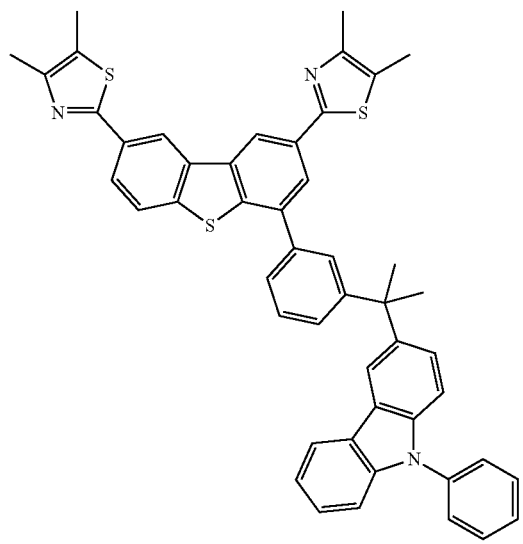
HS-67
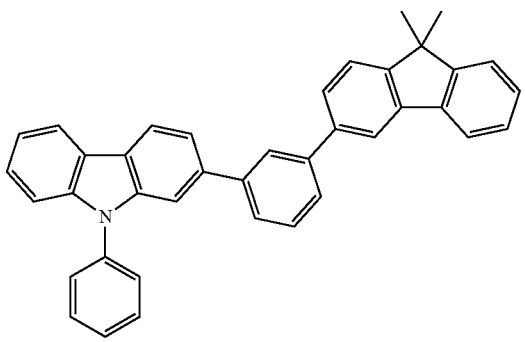

-continued
HS-68
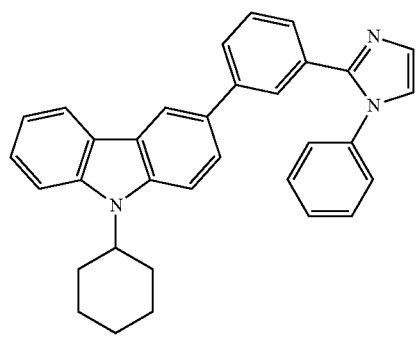
[Chem. 39]
HS-69
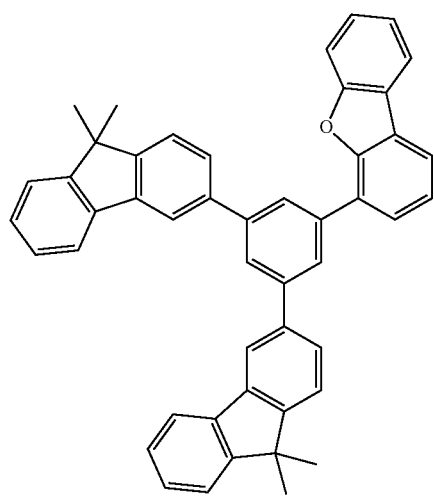
HS-70
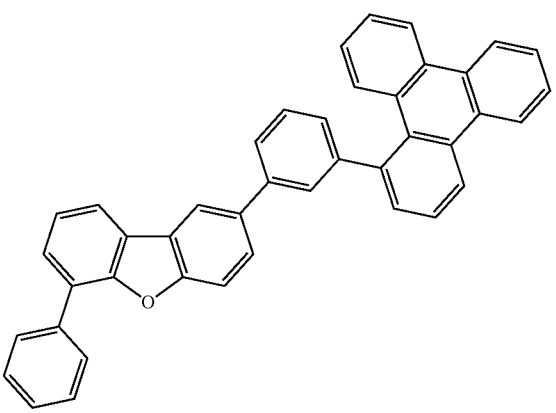
HS-71
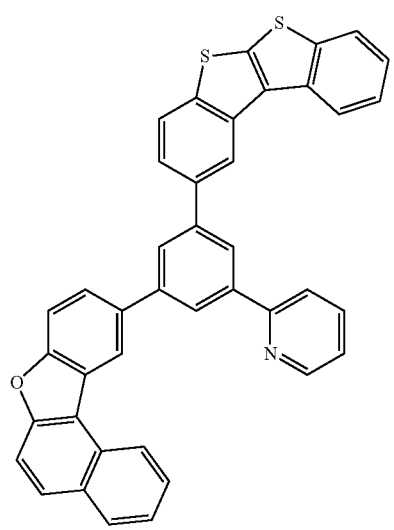
HS-72
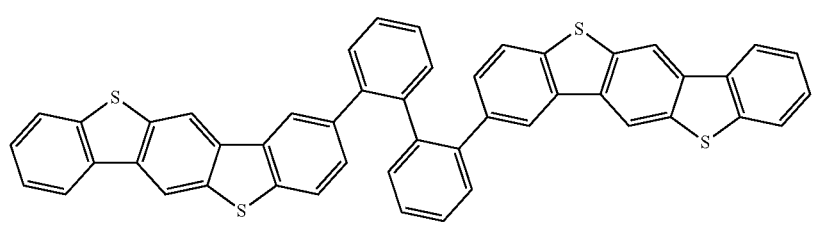

-continued
HS-73
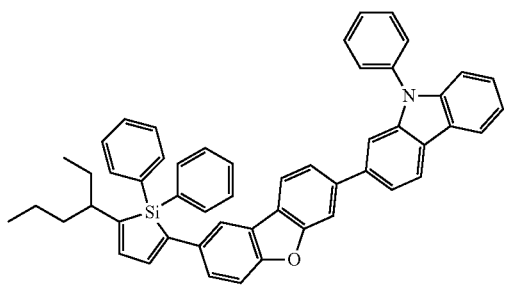
HS-74
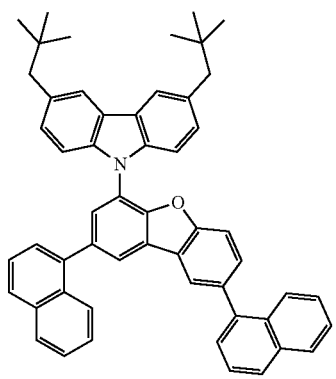
HS-75
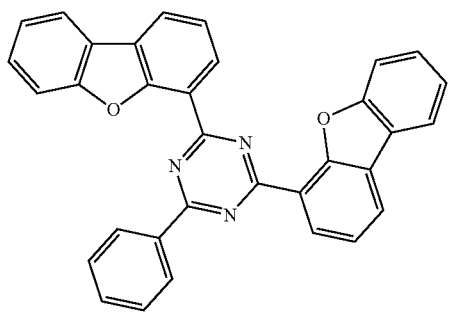
[Chem. 40]
HS-76
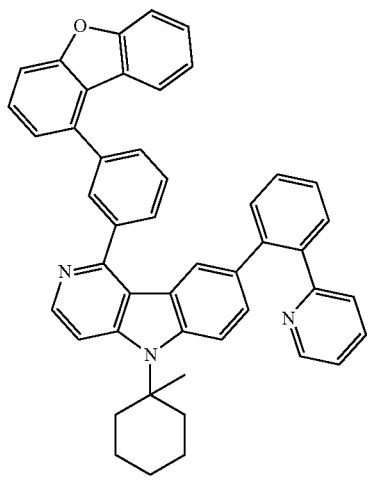
HS-77
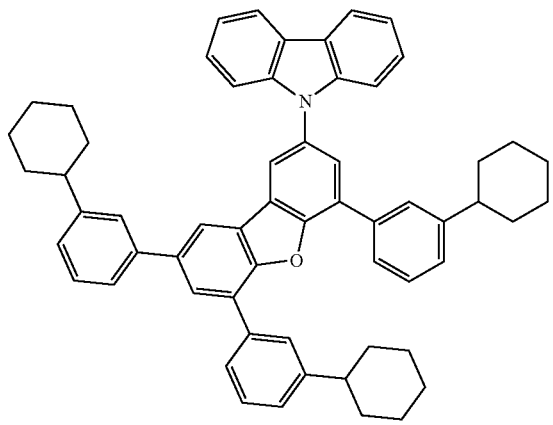

-continued
HS-78
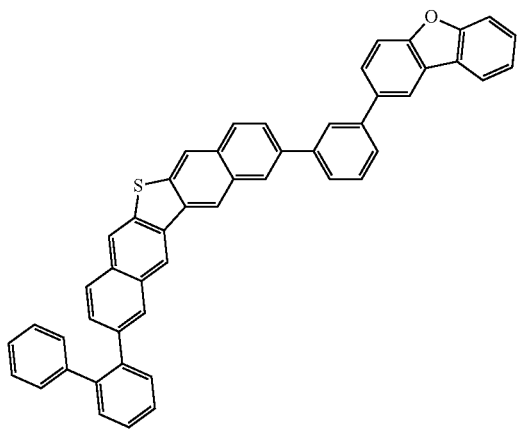
HS-79
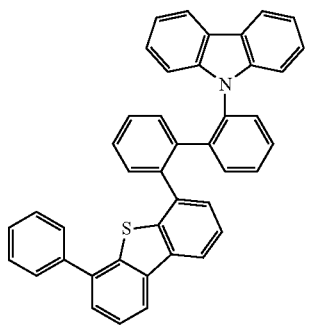
HS-80
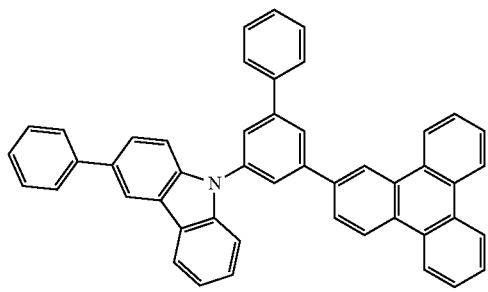
HS-81
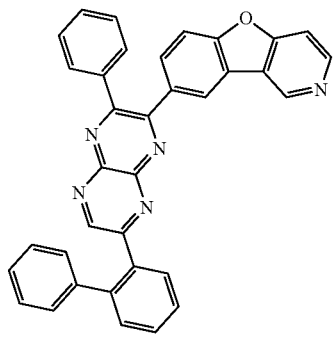
HS-82
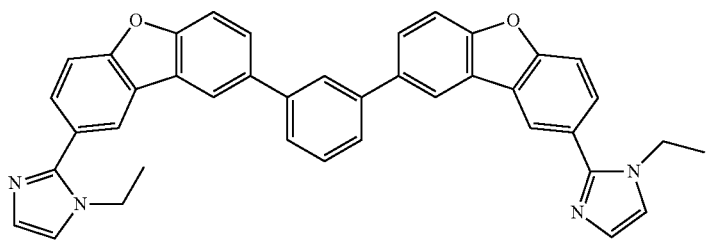
[Chem. 41]
HS-83
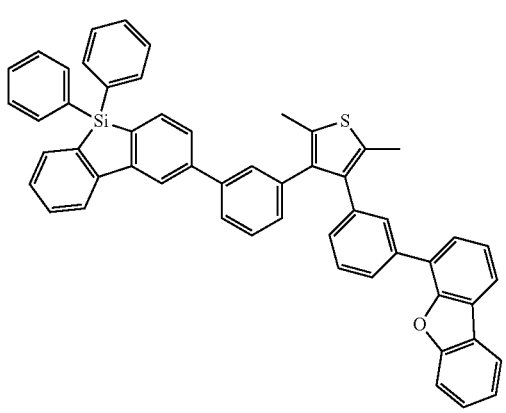
HS-84
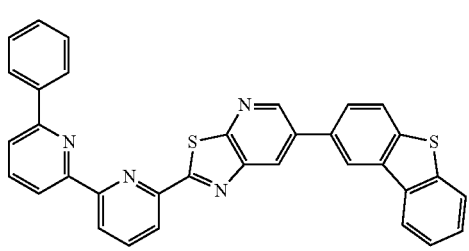

HS-85
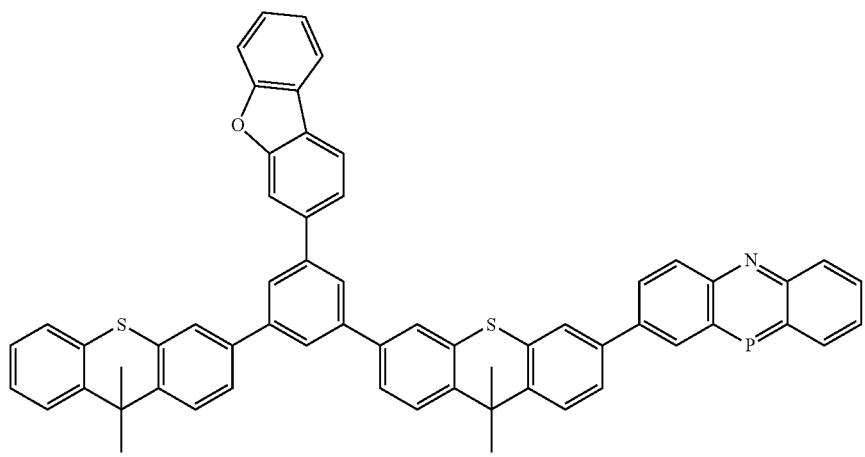
HS-86
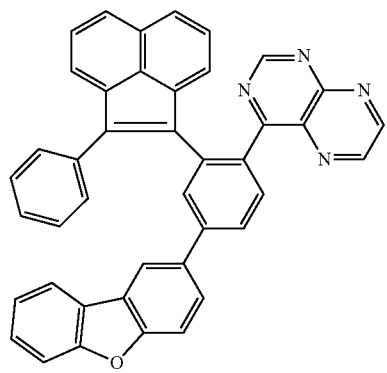
HS-87
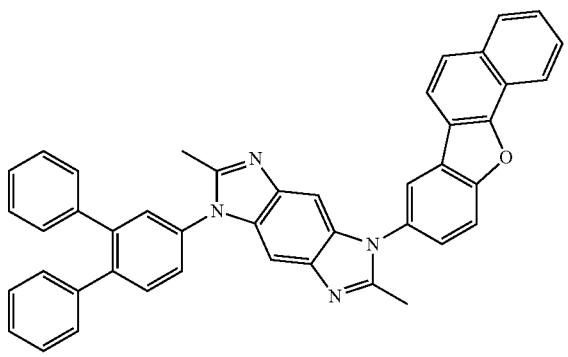
HS-88
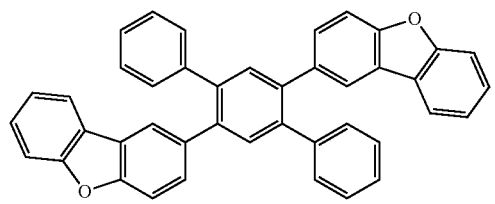
HS-89
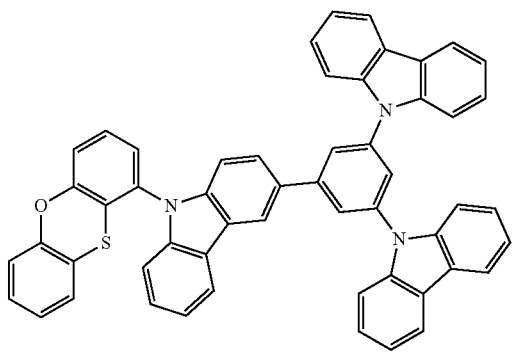

[Chem. 42]
HS-90
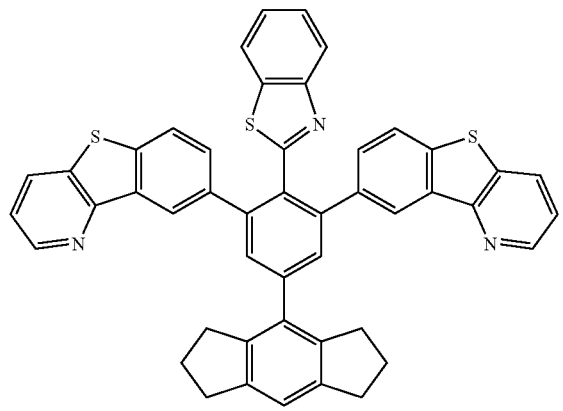
HS-91
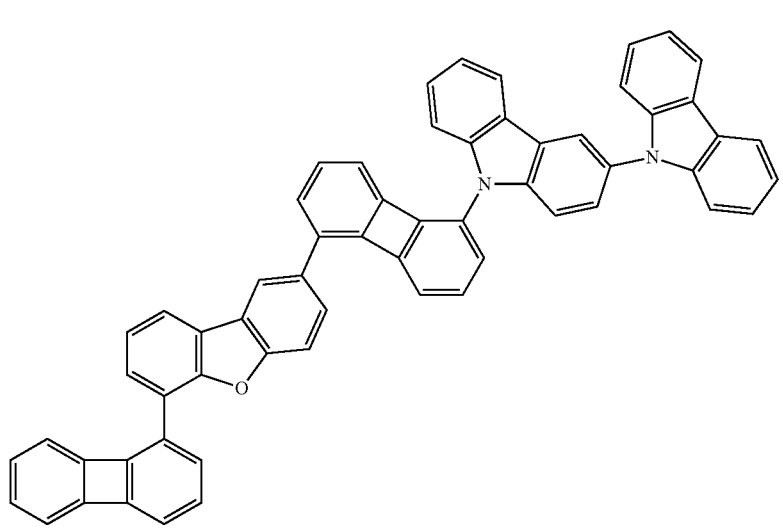
HS-92
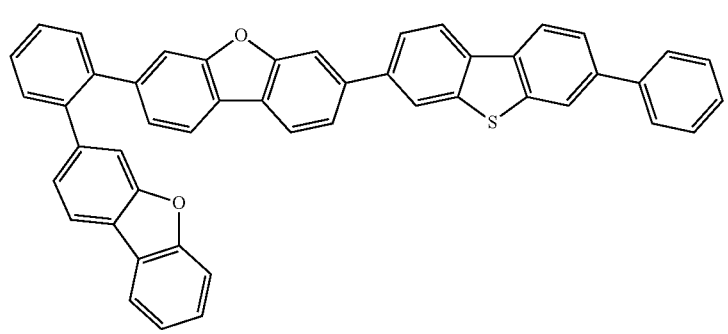
HS-93
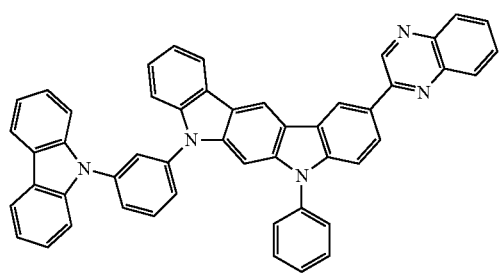
HS-94
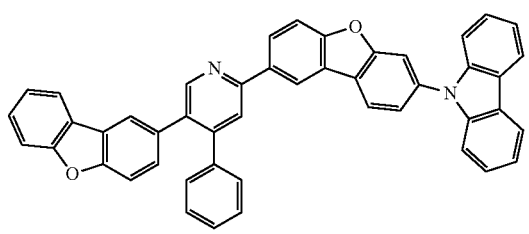

-continued
HS-95
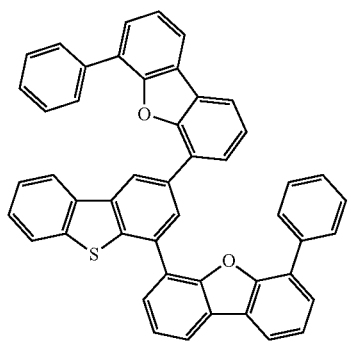
HS-96
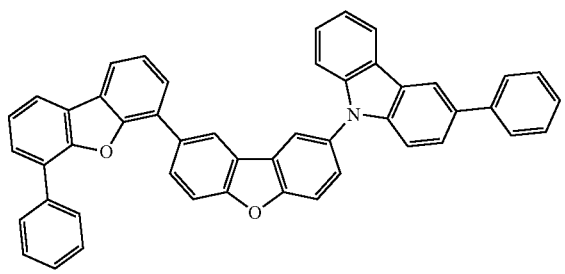
[Chem. 43]
HS-97
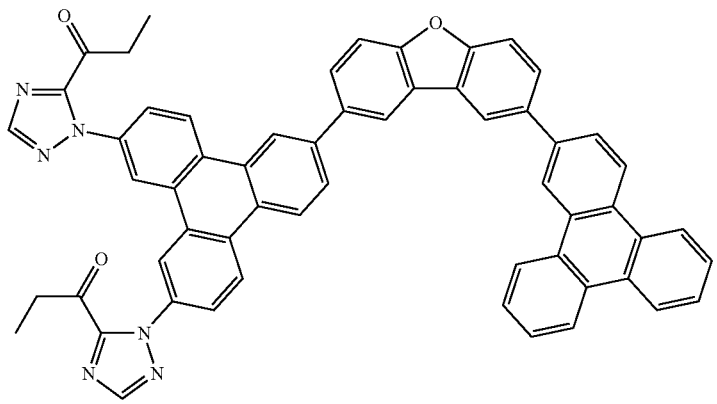
HS-98
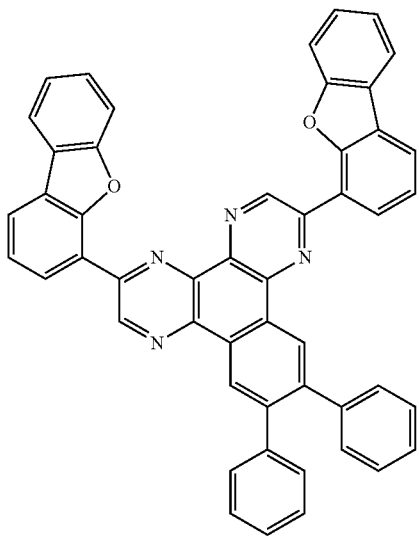
HS-99
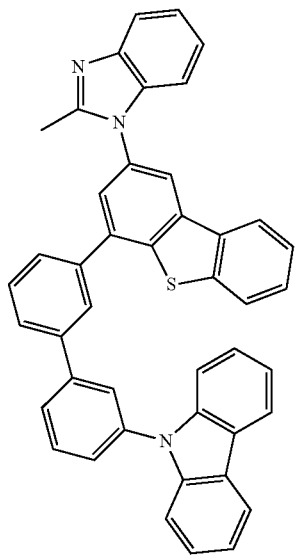

-continued
HS-100
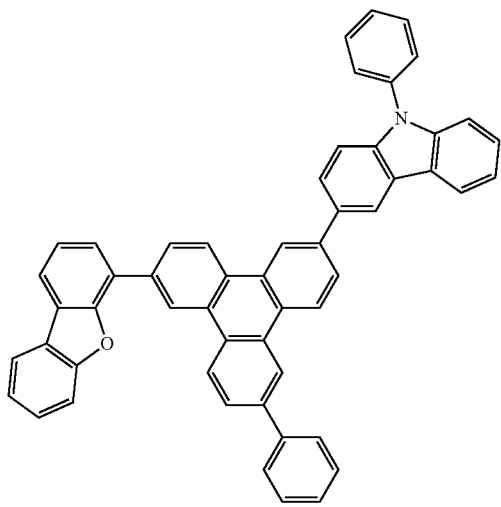
HS-101
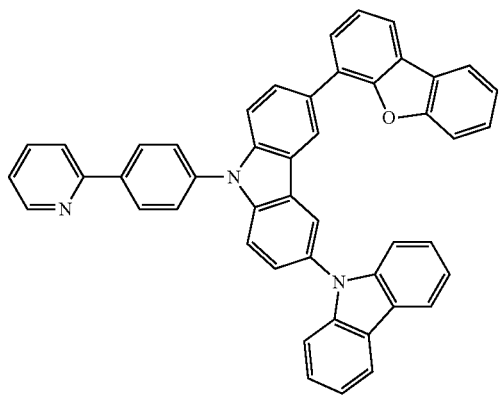
HS-102
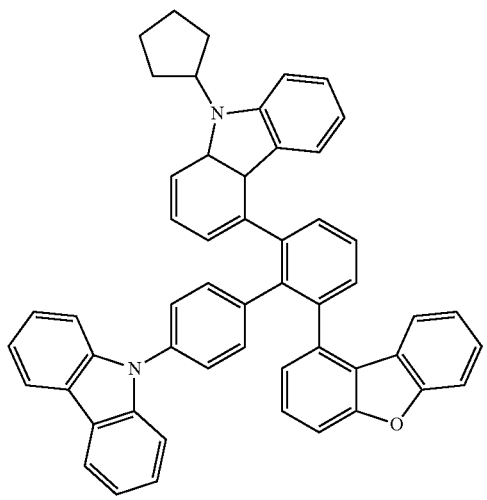
[Chem. 44]
HS-103
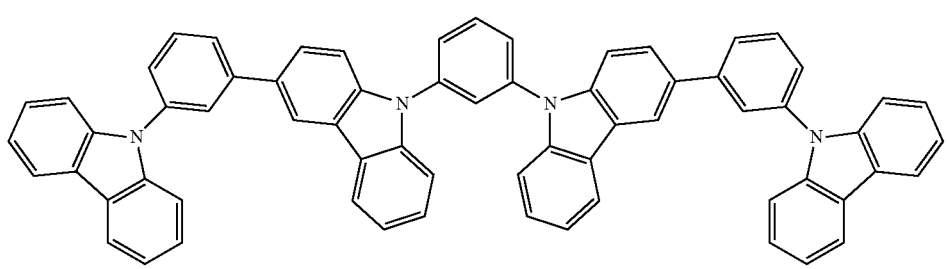
HS-104
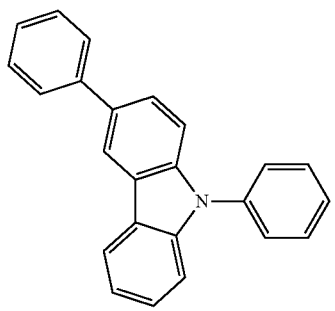
HS-105
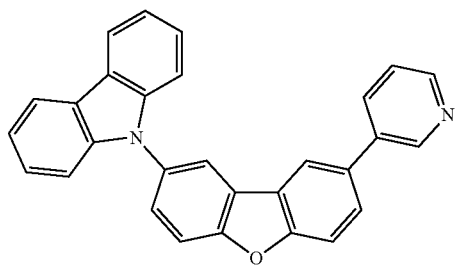

HS-106
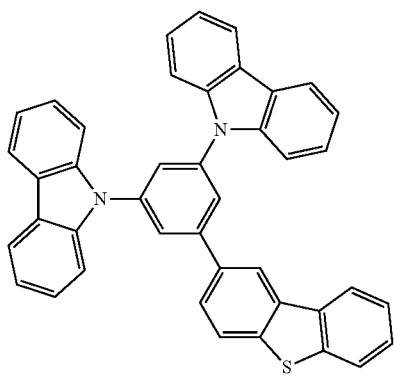
HS-107
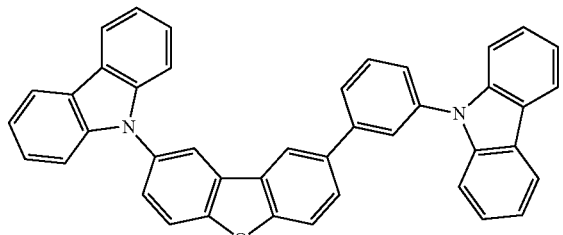
HS-108
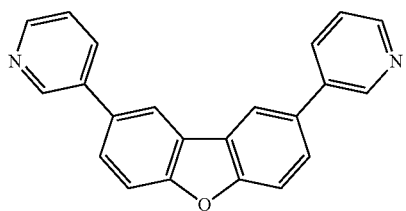
HS-109
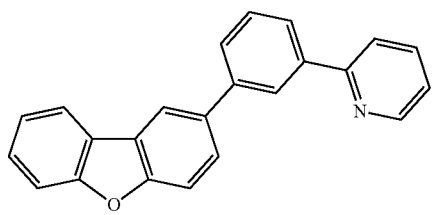
HS-110
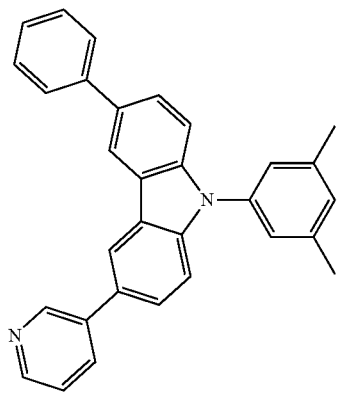
HS-111
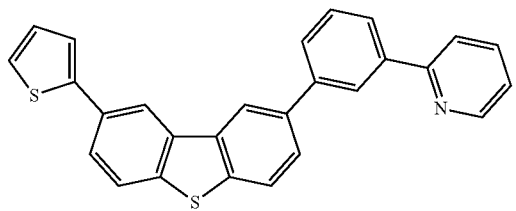
HS-112
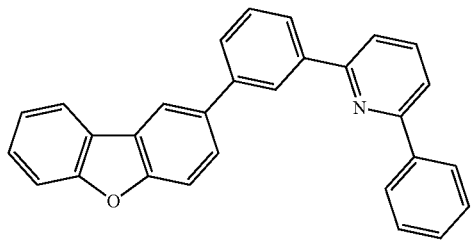

[Chem. 45]
HS-113
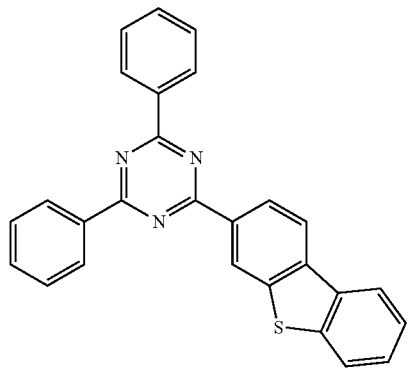
HS-114
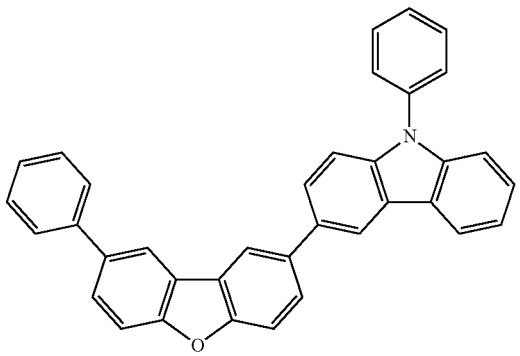
HS-115
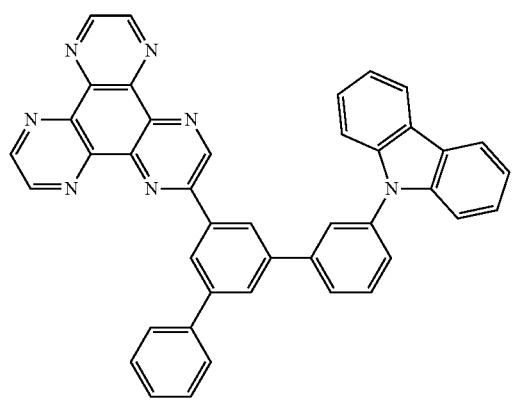
HS-116
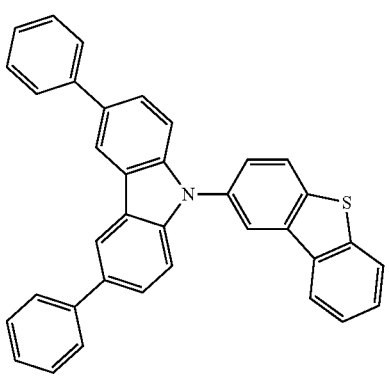
HS-117
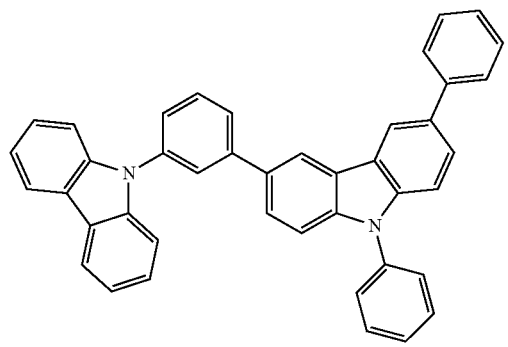
HS-118
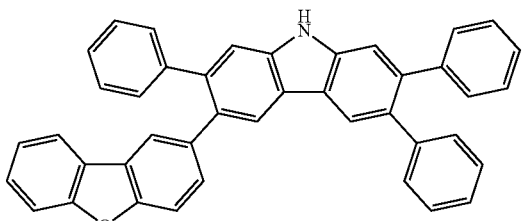
HS-119
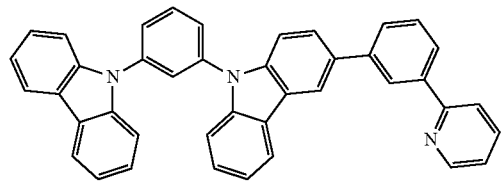
HS-120
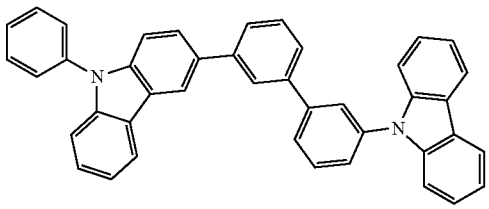

HS-121
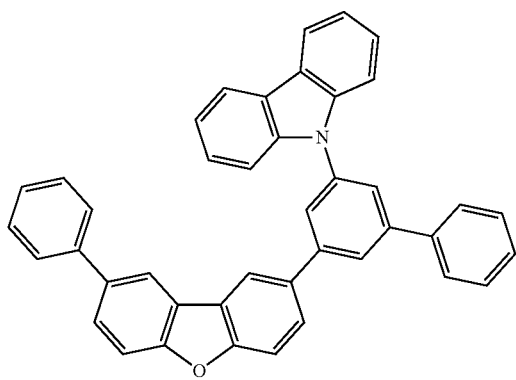
[Chem. 46]
HS-122
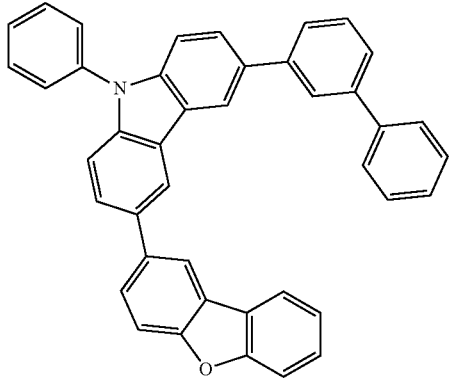
HS-123
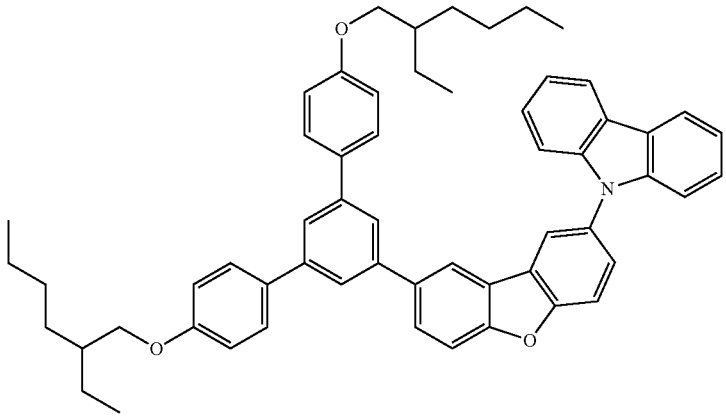
HS-124
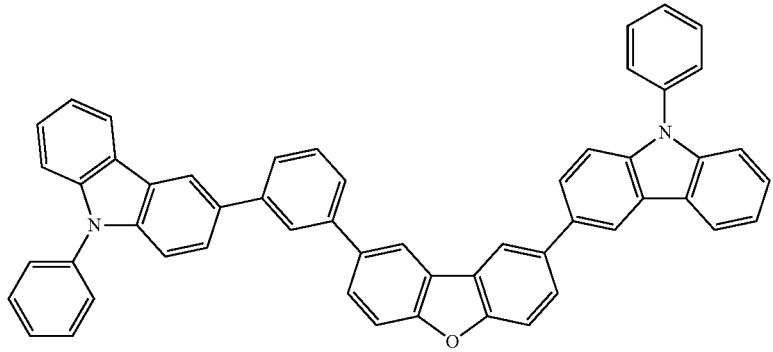

-continued
HS-125
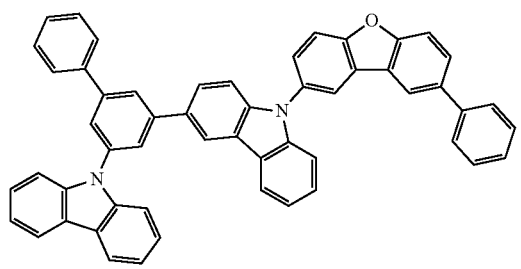
HS-126
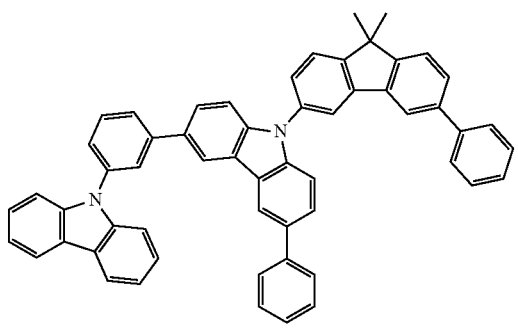
HS-127
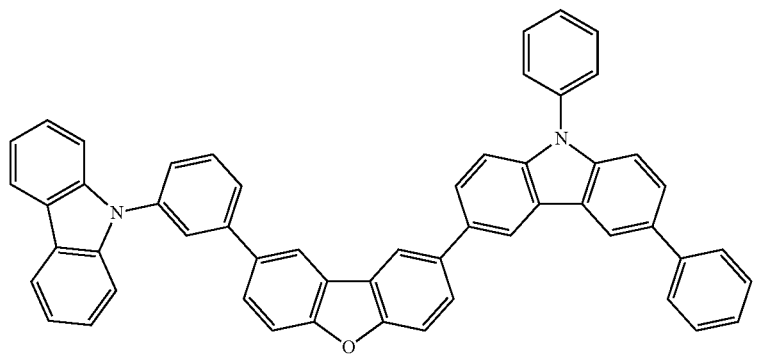
[Chem. 47]
HS-128
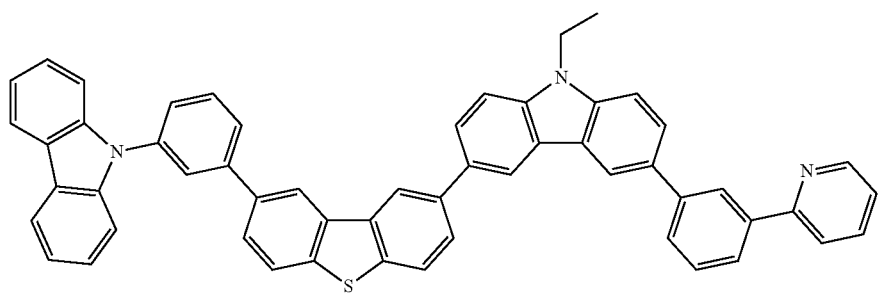
HS-129
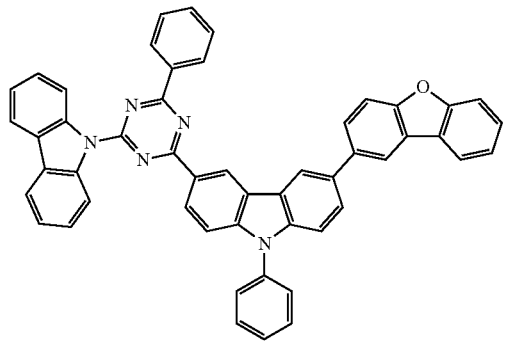
HS-130
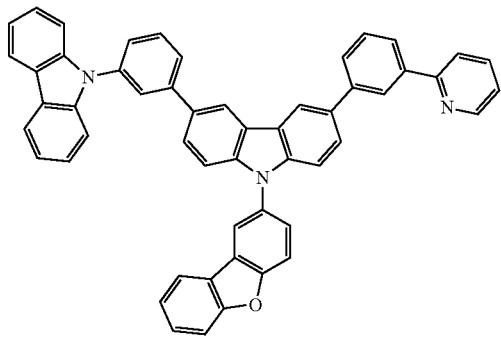

-continued
HS-131
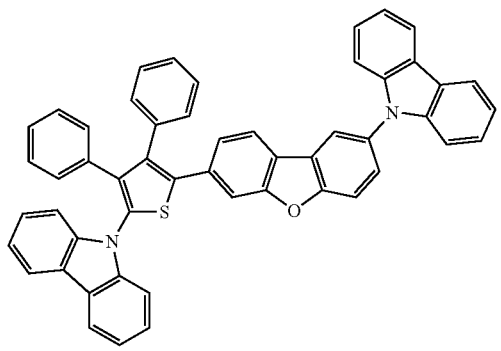
[Chem. 48]
HS-132
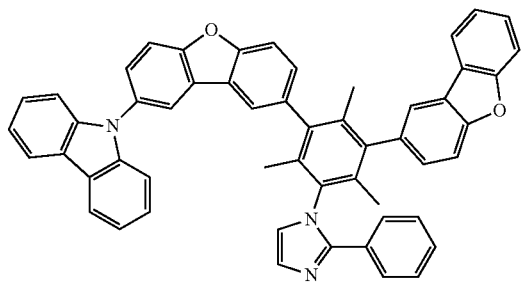
HS-133
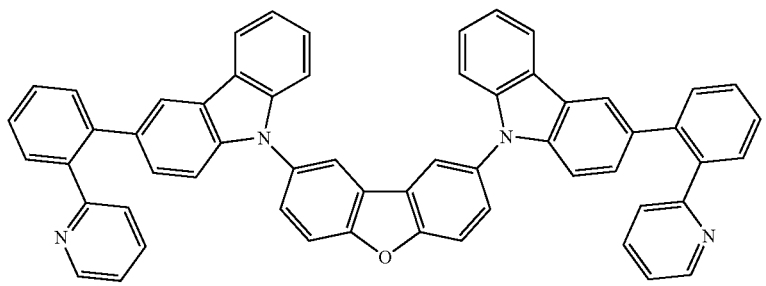
HS-134
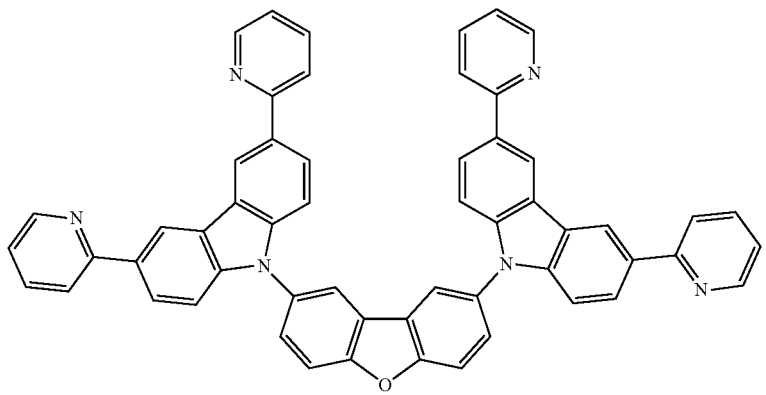
HS-135
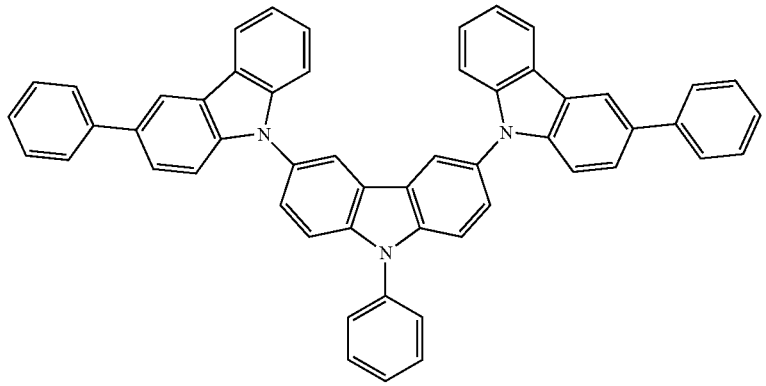

HS-136
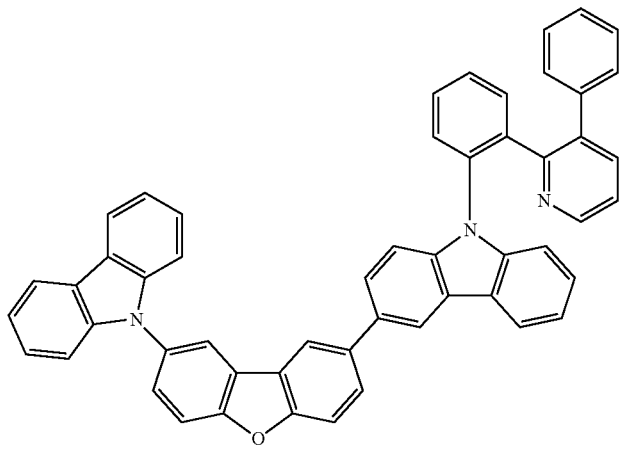
HS-137
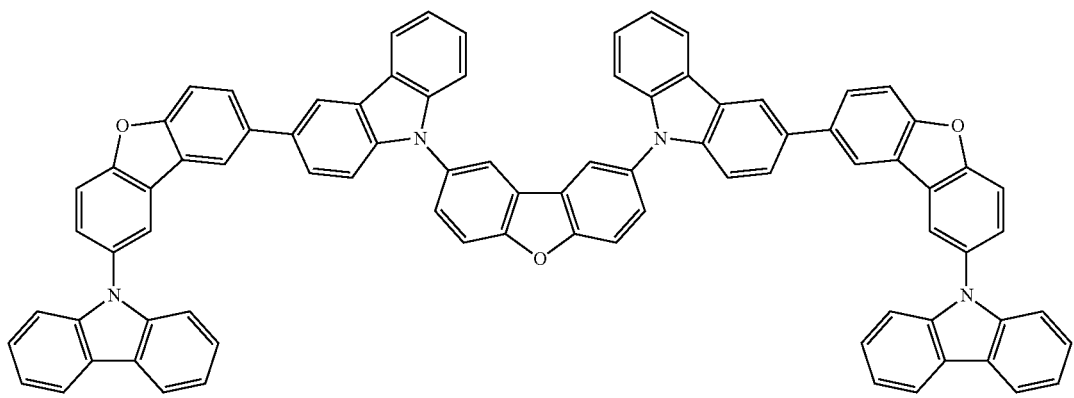
[Chem. 49]
HS-138
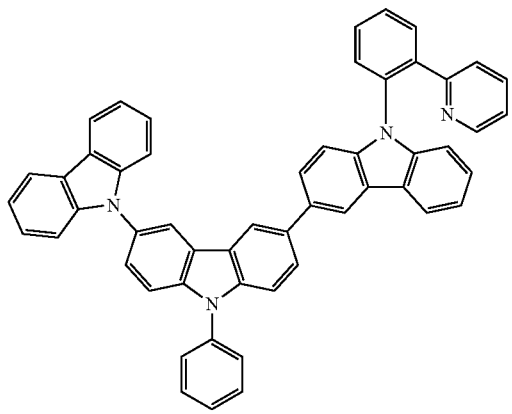
HS-139
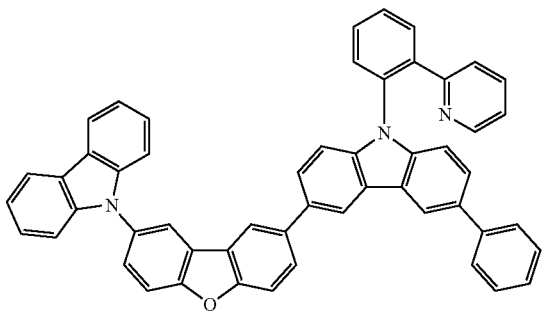
HS-140
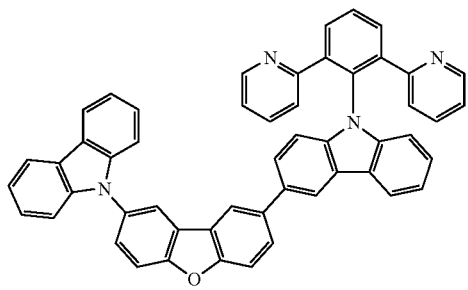
HS-141
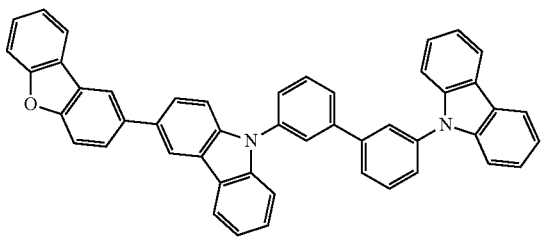

-continued
HS-142
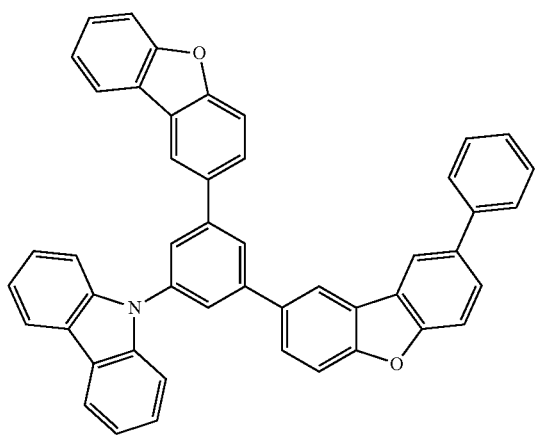
HS-143
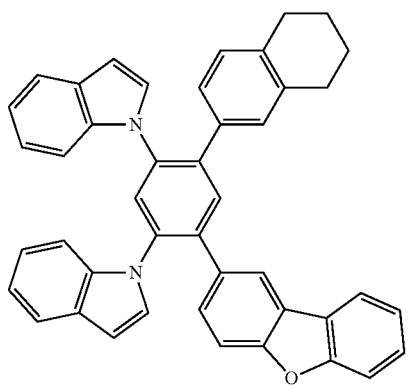
HS-144
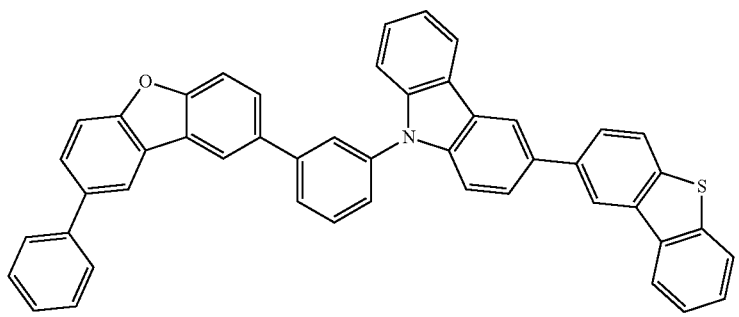
[Chem. 50]
HS-145
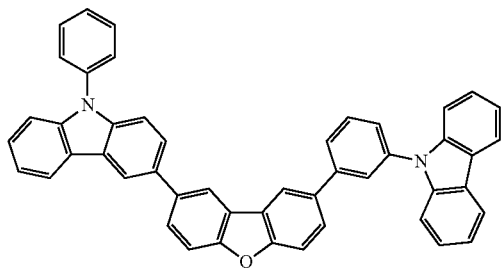
HS-146
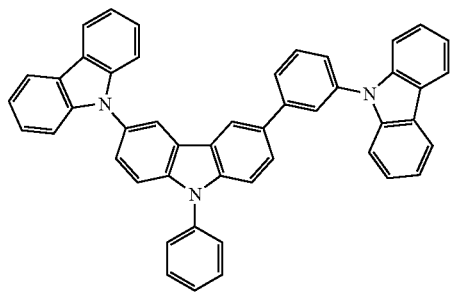
HS-147
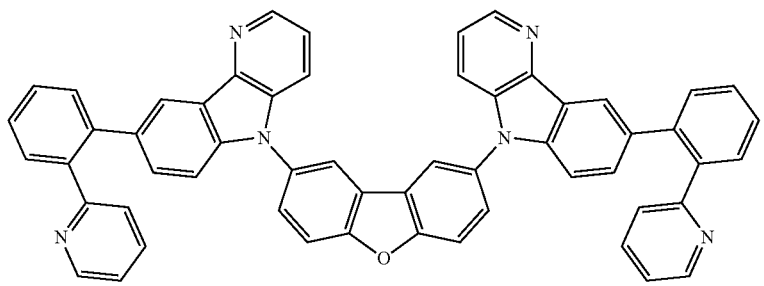

-continued
HS-148
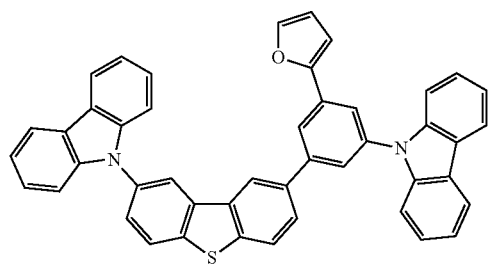
HS-149
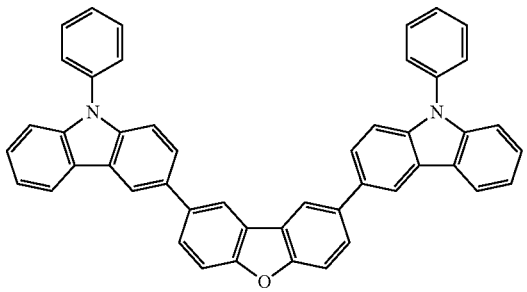
HS-150
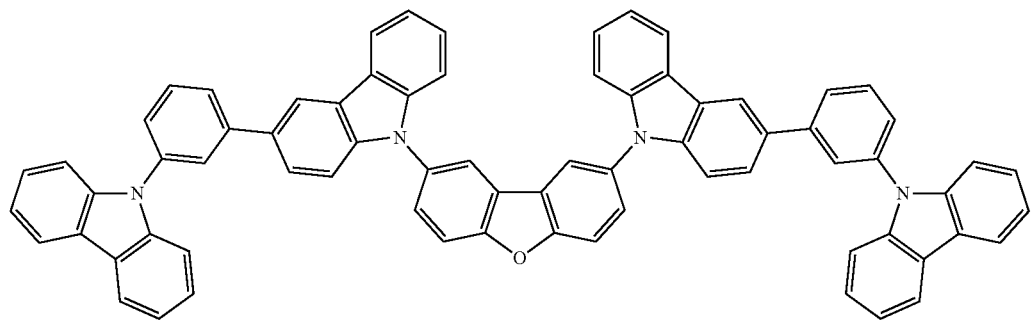
[Chem. 51]
HS-151
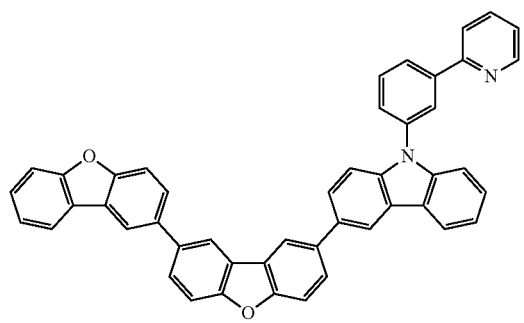
HS-152
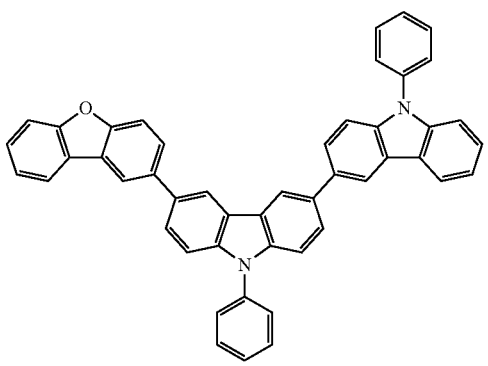
HS-153
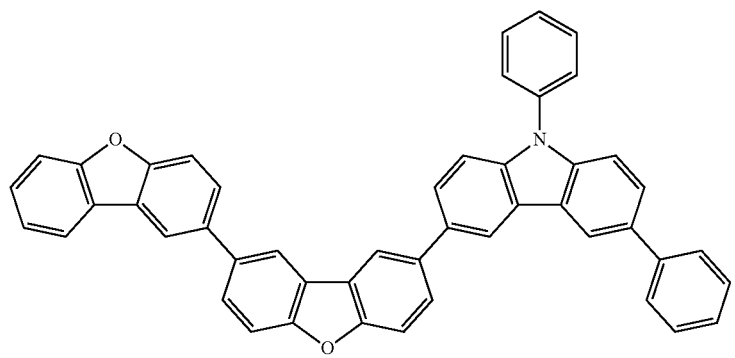

-continued
HS-154
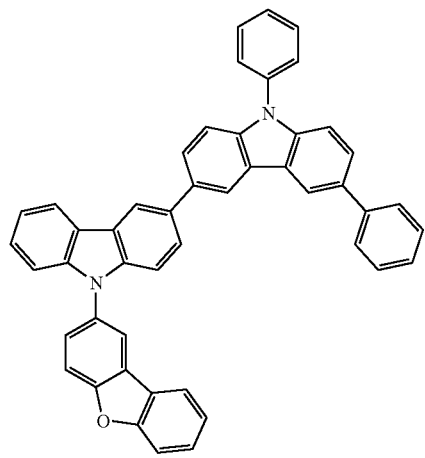
HS-155
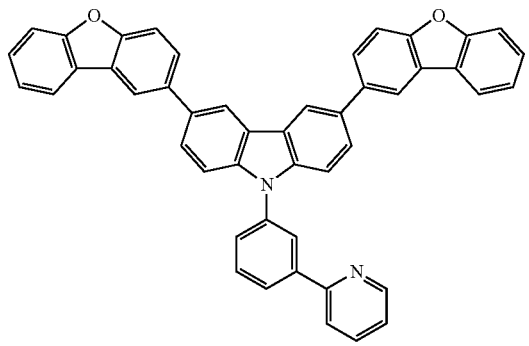
HS-156
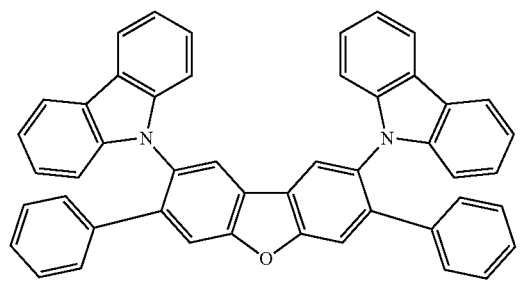
[Chem. 52]
HS-157
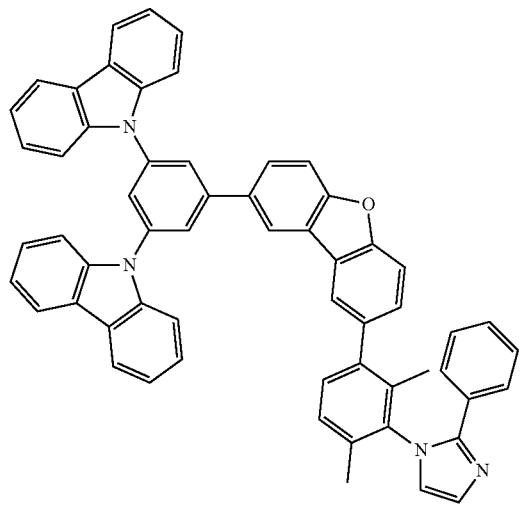
HS-158
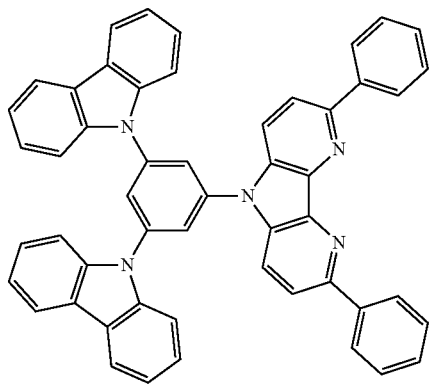

-continued
HS-159
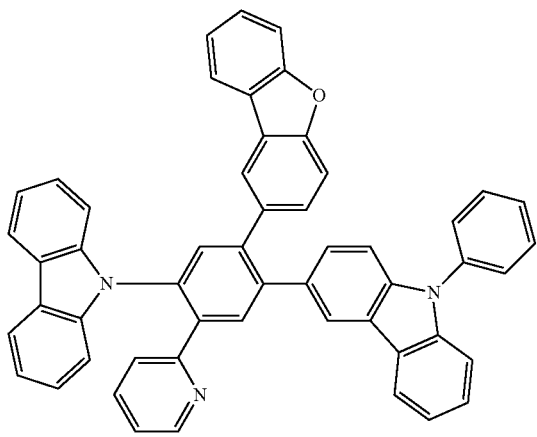
HS-160
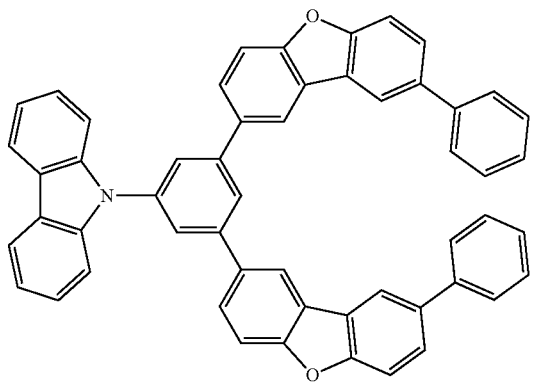
HS-161
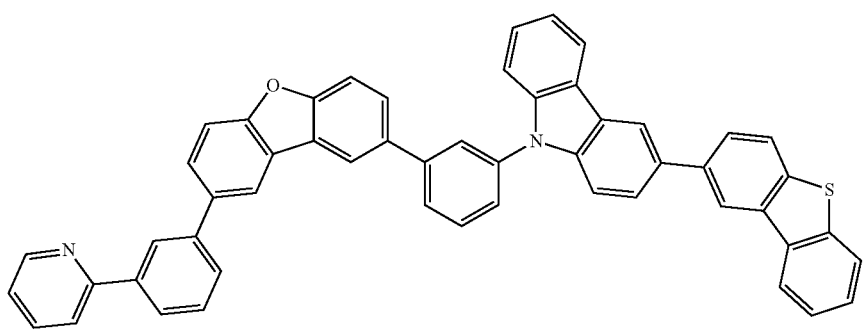
HS-162
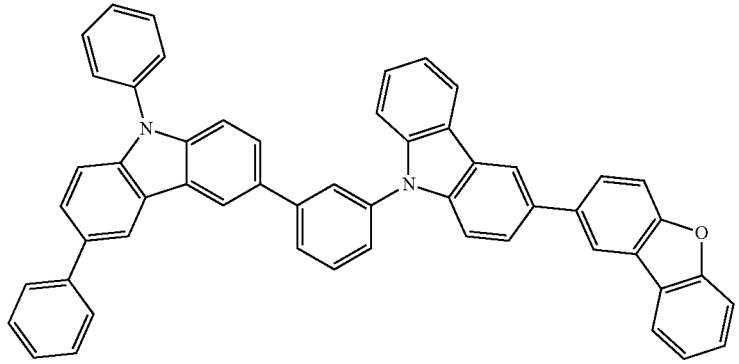
[Chem. 53]
HS-163
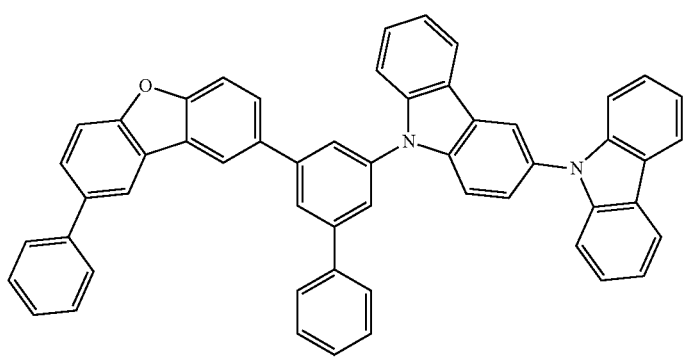

HS-164
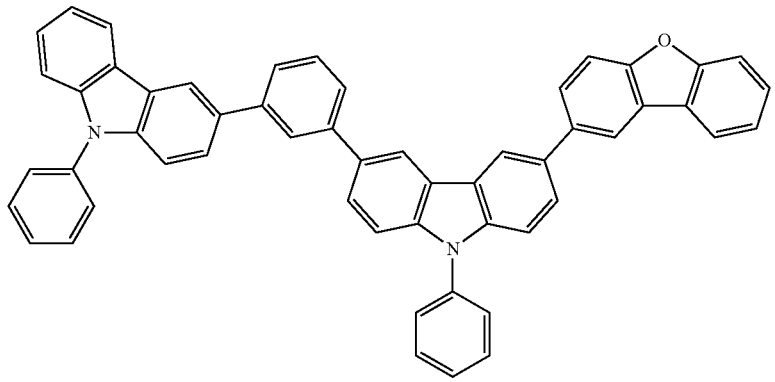
HS-165
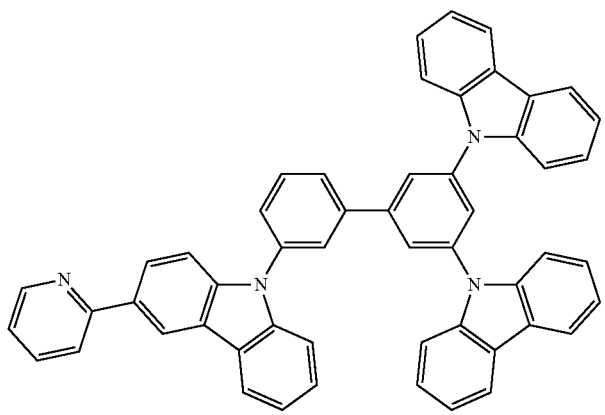
HS-166
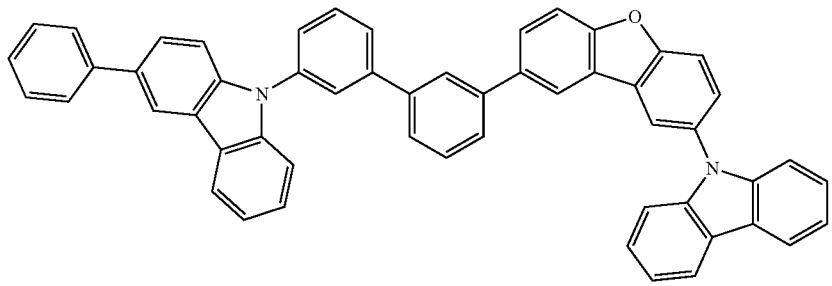
HS-167
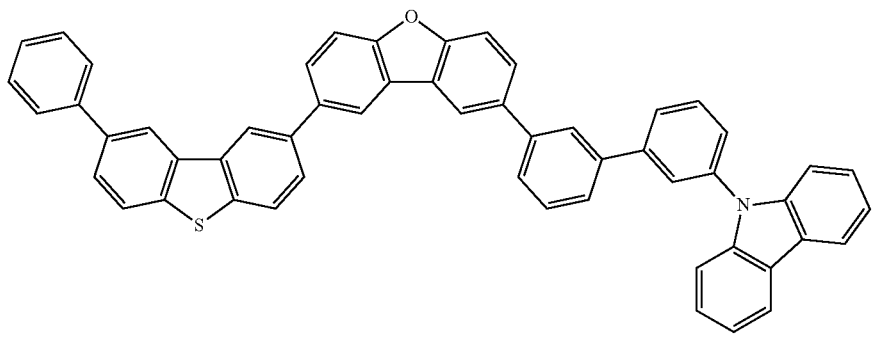

HS-168
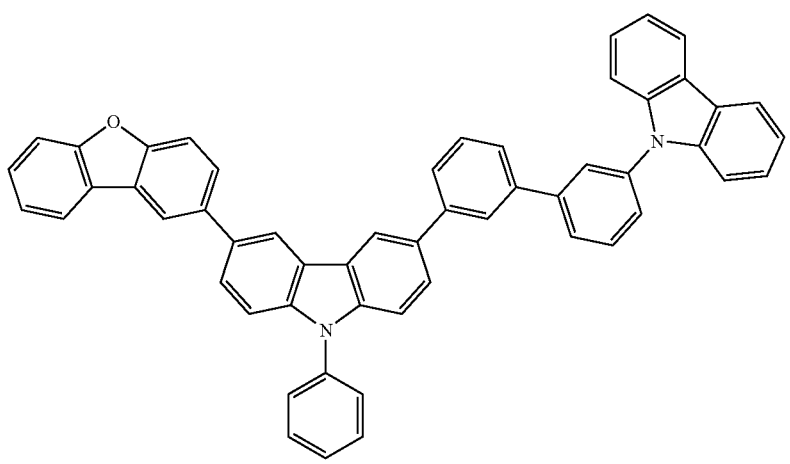
[Chem. 54]
HS-169
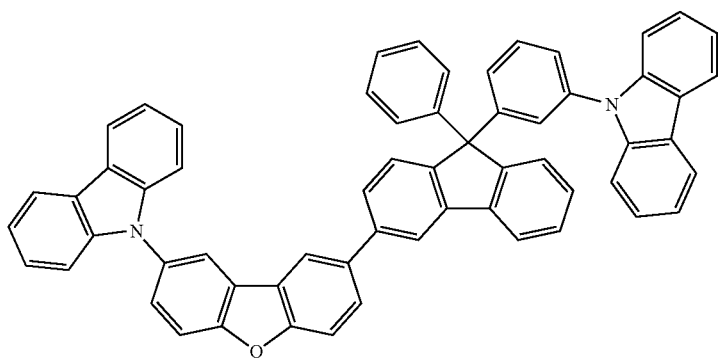
HS-170
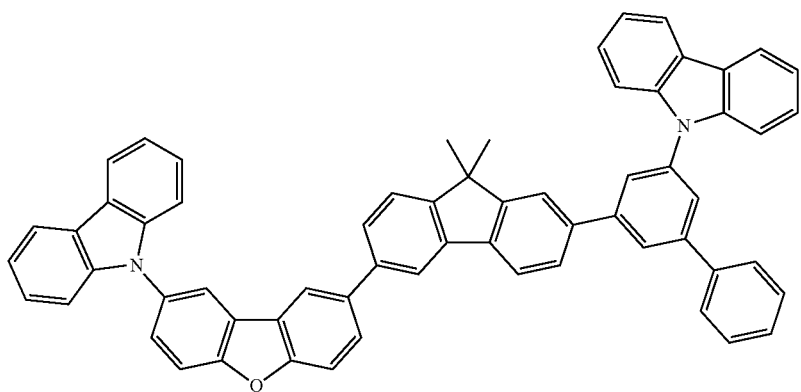

-continued
HS-171
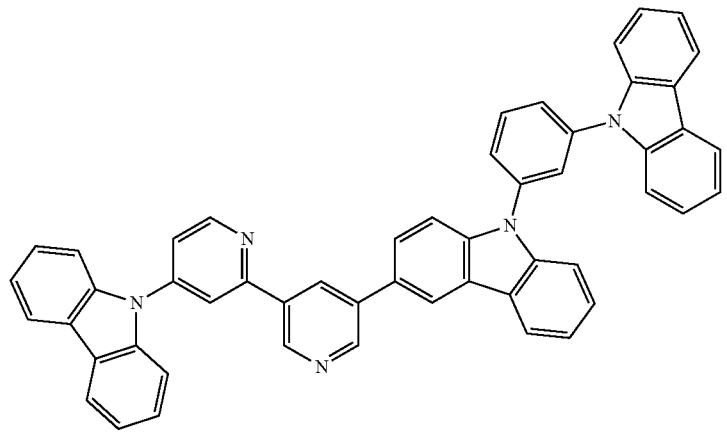
HS-172
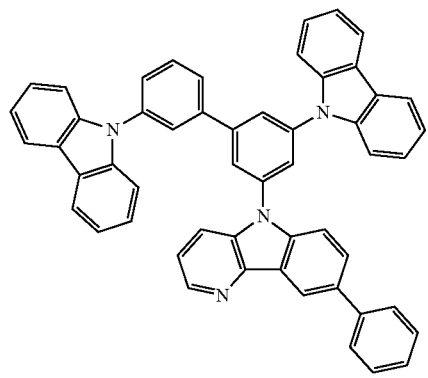
HS-173
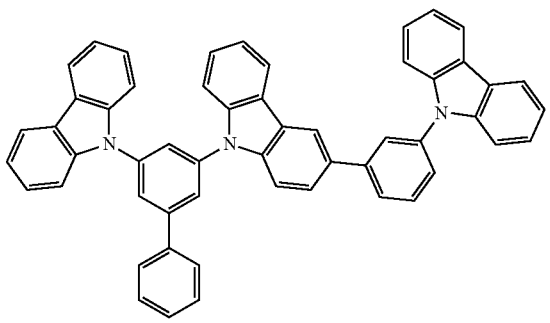
[Chem. 55]
HS-174
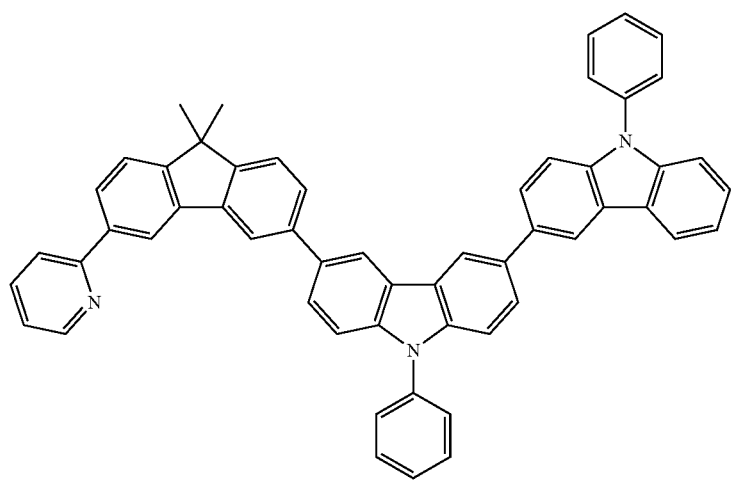

-continued
HS-175
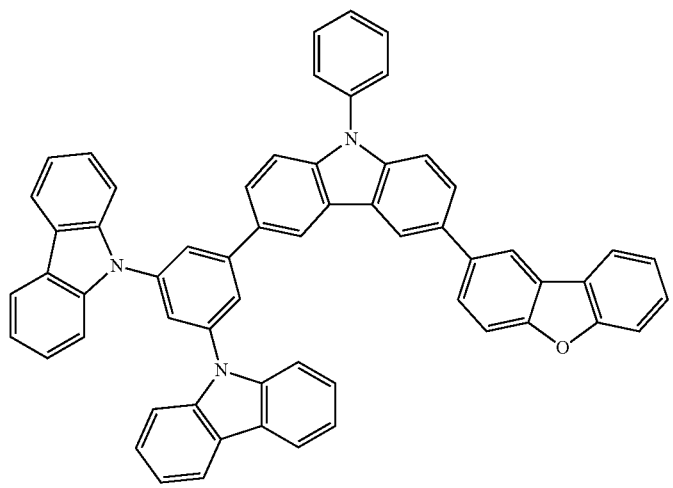
HS-176
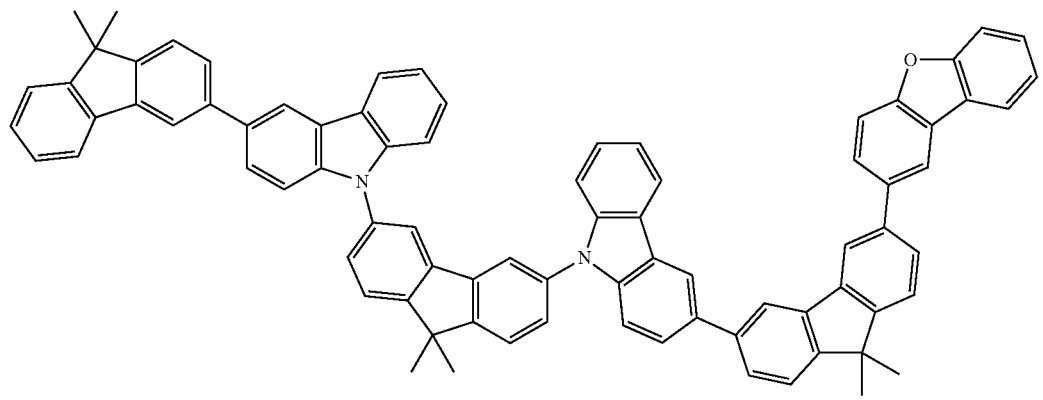
HS-177
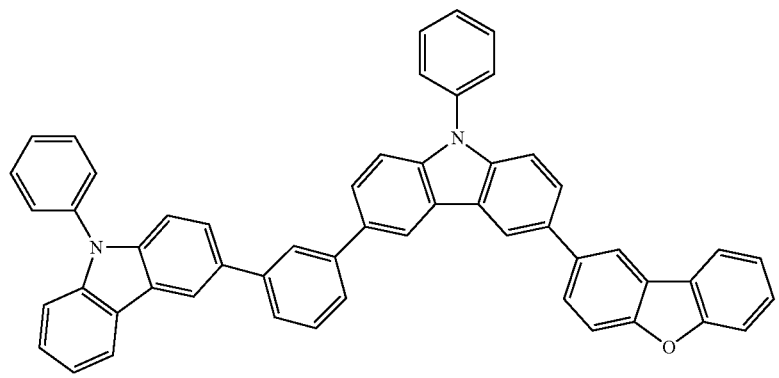
HS-178
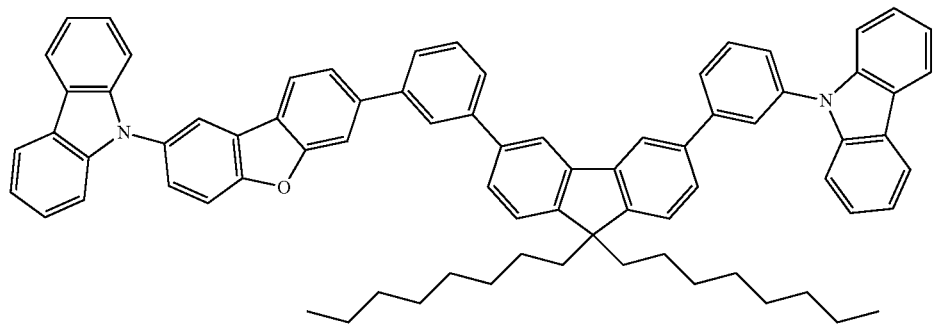

-continued
[Chem. 56]
HS-179
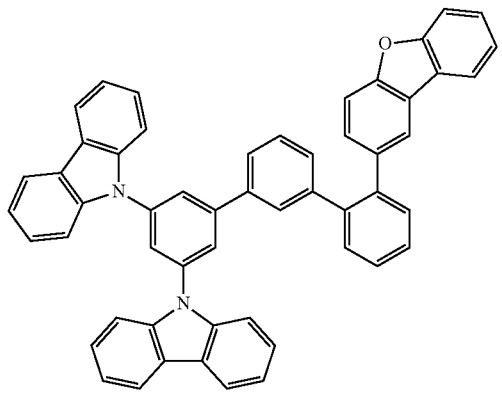
HS-180
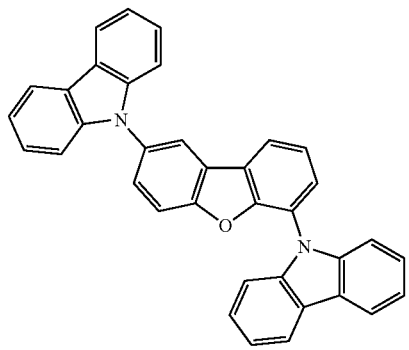
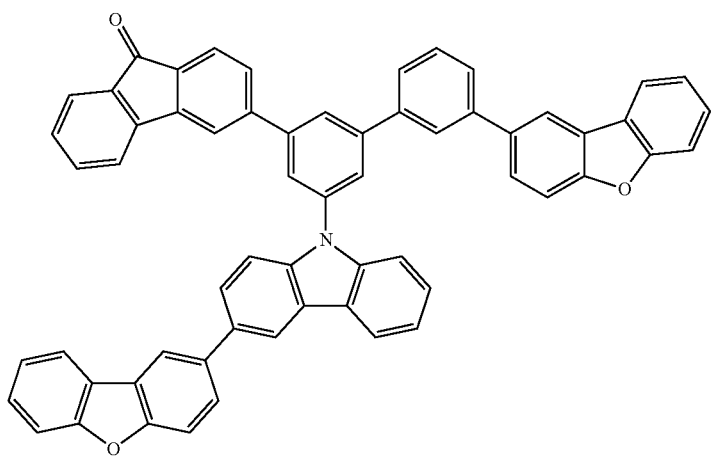
HS-181
HS-182
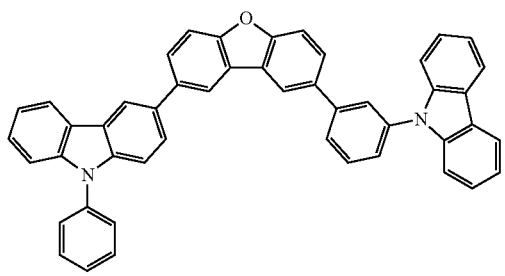
HS-183
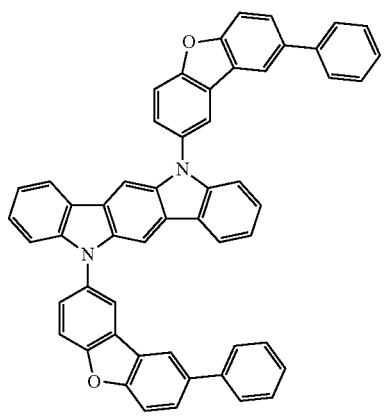

-continued
HS-184
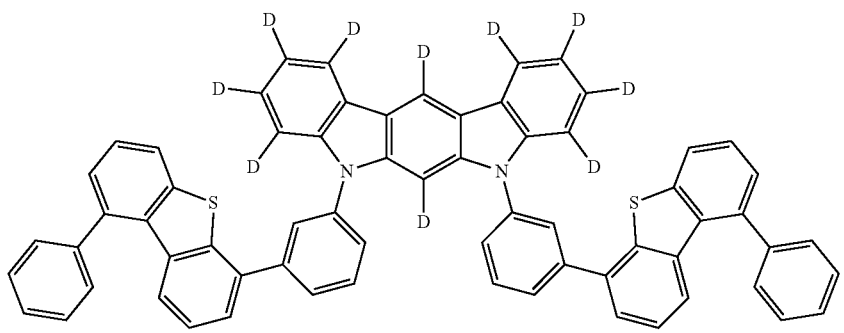
[Chem. 57]
HS-185
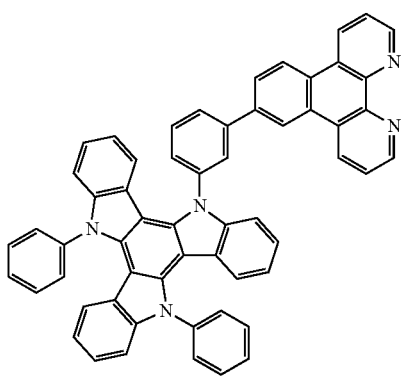
HS-186
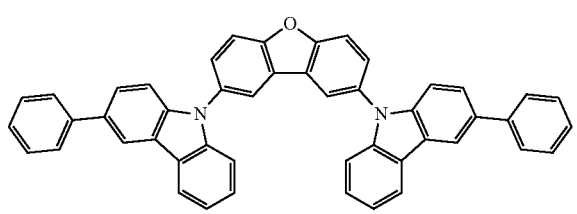
HS-187 HS-188
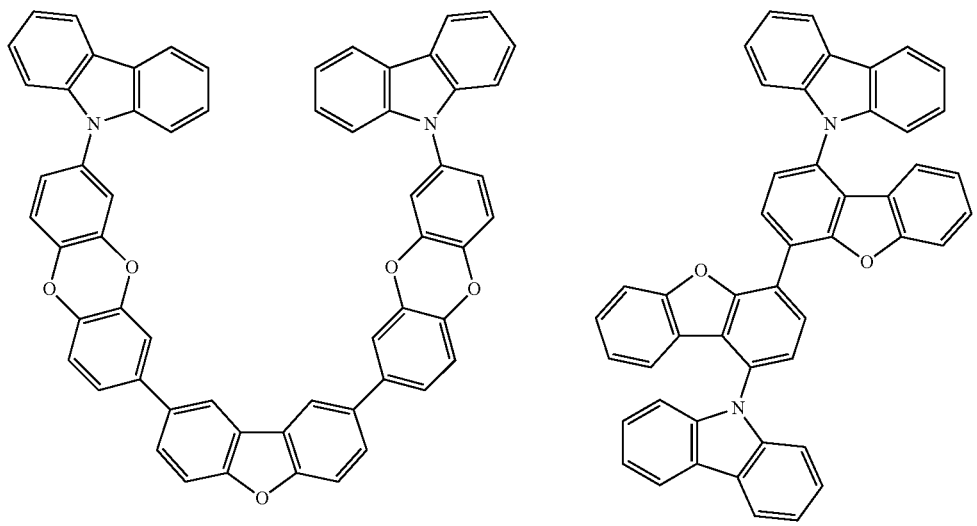

-continued
HS-189
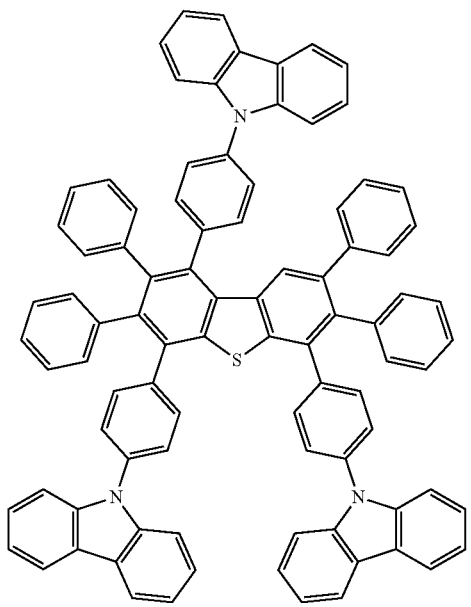
HS-190
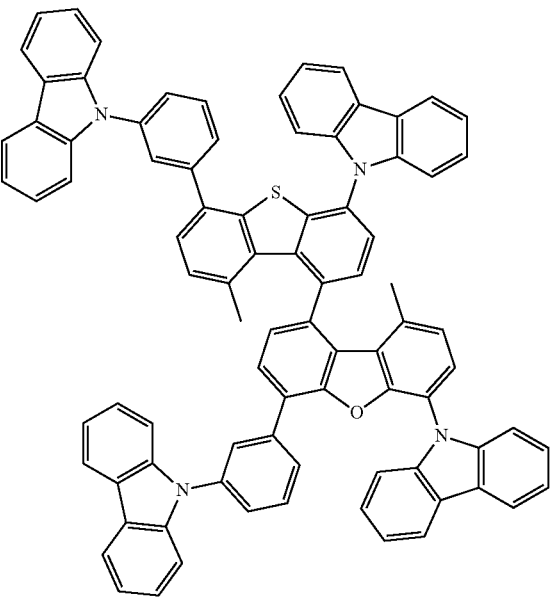
[Chem. 58]
HS-191
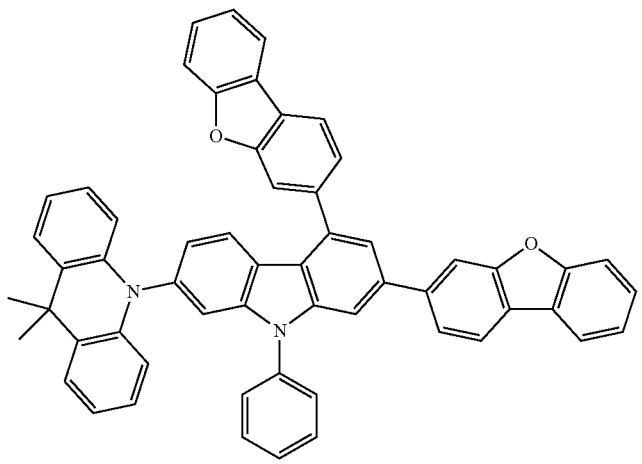
HS-192
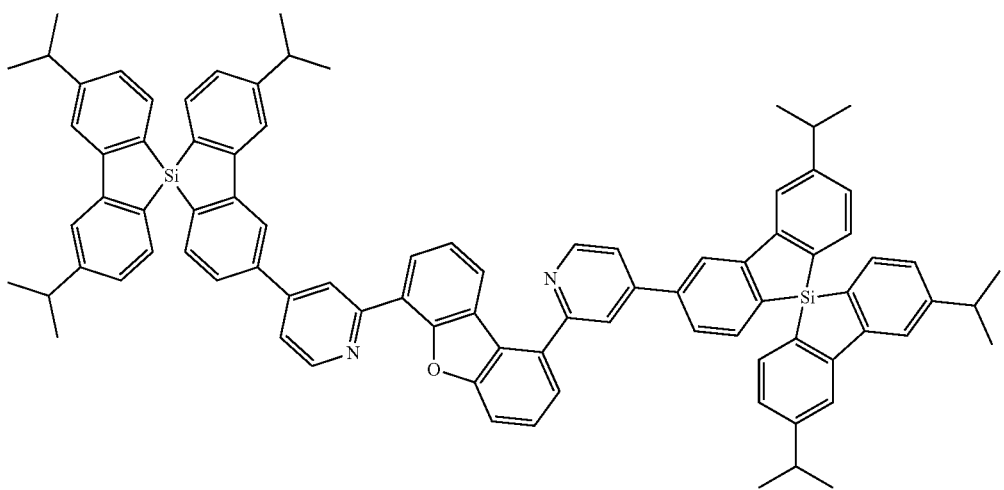

-continued

HS-193
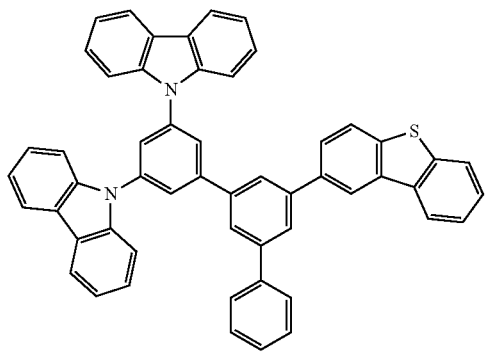

[Chem. 59]

HS-194
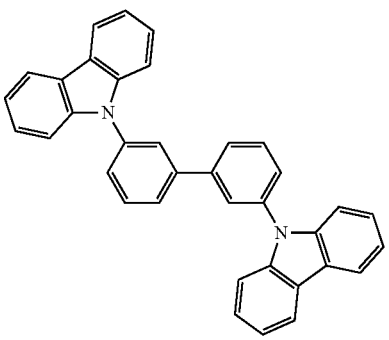

HS-195
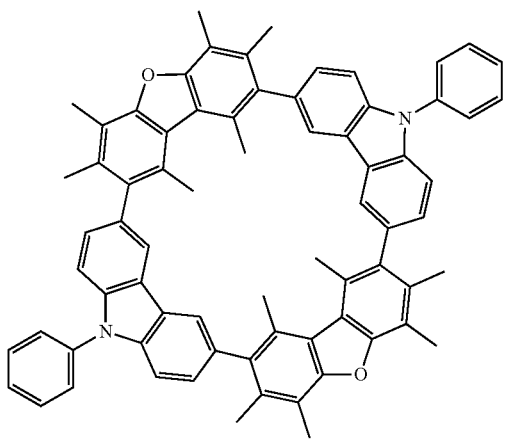

HS-196
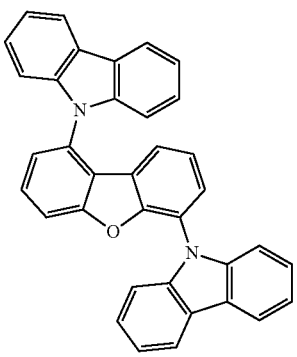

HS-197
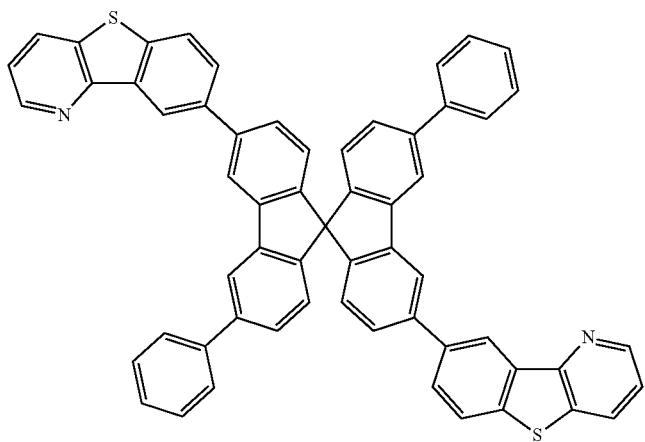

The host compound may be a mixture of a compound represented by Formula (3) and a known luminescent compound.

Examples of the known luminescent host include compounds described in the following patent documents:

For example, Japanese Patent Laid-Open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, 2002-308837, etc.

<<Injecting Layer>>

Injecting layers, i.e., an electron-injecting layer (cathode buffer layer) and a hole-injecting layer (anode buffer layer), are optionally disposed between the anode and the light-emitting layer or hole-transporting layer and between the cathode and the light-emitting layer or electron-transporting layer, respectively, as described above.

The injecting layer is provided between the electrode and an organic layer in order to reduce the driving voltage and to improve the luminance and is described in detail in "Denkyoku zairyo (Electrode material)", Div. 2 Chapter 2

(pp. 123-166) of "Yuki EL soshi to sono kogyoka saizensen (Organic EL element and its frontier of industrialization)" (published by NTS Corporation, Nov. 30, 1998). The injecting layer is a hole-injecting layer (anode buffer layer) or an electron-injecting layer (cathode buffer layer).

The anode buffer layer (hole-injecting layer) is also described in detail in Japanese Patent Laid-Open Nos. H09-45479, H09-260062, and H08-288069 for example, and examples thereof include phthalocyanine buffer layers, such as a copper phthalocyanine layer; oxide buffer layers, such as a vanadium oxide layer; amorphous carbon buffer layers; polymer buffer layers containing electroconductive polymers, such as polyaniline (emeraldine) or polythiophene; and ortho-metalated complex layers, such as a tris (2-phenylpyridine)iridium complex layer. In addition, azatriphenylene derivatives described in Japanese Publication of International Patent Application No. 2003-519432 or Japanese Patent Laid-Open No. 2006-135145 for example can be used as hole-injecting materials.

The cathode buffer layer (electron-injecting layer) is also described in detail in Japanese Patent Laid-Open Nos. H06-325871, H09-17574, and H10-74586 for example, and examples thereof include metal buffer layers, such as a strontium or aluminum layer; alkali metal compound buffer layers, such as a lithium fluoride, sodium fluoride, or potassium fluoride layer; alkali earth metal compound buffer layers, such as a magnesium fluoride layer; and oxide buffer layers, such as an aluminum oxide layer. The buffer layer (injecting layer) is desirably a significantly thin layer, and preferably has a thickness in a range of 0.1 nm to 5 µm depending on the material.

The materials contained in the anode buffer layer and the cathode buffer layer may be used together with other materials and may be used by, for example, being mixed into the hole-transporting layer or the electron-transporting layer.

<<Hole-Transporting Layer>>

The hole-transporting layer is composed of a hole-transporting material having hole transportability. The hole-injecting layer and the electron-blocking layer are also categorized into the hole-transporting layer in a broad sense. The hole-transporting layer may have a monolayer or multilayer structure.

The hole-transporting material has a hole injectability or transportability or an electron blockability and may be either an organic material or an inorganic material. Examples of the hole-transporting material include triazole derivatives, oxadiazole derivatives, imidazole derivatives, polyarylalkane derivatives, pyrazoline derivatives, pyrazolone derivatives, phenylenediamine derivatives, arylamine derivatives, amino substituted chalcone derivatives, oxazole derivatives, styryl anthracene derivatives, fluorenone derivatives, hydrazone derivatives, stilbene derivatives, silazane derivatives, aniline copolymers, and electroconductive polymers/oligomers, particularly thiophene oligomers. Azatriphenylene derivatives, such as those described in Japanese Publication of International Patent Application No. 2003-519432 or Japanese Patent Laid-Open No. 2006-135145 for example can also be used as the hole-transporting materials.

The hole-transporting material in an embodiment of the present invention can be a compound represented by Formula (3).

The usable hole-transporting materials include compounds represented by Formula (3) and also include porphyrin compounds, aromatic tertiary amine compounds, and styrylamine compounds. In particular, aromatic tertiary amine compound can be used.

Typical examples of the aromatic tertiary amine compound and the styrylamine compound include N,N,N',N'-tetraphenyl-4,4'-diaminophenyl, N,N'-diphenyl-N,N'-bis(3-methylphenyl)-(1,1'-biphenyl)-4,4'-diamine (abbreviation: TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds having two condensed aromatic rings in the molecule, described in U.S. Pat. No. 5,061,569, such as 4,4'-bis[N-(1-naphthyl)-N-phenylamino]biphenyl (abbreviation: NPD), and compounds described in Japanese Patent Laid-Open No. H04-308688, such as 4,4',4''-tris[N-(3-methylphenyl)-N-phenylamino]triphenylamine (abbreviation: MTDATA) in which three triphenylamine units are bonded into a starburst form.

Polymer materials having the compounds mentioned above introduced into their chains or having the compounds mentioned above as main chains can also be used. Inorganic compounds such as p-type Si and p-type SiC can also be used as the hole-injecting material or the hole-transporting material. Cyclo-metalated complexes and ortho-metalated complexes, such as copper phthalocyanine and tris(2-phenylpyridine)iridium complexes, can also be used as the hole-transporting material.

So-called p-type hole-transporting materials as described in Japanese Patent Laid-Open No. H11-251067 or in J. Huang, et al., (Applied Physics Letters, 80 (2002), p. 139) can also be used. In the present invention, these materials can provide highly efficient light-emitting elements and, therefore, are preferably used.

The hole-transporting layer can be formed in the form of a thin film prepared from the hole-transporting material by a known method such as vacuum deposition, spin coating, casting, printing including ink jetting, or Langmuir Blodgett method (LB deposition).

The hole-transporting layer may have any thickness, which is usually about 5 nm to 5 µm and preferably 5 to 200 nm. The hole-transporting layer may have a monolayer structure composed of one or more of the materials mentioned above.

A hole-transporting layer having high p-type properties doped with an impurity can also be used. Examples thereof include those described in, for example, Japanese Patent Laid-Open Nos. H04-297076, 2000-196140, and 2001-102175 and J. Appl. Phys., 95, 5773 (2004).

In the present invention, the use of such a hole-transporting layer having high p-type properties is preferred for producing an element with lower power consumption.

Non-limiting examples of the compound that is preferably used in formation of the hole-injecting layer and the hole-transporting layer of the organic EL element of the present invention are shown below:

[Chem. 60]
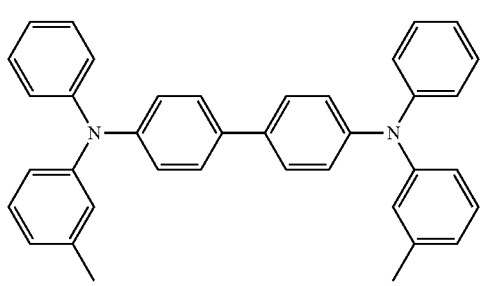
(TPD)
HT-1
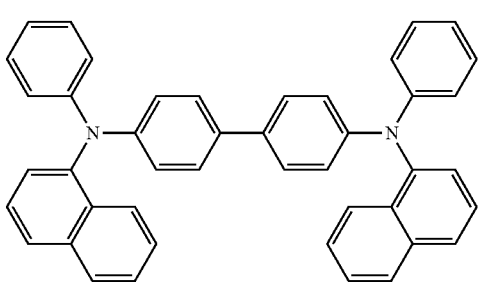
(α-NPD)
HT-2
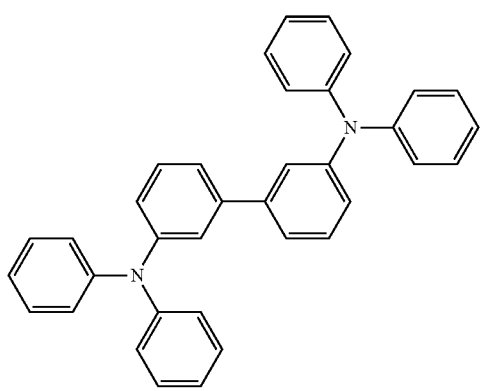
HT-3
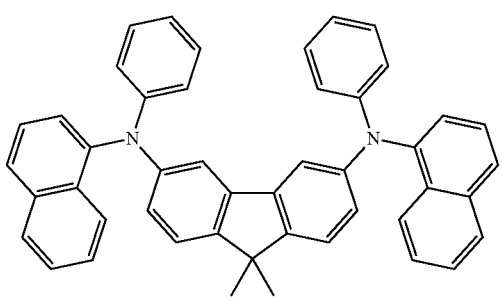
HT-4
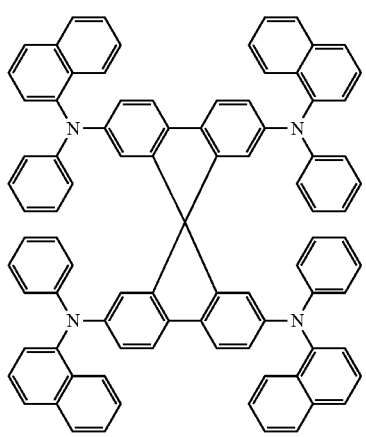
HT-5
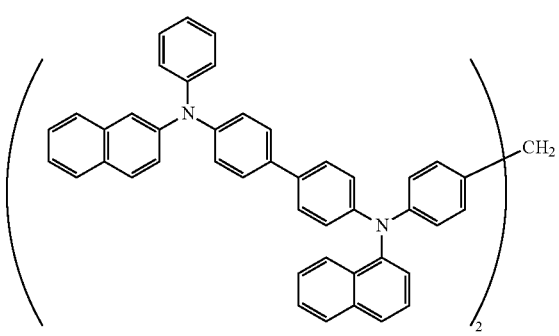
HT-6
[Chem. 61]
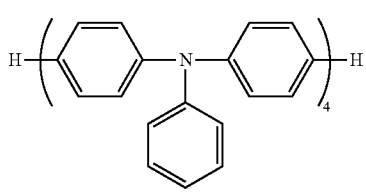
HT-7
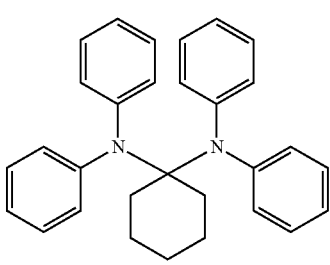
HT-8

-continued
HT-9
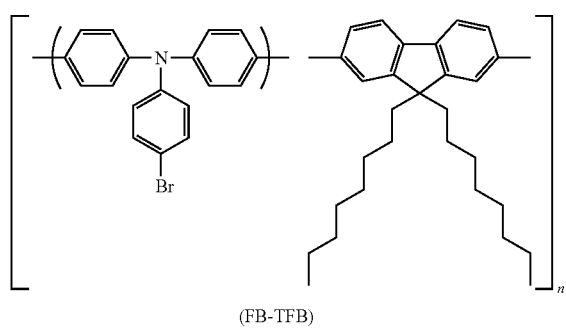
(FB-TFB)
HT-10
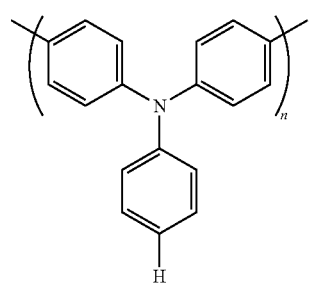
[Chem. 62]
HT-11
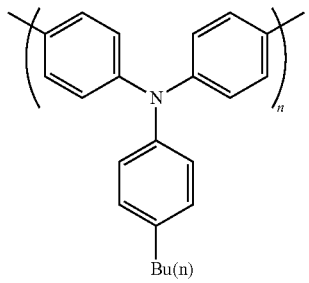
HT-12
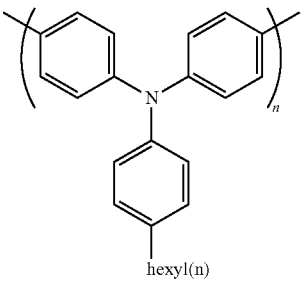
HT-13
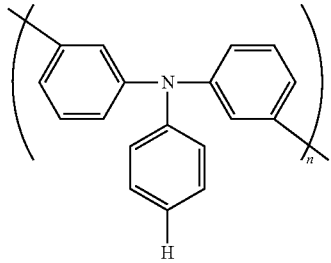
HT-14
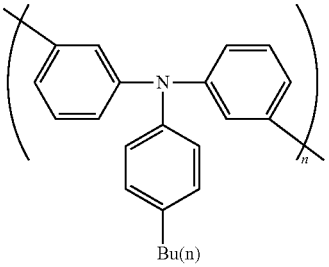
HT-15
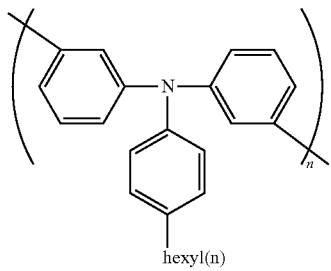
HT-16
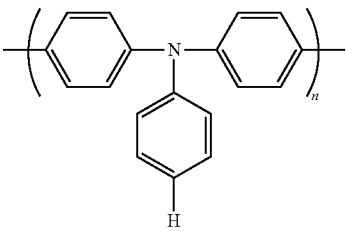
HT-17
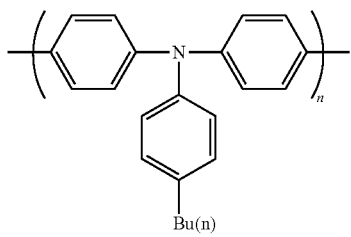
HT-18
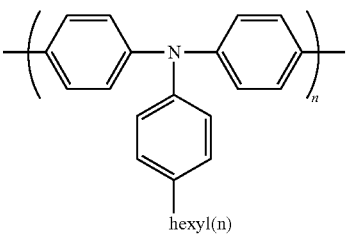

HT-19 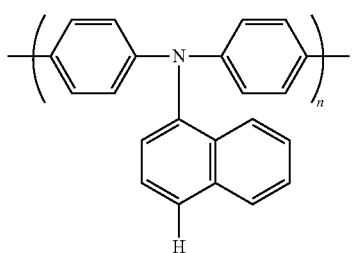
HT-20 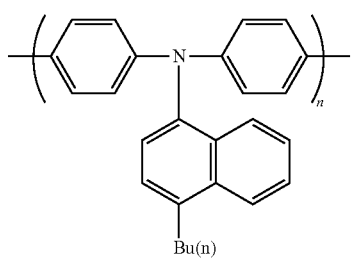
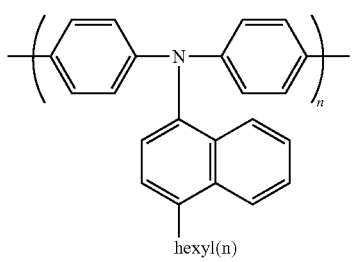
[Chem. 63]
HT-21 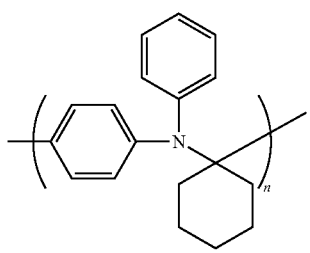
HT-22 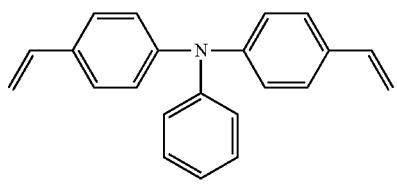
HT-23 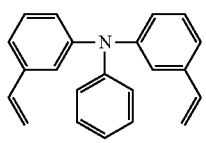
HT-24 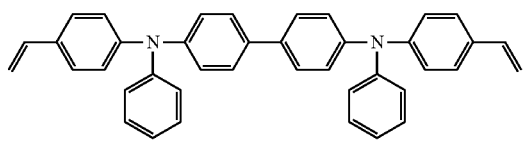
HT-25
HT-26 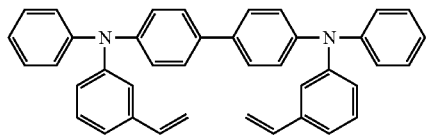
HT-27 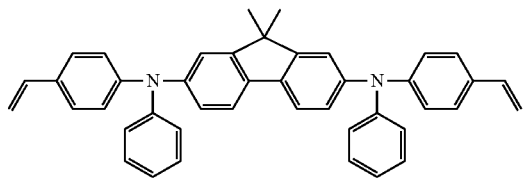
HT-28 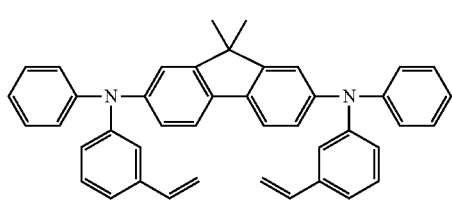
HT-29 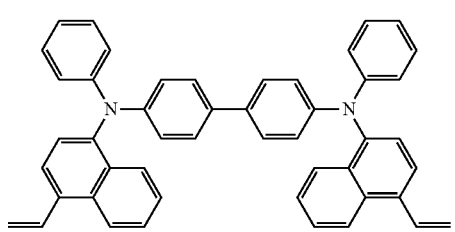

[Chem. 64]
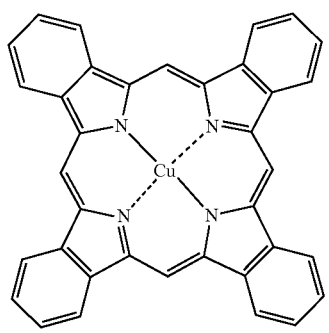
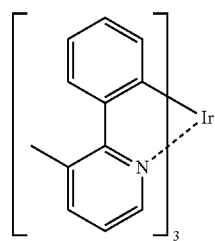 HT-30
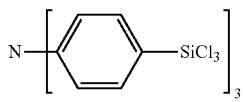
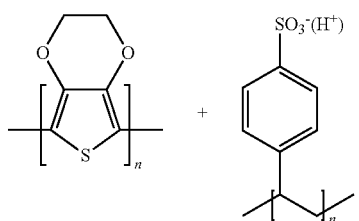 HT-32 HT-33
HT-31
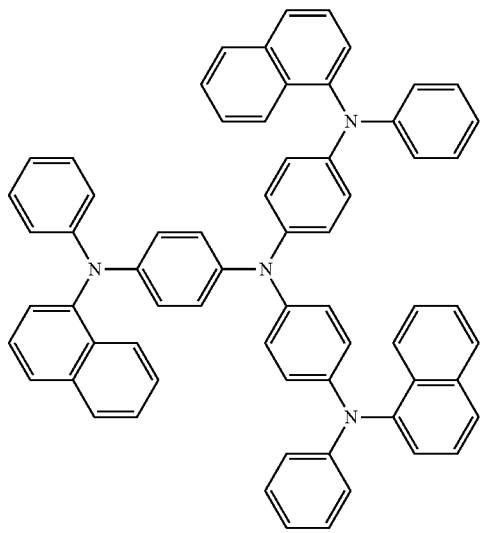 HT-35
HT-34
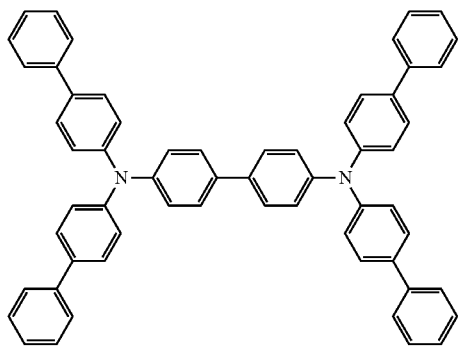 HT-36
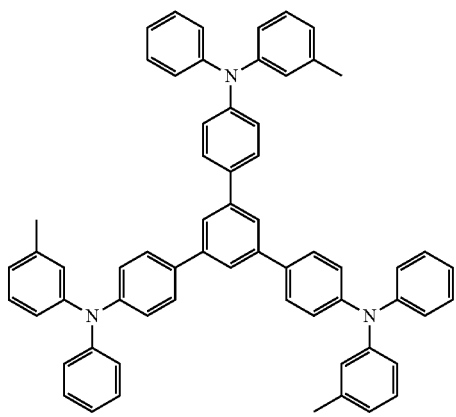 HT-37

[Chem. 65]
HT-38
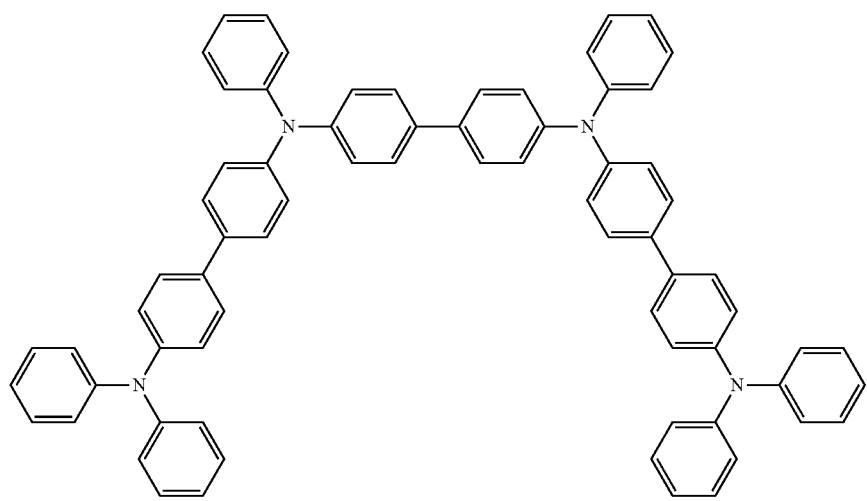
HT-39
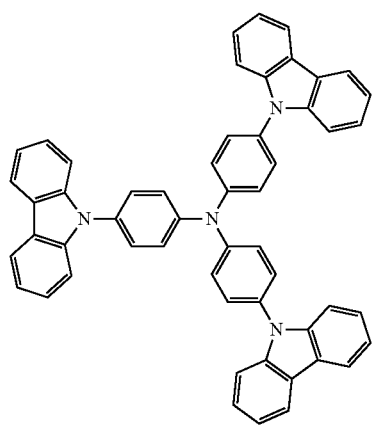
HT-40
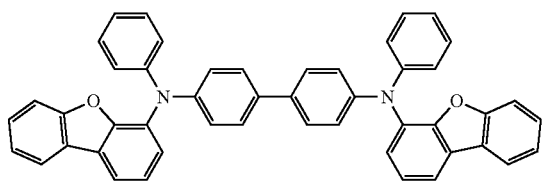
HT-41
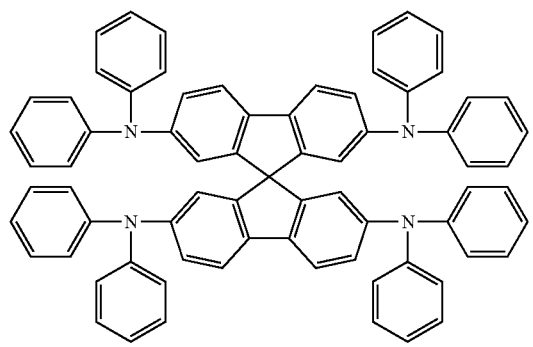
HT-42
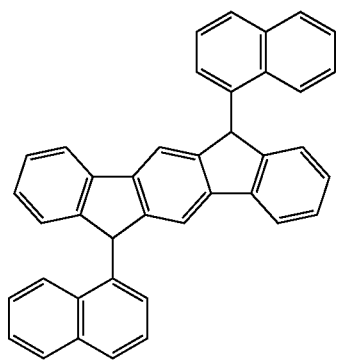

[Chem. 66]

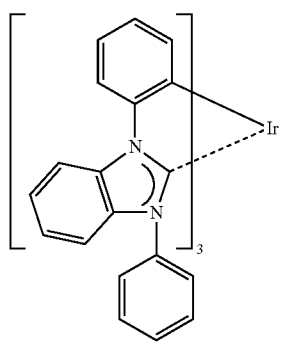 HT-43

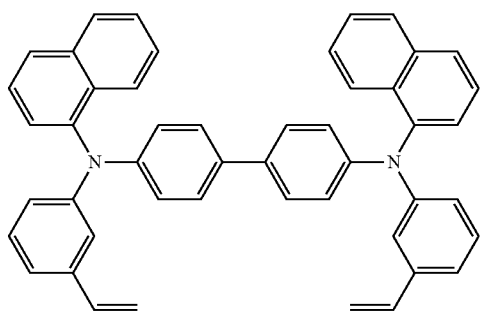 HT-44

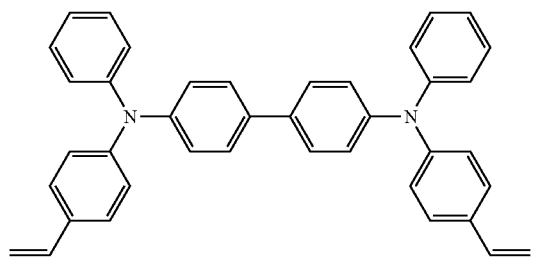 HT-45

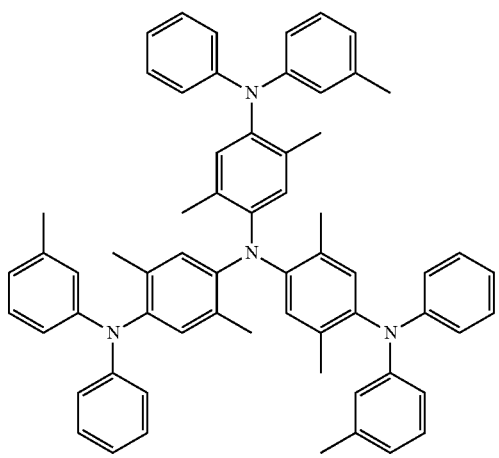 HT-46

<<Electron-Transporting Layer>>

The electron-transporting layer is composed of a material having an electron transportability, and the electron-injecting layer and the hole-blocking layer are categorized into the electron-transporting layer in a broad sense. The electron-transporting layer may have a monolayer or multilayer structure.

The electron-transporting material (including hole-blocking material and electron-injecting material) contained in the electron-transporting layer may be any material that can transport electrons injected from a cathode to a light-emitting layer. The electron-transporting layer can be composed of a single material or two or more materials appropriately selected from known compounds.

Examples of the known materials that are contained in the electron-transporting layer (hereinafter, referred to as electron-transporting material) include nitro-substituted fluorene derivatives, diphenylquinone derivatives, thiopyran dioxide derivatives, heterocyclic tetracarboxylic anhydride, such as naphthalene perylene, carbodiimide, fluolenylidenemethane derivatives, anthraquinodimethane and anthrone derivatives, oxadiazole derivatives, carboline derivatives, and azacarbazole derivatives. The azacarbazole derivative is a compound having at least one nitrogen atom substituted for any of the carbon atoms on the carbazole ring.

Furthermore, thiadiazole derivatives in which oxygen atoms of the oxadiazole rings of the oxadiazole derivatives mentioned above are replaced with sulfur atoms and quinoxaline derivatives having quinoxaline rings known as electron extraction groups can be used as the electron-transporting materials.

Polymer materials having these compounds introduced into their chains or having these compounds as main chains can also be used.

Examples of the usable electron-transporting material include metal complexes of 8-quinolinol derivatives, such as aluminum tris(8-quinolinol) (abbreviation: Alq), aluminum tris(5,7-dichloro-8-quinolinol), aluminum tris(5,7-dibromo-8-quinolinol), aluminum tris(2-methyl-8-quinolinol), aluminum tris(5-methyl-8-quinolinol), and zinc bis(8-quinolinol) (abbreviation: Znq), and metal complexes in which the central metals of the metal complexes mentioned above are replaced with In, Mg, Cu, Ca, Sn, Ga, or Pb.

In addition, the electron-transporting material may be a metal-free or metal-containing phthalocyanine or its derivative having an end substituted by an alkyl or sulfonate group, for example.

Alternatively, the electron-transporting material may be an inorganic semiconductor, such as n-type Si and n-type SiC, as in the hole-injecting layer or the hole-transporting layer.

The electron-transporting layer may have any thickness, which is usually within a range of about 5 to 5000 nm and preferably 5 to 200 nm. The electron-transporting layer may have a monolayer structure composed of one or more of the materials mentioned above or may have a laminate structure composed of a plurality of layers.

An electron-transporting layer having high n-type properties doped with an impurity can also be used. Examples thereof include those described in, for example, Japanese Patent Laid-Open Nos. H04-297076, H10-270172, 2000-196140, and 2001-102175 and J. Appl. Phys., 95, 5773 (2004).
Non-limiting examples of the known compound (electron-transporting material) that is preferably used in the formation of the electron-transporting layer of the organic EL element of the present invention are shown below:
[Chem. 67]
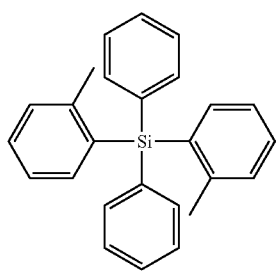
ET-1
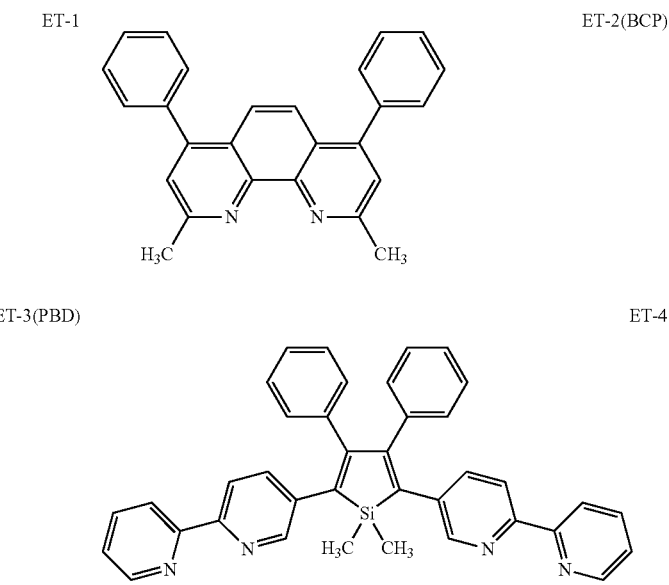
ET-2(BCP)
ET-3(PBD)
ET-4
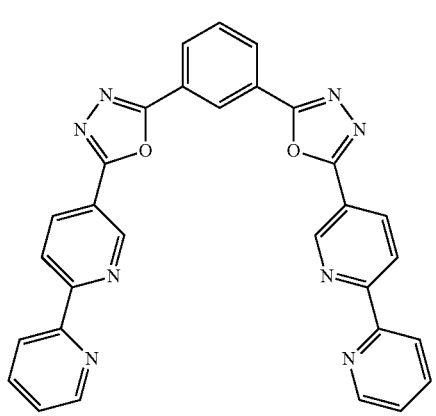
ET-5
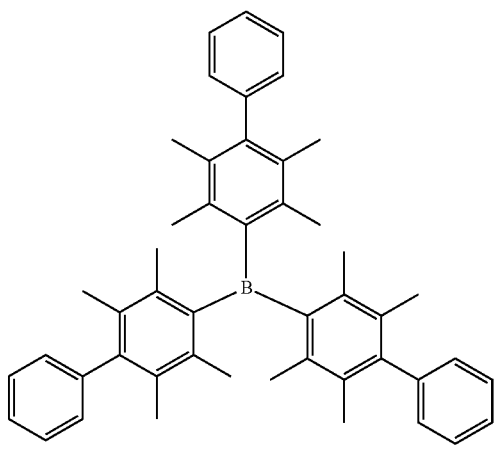
ET-6
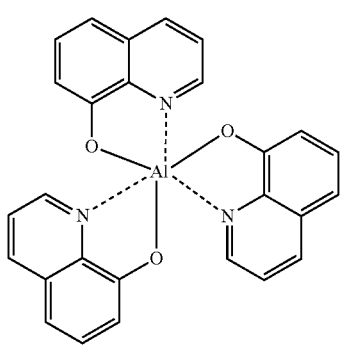
ET-7(Alq3)
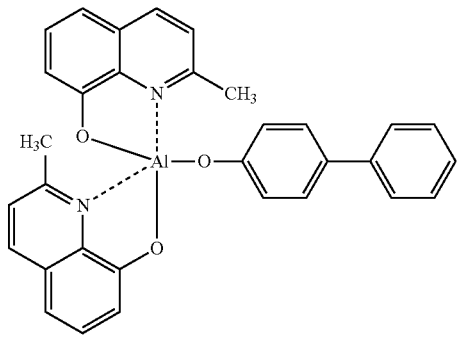
ET-8(Alq)

ET-9
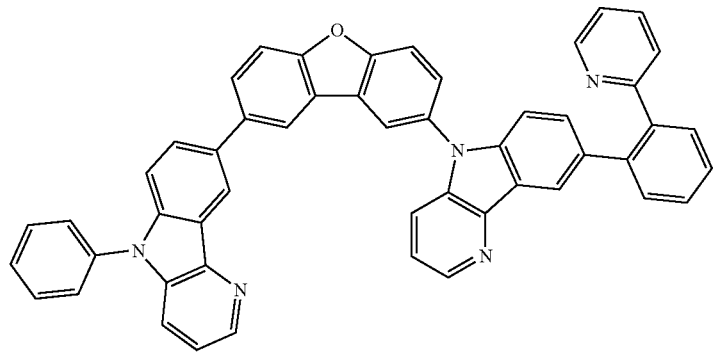
ET-10
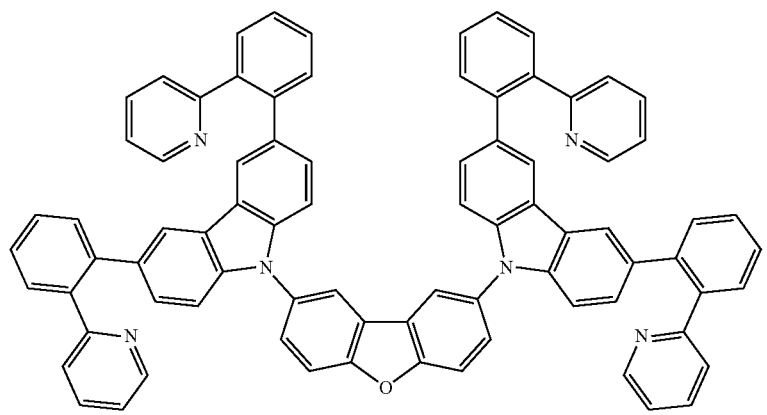
ET-11
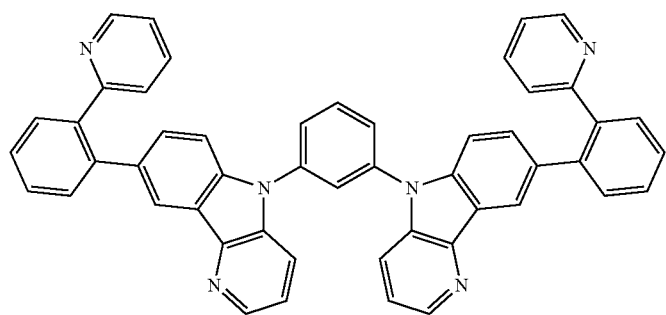

[Chem. 69]

ET-12

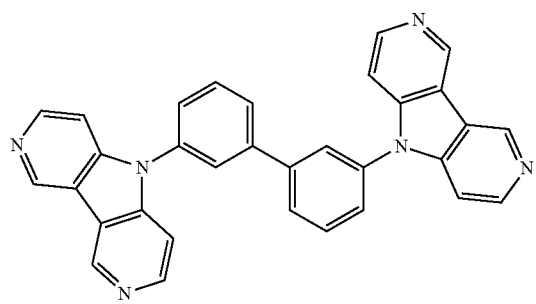

ET-13

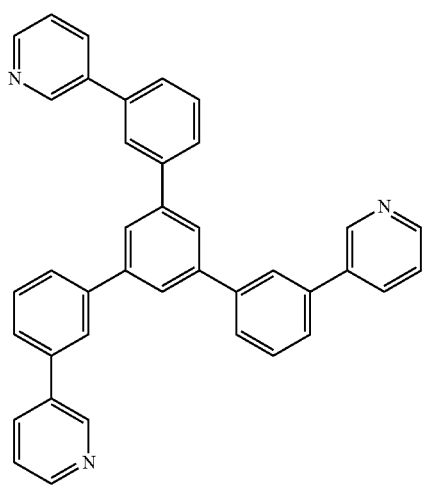

ET-14

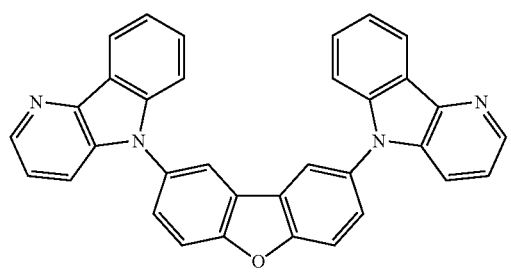

ET-15

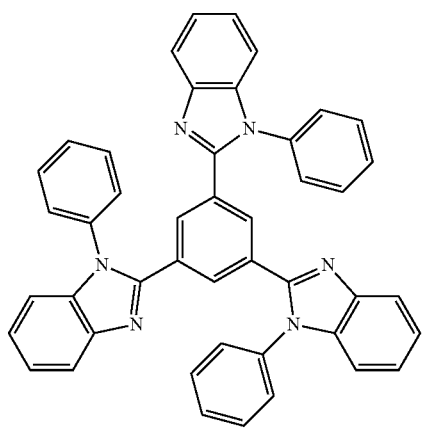

ET-16

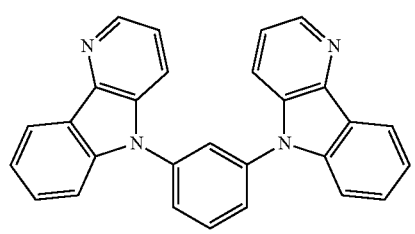

ET-17

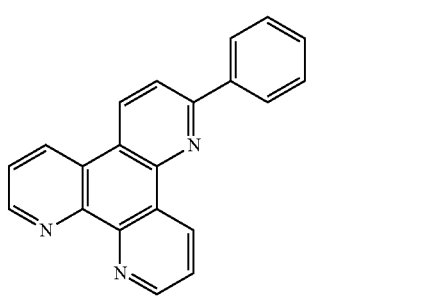

<<Blocking Layer>>

The blocking layer is a hole-blocking layer or an electron-blocking layer and is optionally provided in addition to each constitutive layer of the organic compound thin films described above. The blocking layer is, for example, a hole-blocking layer described in Japanese Patent Laid-Open Nos. H11-204258 and H11-204359 and on page 237 of "Organic EL element and its frontier of industrialization" (published by NTS Corporation, Nov. 30, 1998) for example.

The hole-blocking layer functions as an electron-transporting layer in a broad sense and is composed of a material having electron transportability but extremely poor hole transportability and can increase the probability of recombination of electrons and holes by transporting electrons and blocking holes.

The structure of an electron-transporting layer described above can be optionally used as a hole-blocking layer.

The hole-blocking layer of the organic EL element of the present invention preferably adjoins the light-emitting layer.

The hole-blocking layer preferably contains a nitrogen-containing compound, such as a carbazole derivative, an azacarbazole derivative (described above), or a pyridine derivative.

In the present invention, when a plurality of light-emitting layers emitting light of different colors are included, a light-emitting layer with the shortest maximum light emission wavelength among the light-emitting layers is preferably disposed closest to the anode. In such a case, an additional hole-blocking layer is preferably disposed between the shortest-wavelength layer and a light-emitting layer second closest to the anode.

Furthermore, at least 50% by mass of the compounds contained in the hole-blocking layer disposed at the position described above preferably has an ionization potential that is at least 0.3 eV higher than that of the host compound contained in the shortest wavelength light-emitting layer.

The ionization potential is defined by the energy necessary for releasing an electron in the highest occupied molecular orbital (HOMO) level of a compound to the vacuum level and can be determined, for example, as follows:

(1) The ionization potential can be determined with molecular orbital calculation software, Gaussian 98 (Gaussian 98, Revision A.11.4, M. J. Frisch, et al., Gaussian, Inc., Pittsburgh Pa., 2002) manufactured by Gaussian, Inc. in U.S.A. as a value (eV unit conversion value) calculated by structural optimization using B3LYP/6-31G* as a keyword. This calculated value is valid because of a high correlation between the calculated values determined by such a method and experimental values.

(2) The ionization potential can also be directly measured by photoelectron spectroscopy. For example, a low-energy electron spectrometer "Model AC-1", manufactured by Riken Keiki Co., Ltd. or a method known as ultraviolet photoelectron spectroscopy can be suitably employed.

Meanwhile, the electron-blocking layer functions as a hole-transporting layer in a broad sense and is composed of a material having hole transportability but extremely poor electron transportability and can increase the probability of recombination of electrons and holes by transporting holes and blocking electrons.

The structure of a hole-transporting layer described above can be optionally used as an electron-blocking layer. The hole-blocking layer and the electron-transporting layer according to the present invention each preferably have a thickness within a range of 3 to 100 nm and more preferably 3 to 30 nm.

<<Anode>>

The electrode material of the anode of the organic EL element is preferably a metal, alloy, or electroconductive compound having a high work function (4 eV or more) or a mixture thereof. Examples of the electrode material include metals such as Au and transparent electroconductive materials such as CuI, tin-doped indium oxide (indium tin oxide, abbreviated as ITO), $SnO_2$, and ZnO.

A material, such as IDIXO ($In_2O_3$—ZnO), capable of forming an amorphous transparent electroconductive film may be used. The anode may be produced by forming a thin film from such an electrode material by, for example, deposition or sputtering, and then patterning the film into a desired shape by photolithography. If a high-precision pattern is not required (about 100 μm or more), the pattern may be formed by depositing or sputtering the electrode material through a mask having a desired shape.

Alternatively, for a coatable material, such as an organic electroconductive compound, a wet film-forming process, such as printing or coating, is also available. For extraction of emitted light from the anode, the transmittance of the anode is desirably 10% or more, and the sheet resistance of the anode is preferably several hundred ohms per square or less. The thickness of the layer is usually in a range of 10 to 1000 nm and preferably 10 to 200 nm depending on the material.

<<Cathode>>

On the contrary, the electrode material of the cathode is preferably a metal (referred to as electron-injecting metal), alloy, or electroconductive compound having a low work function (4 eV or less) or a mixture thereof.

Examples of the electrode material include sodium, sodium-potassium alloys, magnesium, lithium, mixtures of magnesium and copper, mixtures of magnesium and silver, mixtures of magnesium and aluminum, mixtures of magnesium and indium, mixtures of aluminum and aluminum oxide ($Al_2O_3$), indium, mixtures of lithium and aluminum, and rare-earth metals.

Among them, from the viewpoint of the electron injectability and resistance to oxidation, preferred are mixtures of an electron-injecting metal and a second metal having a work function higher than that of the electron-injecting metal and being stable, such as mixtures of magnesium and silver, mixtures of magnesium and aluminum, mixtures of magnesium and indium, mixtures of aluminum and aluminum oxide ($Al_2O_3$), mixtures of lithium and aluminum, and aluminum.

The cathode can be produced by forming a thin film from such an electrode material by, for example, deposition or sputtering. The cathode preferably has a sheet resistance of several hundred ohms per square or less and a thickness within a range of usually 10 nm to 5 μm and preferably 50 to 200 nm.

If either the anode or the cathode of the organic EL element is transparent or translucent, the emitted light can pass therethrough to advantageously increase the brightness.

A transparent or translucent cathode can be produced by forming a film having a thickness of 1 to 20 nm from the metal mentioned above and then forming a layer of an electroconductive transparent material exemplified in the description of the anode on the metal film. This process can be applied to produce an element having a transparent anode and a transparent cathode.

<<Supporting Substrate>>

The supporting substrate (hereinafter, also referred to as base, substrate, base member, or support) that can be used for the organic EL element of the present invention may be composed of any material, such as glass or plastic, and may be transparent or opaque. For extraction of light from the supporting substrate side, the supporting substrate is preferably transparent.

Examples of the supporting substrate preferably used include glass, quartz, and transparent resin films. Particularly preferred supporting substrate is a resin film capable of imparting flexibility to the organic EL element.

Examples of the material constituting the resin film include polyesters, such as polyethylene terephthalate (abbreviation: PET) and polyethylene naphthalate (abbreviation: PEN); polyethylenes; polypropylenes; cellophane; cellulose esters and their derivatives, such as cellulose diacetate, cellulose triacetate (abbreviation: TAC), cellulose acetate butylate, cellulose acetate propionate (abbreviation: CAP), cellulose acetate phthalate, and cellulose nitrate; polyvinylidene chloride; polyvinyl alcohols; polyethylene-vinyl alcohol); syndiotactic polystyrene; polycarbonates; norbornene resins; polymethylpentene; polyether ketones; polyimides; polyether sulfones (abbreviation: PESs); polyphenylene sulfide; polysulfones; polyether imides; polyether ketone imides; polyamides; fluorine resins; Nylon; poly (methyl methacrylate); acrylics and polyarylates; and cycloolefin resins, such as ARTON (trade name, manufactured by JSR Corp.) and APEL (trade name, manufactured by Mitsui Chemicals Inc.).

On the surface of a resin film, an inorganic or organic coating film or a hybrid coating film composed of these films may be formed. The coating film is preferably a barrier film having a vapor permeability of 0.01 g/(m²·24 h) or less (at 25±0.5° C. and 90±2% relative humidity (RH)) measured by a method in accordance with JIS K 7129-1992, and more preferably a high barrier film having an oxygen permeability of 1×10⁻³ mL/(m²·24 h·MPa) or less measured by a method in accordance with JIS K 7126-1987 and a vapor permeability of 1×10⁻⁵ g/(m²·24 h) or less.

The barrier film may be formed of any material that can block migration of substances such as moisture and oxygen causing performance degradation of the organic EL element, and usable examples of the material include silicon oxide, silicon dioxide, and silicon nitride.

In order to reduce the brittleness of the barrier film, the barrier film preferably has a laminate structure composed of an inorganic layer and an organic material layer. The inorganic layer(s) and the organic material layer(s) may be laminated in any order, and it is preferable that the both layers be alternately laminated multiple times.

The barrier film may be formed by any method, for example, vacuum deposition, sputtering, reactive sputtering, molecular beam epitaxy, ionized-cluster beam deposition, ion plating, plasma polymerization, atmospheric pressure plasma polymerization, plasma CVD, laser CVD, thermal CVD, or coating. A method of forming a thin film such as atmospheric pressure plasma polymerization described in Japanese Patent Laid-Open No. 2004-68143 is particularly preferred.

Examples of the opaque supporting substrate include metal plates of, for example, aluminum and stainless steel; opaque resin substrates; and ceramic substrates.

The external quantum efficiency of the organic EL element of the present invention at room temperature is preferably 1.0% or more and more preferably 5.0% or more.

The external quantum efficiency (%) is a value determined by the following expression:

External quantum efficiency (%)=(the number of photons emitted from the organic EL element to the exterior)/(the number of electrons supplied to the organic EL element)×100.

A hue improving filter, such as a color filter, or a color conversion filter that converts the color of light emitted by the organic EL element to different colors using fluorescent compounds may be used in combination. In the use of a color conversion filter, the λmax of the light emitted from the organic EL element is preferably 480 nm or less.

<<Method of Producing Organic EL Element>>

An example method of producing an organic EL element having a configuration composed of anode/hole-injecting layer/hole-transporting layer/light-emitting layer/hole-blocking layer/electron-transporting layer/cathode buffer layer (electron-injecting layer)/cathode will now be described.

A thin film having a thickness of 1.0 µm or less, preferably within a range of 10 to 200 nm, is formed with a desired electrode material, for example, a material for an anode, on a suitable supporting substrate to produce an anode.

Subsequently, thin films (hereinafter, also referred to as organic EL layer or organic functional layers) containing organic compounds for forming, for example, a hole-injecting layer, a hole-transporting layer, a light-emitting layer, a hole-blocking layer, an electron-transporting layer, and a cathode buffer layer, are formed on the anode.

The organic functional layers, such as the hole-injecting layer, hole-transporting layer, light-emitting layer, hole-blocking layer, electron-transporting layer, and cathode buffer layer, can be formed as thin films by, for example, vacuum deposition or a wet process (spin coating, casting, ink jetting, printing, Langmuir Blodgett method (LB deposition), spraying, printing, or slot-type coating).

Among the wet processes, such as spin coating, casting, die coating, blade coating, roll coating, ink jetting, printing, spray coating, curtain coating, and LB deposition, a process showing high adaptability to a roll-to-roll system, e.g., die coating, roll coating, ink jetting, or spray coating, is preferred because of high precision of a formed thin film and high productivity. A different film-forming process may be applied to each layer.

Usable examples of media for dissolving or dispersing the organic EL materials according to the present invention include ketones, such as methyl ethyl ketone and cyclohexanone; aliphatic acid esters, such as ethyl acetate; halogenated hydrocarbons, such as dichlorobenzene; aromatic hydrocarbons, such as toluene, xylene, mesitylene, and cyclohexylbenzene; aliphatic hydrocarbons, such as cyclohexane, decaline, and dodecane; and organic solvents, such as dimethylformamide (abbreviation: DMF) and dimethylsulfoxide (abbreviation: DMSO).

Dispersion can be performed by, for example, ultrasonic wave dispersion, high shearing force dispersion, or medium dispersion.

After formation of each organic functional layer, a thin film of a material for a cathode is formed thereon into a thickness of 1 µm or less, preferably within a range of 50 to 200 nm to provide a cathode to give a desired organic EL element.

Alternatively, the organic EL element can also be produced in the reverse order, i.e., in order of a cathode, a cathode buffer layer, an electron-transporting layer, a hole-blocking layer, a light-emitting layer, a hole-transporting layer, a hole-injecting layer, and an anode.

In a case of applying a direct current voltage to the resulting multichromatic display device, the luminescence can be observed by application of a voltage of about 2 to 40 V between the anode as a positive (+) polarity and the cathode as a negative (−) polarity. Alternatively, an alternating voltage may be applied. The alternating current to be applied may have any wave form.

In the production of the organic EL element of the present invention, the steps of producing the layers from the hole-injecting layer to the cathode are preferably performed through a single vacuuming operation. Alternatively, the workpiece of the organic EL element may be taken out to be subjected to another process. In such a case, the process is preferably performed under a dry inert gas atmosphere.

<<Sealing>>

The organic EL element of the present invention is preferably insulated or sealed with a sealing material to hermetically seal the anode, the cathode, and the organic functional and other layers disposed between the cathode and the anode.

Examples of the sealing means used in the present invention include bonding of a sealing member, the electrode, and the supporting substrate with an adhesive.

The sealing member is disposed so as to cover the displaying area of the organic EL element and may be a concave plate or a flat plate. The sealing member may have any transparency and electrical insulation.

Examples of the sealing member include glass plates, composite materials composed of polymer plates and films, and composite materials composed of metal plates and films. Examples of the glass plate include plates of soda-lime glass, barium/strontium-containing glass, lead glass, aluminosilicate glass, borosilicate glass, barium borosilicate glass, and quartz.

Examples of the polymer plate include plates of polycarbonate, acryl, polyethylene terephthalate, polyether sulfide, and polysulfone. Examples of the metal plate include plates composed of at least one metal or alloy selected from the group consisting of stainless steel, iron, copper, aluminum, magnesium, nickel, zinc, chromium, titanium, molybdenum, silicon, germanium, and tantalum.

In the present invention, a polymer film or a metal film is preferably used, from the viewpoint of a reduction in the total thickness of the organic EL element.

The polymer film preferably has an oxygen permeability of $1 \times 10^{-3}$ mL/(m$^2$·24 h·MPa) or less measured by a method in accordance with JIS K 7126-1987 and a vapor permeability of $1 \times 10^{-3}$ g/(m$^2$·24 h) or less (at 25±0.5° C. and 90±2% relative humidity (RH)) measured by a method in accordance with JIS K 7129-1992.

The sealing member is formed into a concave shape by, for example, sand blasting or chemical etching.

Examples of the adhesive include photo-curable or thermo-curable adhesives having reactive vinyl groups, such as acrylic acid oligomers and methacrylic acid oligomers; moisture curable adhesives such as 2-cyanoacrylate; and thermally or chemically curable (two-liquid mixing type) adhesives, such as epoxy adhesives.

Examples of the adhesive include hot-melt polyamide, polyester, and polyolefin adhesives; and cationically UV curable epoxy resin adhesives.

Since the organic EL element may be degraded during heat treatment, preferred adhesives are curable at a temperature from room temperature to 80° C. A drying agent may be dispersed in the adhesive. The adhesive may be applied to the sealing portion with a commercially available dispenser or by printing, such as screen printing.

It is also preferred that an inorganic or organic layer is formed as a sealing film on the exterior of the electrode placed on the organic functional layer on the supporting substrate to cover the electrode and the organic functional layer and to come into contact with the supporting substrate.

In such a case, the sealing film may be formed of any material that can block the migration of substances, such as water and oxygen, which causes degradation of the organic EL element. Usable examples of the material include silicon oxide, silicon dioxide, and silicon nitride.

In order to reduce the brittleness of the sealing film, the sealing film preferably has a laminate structure composed of an inorganic layer and an organic material layer.

The sealing film may be formed by any method, for example, vacuum deposition, sputtering, reactive sputtering, molecular beam epitaxy, ionized-cluster beam deposition, ion plating, plasma polymerization, atmospheric pressure plasma polymerization, plasma CVD, laser CVD, thermal CVD, or coating.

The gap between the sealing member and the displaying area of the organic EL element is preferably filled with an inert gas, such as nitrogen or argon, or an inactive liquid, such as fluorinated hydrocarbon or silicone oil, in the form of a gas or liquid phase. The gap can be in a vacuum state. Alternatively, it may be filled with a hygroscopic compound.

Examples of the hygroscopic compound include metal oxides (e.g., sodium oxide, potassium oxide, calcium oxide, barium oxide, magnesium oxide, and aluminum oxide), sulfates (e.g., sodium sulfate, calcium sulfate, magnesium sulfate, and cobalt sulfate), metal halides (e.g., calcium chloride, magnesium chloride, cesium fluoride, tantalum fluoride, cerium bromide, magnesium bromide, barium iodide, and magnesium iodide), and perchlorates (e.g., barium perchlorate and magnesium perchlorate). The sulfates, metal halides, and perchlorates are preferably used in the form of anhydrides.

<<Protection Film and Protection Plate>>

In order to enhance the mechanical strength of the organic EL element, a protection film or plate may be provided on the sealing layer on the organic functional layer facing the supporting substrate or on the outer surface of the sealing film. In particular, for sealing with the sealing film, the mechanical strength of the sealing film is not sufficiently high; hence, such a protection film or plate is preferred.

Usable examples of the material for the protection film or plate include glass plates, polymer plates and films, and metal plates and films, which have been exemplified as the materials for sealing. The polymer film is preferred from the viewpoint of a reduction in the weight and the thickness.

<<Light Extraction Efficiency>>

In general, an organic EL element generates light in a layer having a refractive index (about 1.7 to 2.1) higher than that of the air and can emit merely about 15% to 20% of the light generated in the light-emitting layer. This is because light incident on the interface between a transparent substrate and the air at an angle θ larger than a critical angle is totally reflected and cannot be emitted from the organic EL element, or is because light is totally reflected at the interface between the transparent electrode or light-emitting layer and the transparent substrate and is guided to the transparent electrode or the light-emitting layer to escape the light to the side face of the organic EL element.

The light extraction efficiency can be improved, for example, by roughening a surface of the transparent substrate to prevent total reflection at the interface between the transparent substrate and the air (U.S. Pat. No. 4,774,435); by providing light-condensing properties to the substrate to improve the efficiency (Japanese Patent Laid-Open No. S63-314795); by forming a reflection surfaces on the side faces of the organic EL element (Japanese Patent Laid-Open No. H01-220394); by disposing an anti-reflection film between the substrate and the luminescent material as a flat layer having an intermediate refractive index between those of the substrate and the luminescent material (Japanese Patent Laid-Open No. S62-172691); by disposing a flat layer having a refractive index lower than that of the substrate between the substrate and the luminescent material (Japanese Patent Laid-Open No. 2001-202827); or by forming a diffraction grating between any layers of the substrate, the transparent electrode layer, and the light-emitting layer (including on the substrate surface facing the exterior) (Japanese Patent Laid-Open No. H11-283751).

In the present invention, these methods can be used in combination with the organic EL element of the present invention. In particular, the method of disposing a flat layer having a refractive index lower than that of the substrate between the substrate and the luminescent material or the method of forming a diffraction grating between any layers of the substrate, the transparent electrode layer, and the light-emitting layer (including on the substrate surface facing the exterior) can be suitably employed.

The present invention can provide an element exhibiting higher brightness or excellent durability by combining these methods.

In an element including a layer of a low refractive index medium with a thickness greater than light wavelength between a transparent electrode and a transparent substrate, the extraction efficiency of light from the transparent electrode to the exterior increases with a decrease in the refractive index of the medium.

Examples of materials for the low refractive index layer include aerogel, porous silica, magnesium fluoride, and fluorinated polymer layers. Since the refractive index of a transparent substrate is usually within a range of about 1.5 to 1.7, the refractive index of the low refractive index layer is preferably about 1.5 or less and more preferably 1.35 or less.

The low refractive index medium layer desirably has a thickness twice or more the wavelength of the light in the medium for the following reason. If the low refractive index medium has a thickness similar to the wavelength of the light, the electromagnetic waves exuding as evanescent waves penetrate into the substrate, resulting in a reduction in the effect of the low refractive index layer.

The introduction of a diffraction grating into the interface causing the total reflection or one of the media can enhances the light extraction efficiency. In this method, a diffraction grating is introduced into the interface between any two layers or into any medium (on the transparent substrate or the transparent electrode) to extract the light that is generated in the light-emitting layer but cannot exit due to, for example, total reflection at the interface between the layers, by the use of the property of the diffraction grating that can change the direction of light to a specific direction different from that of refraction by Bragg diffraction such as primary diffraction or secondary diffraction.

The diffraction grating to be introduced desirably has a two-dimensional periodic refractive index. This is because that although light generated in a light-emitting layer is emitted at random in all directions, a common one-dimensional diffraction grating having a periodic refractive index distribution only in a specific direction can diffract only the light travelling in a specific direction and cannot greatly increase the light extraction efficiency.

A diffraction grating having a two-dimensional refractive index distribution can diffract light travelling in all directions, resulting in an increase in light extraction efficiency.

The diffraction grating may be introduced between any two layers or in any medium (in the transparent substrate or the transparent electrode) as described above, but is desirably introduced near the light-emitting layer generating light. The period of the diffraction grating is preferably about ½ to 3 times the wavelength of light in the medium.

The array of the diffraction grating is preferably two-dimensionally repeated such as a square lattice, a triangular lattice, or a honeycomb lattice.

<<Light-Condensing Sheet>>

The organic EL element of the present invention can enhance the brightness in a specific direction by condensing the light in this specific direction, for example, in the front of the light emitting plane of the element by providing, for example, a micro-lens array structure on the light extracting side of the substrate or combining with a light-condensing sheet.

In an example of the micro-lens array, quadrangular pyramids having a side of 30 μm and having a vertex angle of 90 degrees are two-dimensionally arranged on the light extraction side of the substrate. The quadrangular pyramid preferably has a side within a range of 10 to 100 μm. A side shorter than this range causes colored light due to the effect of diffraction, while a side longer than this range makes the thickness unfavorably large.

A usable light-condensing sheet is one practically used for an LED backlight of a liquid crystal display device. A typical example of the sheet is a brightness enhancing film (BEF) produced by SUMITOMO 3M Inc.

A prism sheet may have a shape, for example, an array of stripes each having a triangular cross-section with a vertex angle of 90 degrees and a pitch of 50 μm, having a round apex, having randomly changed pitches, and other shapes, formed on a base material.

In order to control the emission angle of light from the organic EL element, a light diffusion plate or film may be used in combination with the light-condensing sheet. For example, a diffusion film (Light-Up), manufactured by KIMOTO Co., Ltd., can be used.

<<Application>>

The organic EL element of the present invention can be used as a display device, a display, or various light emission sources. Examples of the light emission source include, but not limited to, lighting devices (home lamps and room lamps in vehicles), backlights for watches and liquid crystals, light sources for board advertisements, traffic lights, and optical memory media, light sources for electrophotographic copiers, light sources for optical communication instruments, and light sources for optical sensors. In particular, the organic EL element can be advantageously used as a backlight for a liquid crystal display device or a lighting source.

In the organic EL element of the present invention, films are optionally patterned with a metal mask or by ink-jet printing during formation of the films. The patterning may be performed for only the electrodes or for the electrodes and the light-emitting layer or for all layers of the element. In the production of the element, known methods can be employed.

Figure 4:
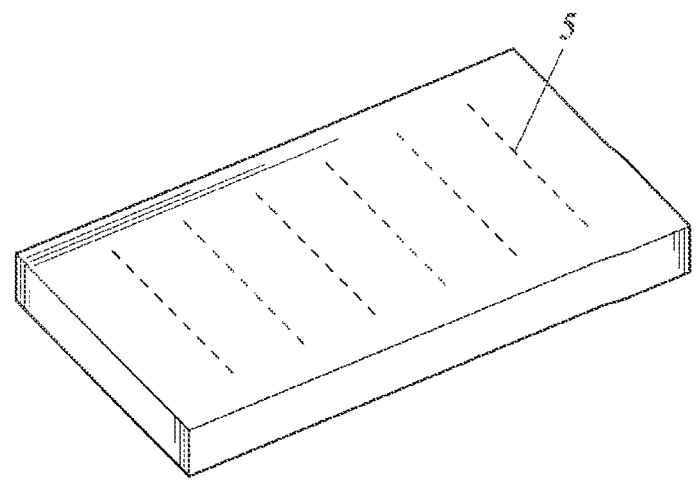
FIG. 4 is schematic diagrams illustrating an example full-color passive-matrix display device.
Figure 4:
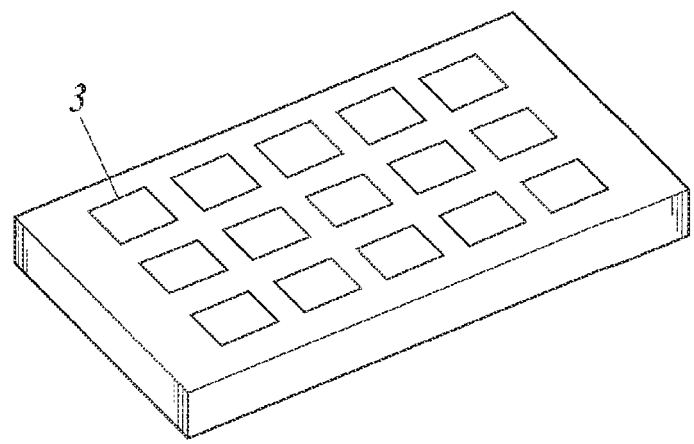
Figure 4:
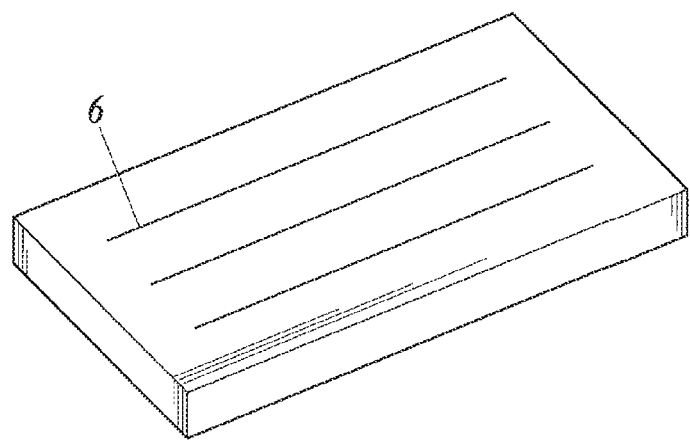

Colors of light emitted from the organic EL element of the present invention or the compounds according to the present invention are specified with the color determined by applying the results of measurements with a spectral emission brightness meter CS-1000 (manufactured by Konica Minolta Sensing Co., Ltd.) to the CIE chromaticity coordinates in FIG. 4.16 on page 108 of "Shinpen Shikisai Kagaku Handbook (New Edition Color Science Handbook)" (edited by The Color Science Association of Japan, University of Tokyo Press, 1985).

When the organic EL element of the present invention is a white light-emitting element, the term "white" indicates that the chromaticity in the CIE 1931 chromaticity system at 1000 cd/m$^2$ is within a region of X=0.33±0.07 and Y=0.33±0.1 in the measurement of the front brightness of a two-degree viewing angle described above.

<<Display Device>>

The display device including the organic EL element of the present invention may be monochromatic or multichromatic. A multichromatic display device will now be described.

In the case of a multichromatic display device, the light-emitting layer can be formed over the entire surface through a shadow mask by, for example, vacuum deposition, casting, spin coating, ink jetting, or printing.

In the case of patterning only the light-emitting layer, the patterning may be performed by any method and is preferably performed by vacuum deposition, ink jetting, spin coating, or printing.

The structure of the organic EL element provided to the display device is appropriately selected from the configurational examples of the organic EL element mentioned above depending on the need.

In a case of applying a direct current voltage to the resulting multichromatic display device, the luminescence can be observed by application of a voltage of about 2 to 40

V between the anode as a positive (+) polarity and the cathode as a negative (−) polarity. Even if a voltage with reverse polarity is applied, no current flows with no light emission. When an alternating current is applied, light is emitted only in the state of the anode being positive (+) and cathode being negative (−). The alternating current to be applied may have any wave form.

The multichromatic display device can be used as a display device, a display, or various light emission sources. In the display device and the display, full color display can be achieved with three types of organic EL elements that emit blue light, red light, and green light.

Examples of the display device and the display include television sets, personal computers, mobile equipment, AV equipment, teletext displays, and information displays in automobiles. In particular, the display device may be used for displaying still images or moving images, and the driving system in the case of using the display device for displaying moving images may be either a simple matrix (passive matrix) type or an active matrix type.

Examples of the light emission source include, but not limited to, home lamps, room lamps in vehicles, backlights for watches and liquid crystals, light sources for board advertisements, traffic lights, and optical memory media, light sources for electrophotographic copiers, light sources for optical communication instruments, and light sources for optical sensors.

An example of the display device including the organic EL element of the present invention will now be described with reference to the accompanying drawings.

FIG. 1 is a schematic diagram illustrating an example display device composed of organic EL elements. The schematic diagram illustrates a display that displays image information through luminescence of the organic EL elements and can be applied to, for example, a mobile phone.

The display 1 is composed of a display unit A having a plurality of pixels and a control unit B performing image scanning of the display unit A based on the image information.

The control unit B is electrically connected to the display unit A and sends scanning signals and image data signals to the respective pixels based on external image information. The pixels of each scanning line provided with the scanning signals sequentially emit light according to the image data signals, and the image information through image scanning is displayed on the display unit A including the organic EL elements.

Figure 2:
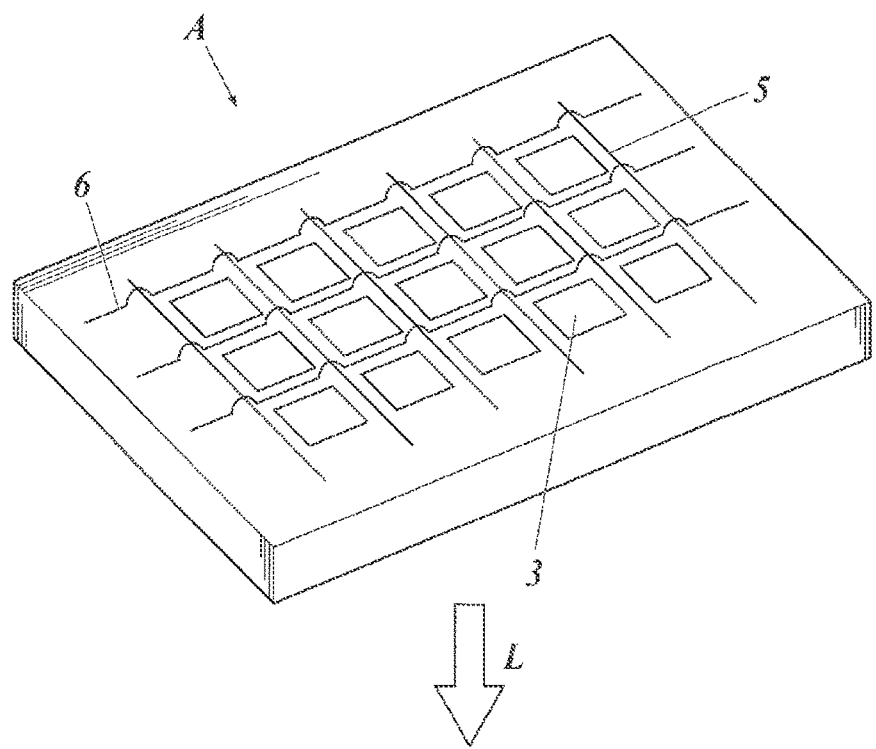
FIG. 2 is a schematic diagram illustrating an example display unit A shown in FIG. 1.

FIG. 2 is a schematic diagram illustrating an example display unit A shown in FIG. 1.

The display unit A includes a wiring portion including a plurality of scanning lines 5 and data lines 6, and a plurality of pixels 3, on a substrate.

The main components of the display unit A shown in FIG. 2 will now be described.

FIG. 2 shows a case of extracting light L emitted by the pixels 3, composed of organic EL elements, to the direction shown by the white arrow (downward direction).

The scanning lines 5 and the data lines 6 in the wiring portion are each made of an electrically conductive material and are disposed orthogonal to each other into a grid pattern and are connected to the respective pixels 3 at the intersections (the details are not shown).

A scanning signal is applied to a scanning line 5, then the pixels 3 receive an image data signal from the data lines 6, and the organic EL elements of the pixels 3 emit light according to the received image data.

Full color display is achieved by appropriately arraying pixels that emit light in red regions, light in green regions, and light in blue regions on a single substrate.

The luminescent process of a pixel will now be described.

Figure 3:
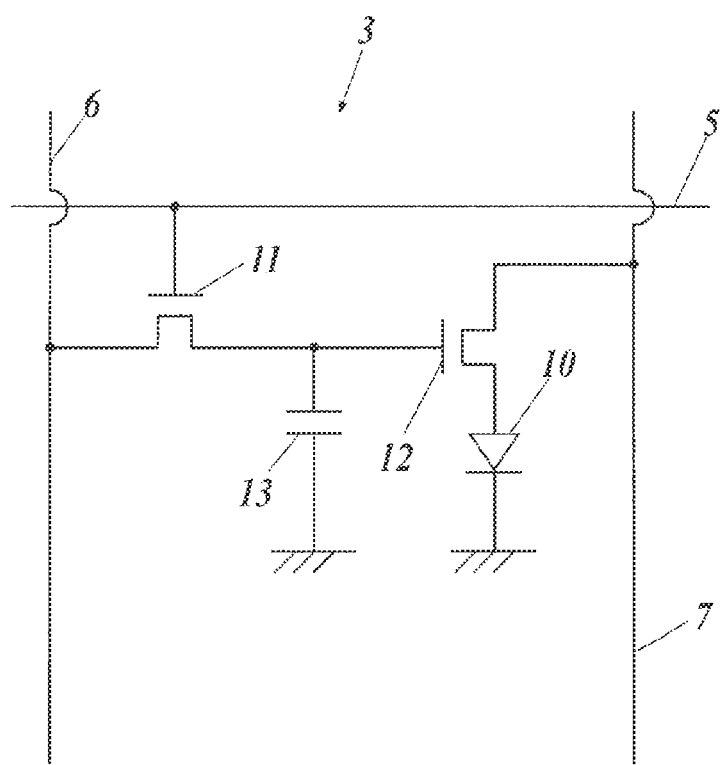
FIG. 3 is a schematic diagram illustrating an example structure of the pixel shown in FIG. 2.

FIG. 3 is a schematic diagram of the pixel 3 shown in FIG. 2.

The pixel 3 includes an organic EL element 10, a switching transistor 11, a driving transistor 12, and a capacitor 13. Full color display can be performed using organic EL elements 10 emitting red light, green light, and blue light in respective pixels arrayed on a single substrate.

In FIG. 3, an image data signal from the control unit B is applied to the drain of the switching transistor 11 via the data line 6. A scanning signal from the control unit B is then applied to the gate of the switching transistor 11 via the scanning line 5 to turn on the switching transistor 11, and the image data signal applied to the drain is transmitted to the capacitor 13 and the gate of the driving transistor 12.

The capacitor 13 is charged through the transmission of the image data signal depending on the potential of the image data signal, and the driving transistor 12 is turned on. In the driving transistor 12, the drain is connected to a power source line 7, and the source is connected to the electrode of the organic EL element 10 to supply a current to the organic EL element 10 from the power source line 7 depending on the potential of the image data signal applied to the gate.

The scanning signal is transmitted to the next scanning line 5 through sequential scanning by the control unit B to turn off the switching transistor 11.

The capacitor 13 maintains the charged potential of the image data signal even after the turning-off of the switching transistor 11, and thereby the driving state of the driving transistor 12 is maintained to continue the luminescence of the organic EL element 10 until the next scanning signal is applied.

The driving transistor 12 is driven according to the potential of the subsequent image data signal in synchronization with the subsequent scanning signal applied by sequential scanning, resulting in luminescence by the organic EL element 10.

That is, the luminescence by the organic EL element 10 is performed by providing a switching transistor 11 and a driving transistor 12 serving as active elements to the organic EL element 10 of each of the plurality of pixels and allowing the respective organic EL elements 10 of the pixels 3 to emit light. Such a light emitting process is called an active matrix system.

The luminescence from the organic EL element 10 may have multiple gradations according to multi-valued image data signals having different gradation potentials, or a predetermined intensity of on-off light according to a binary image data signal. The electric potential of the capacitor 13 may be maintained until the subsequent scanning signal is applied, or may be discharged immediately before the subsequent scanning signal is applied.

In the present invention, the luminescence may be driven by a passive matrix system as well as the active matrix system described above. In the passive matrix system, light is emitted from the organic EL element in response to the data signal only during scanning of the scanning signals.

FIG. 4 includes schematic diagrams of a passive-matrix display device.

In FIG. 4, a plurality of scanning lines 5 and a plurality of image data lines 6 are arrayed on opposite sides of pixels 3 into a grid pattern.

When scanning signals are applied to a scanning line 5 by sequential scanning, the pixels 3 connected to the activated scanning line 5 emit light in accordance with the image data signals.

The passive matrix system has no active element in the pixels 3, resulting in a reduction in manufacturing cost.

<<Lighting Device>>

A lighting device including the organic EL element of the present invention will now be described.

The organic EL element of the present invention may have a resonator structure. The organic EL element having a resonator structure can be applied to, but not limited to, a light source for an optical memory medium, a light source for an electrophotographic copier, a light source for an optical communication instrument, or a light source for an optical sensor. Alternatively, the organic EL element may be used for the above-mentioned purposes by laser oscillation.

The organic EL element of the present invention may be used as a lamp such as a lighting source or an exposure light source or may be used as a projector for projecting images or a display device (display) for direct view of still or moving images.

The driving system of the display device used for playback of moving images may be either a simple matrix (passive matrix) type or an active matrix type. Furthermore, a full-color display device can be produced by employing two or more organic EL elements of the present invention that emit light of different colors.

The organic EL material of the present invention can be applied to an organic EL element emitting substantially white light as a lighting device. The white light is generated by mixing light components having different colors simultaneously emitted from a plurality of luminescent materials.

The combination of the different emitted light colors may be a combination containing three maximum light emission wavelengths of three primary colors of blue, green, and red or a combination containing two maximum light emission wavelengths utilizing a relationship of complementary colors such as blue and yellow or turquoise and orange.

Furthermore, the combination of luminescent materials to obtain a plurality of luminescent colors may be either a combination of a plurality of phosphorescent or fluorescent materials or a combination of a fluorescent or phosphorescent material and a coloring material that emits excited light converted from the light from the luminescent material. However, in the white-emitting organic EL element according to the present invention, a mere combination of a plurality of luminescent dopants has sufficient effects.

It is sufficient that a mask is disposed only during formation of a light-emitting layer, a hole-transporting layer, or an electron-transporting layer to simply separate the coating through the mask. The other layers are common and do not require any patterning with a mask. For example, an electrode film can be formed on the entire surface by, for example, vacuum deposition, casting, spin coating, ink jetting, or printing. Such a process can enhance the productivity.

According to this method, the element itself emits white light, unlike the white-emitting organic EL device including arrayed light emitting elements emitting different colors.

Any luminescent material can be used for the light-emitting layer. For example, in a backlight of a liquid crystal display element, white light may be made by selecting and combining appropriate metal complexes according to the present invention or known luminescent materials so as to match with the wavelength range corresponding to color filter (CF) characteristics.

<<One Embodiment of Lighting Device Including Organic EL Element of the Present Invention>>

The non-light emitting surface of the organic EL element of the present invention is covered with a glass case, and a glass substrate having a thickness of 300 μm is used as a sealing substrate. A sealing material, i.e., an epoxy photo-curable adhesive (e.g., LUXTRACK LC0629B manufactured by Toagosei Co., Ltd.), is applied to the periphery, and the product is placed onto a cathode and is attached to the transparent supporting substrate, followed by curing the adhesive by irradiation with UV light through the glass substrate for sealing. A lighting device can be formed as shown in FIGS. 5 and 6.

Figure 5:
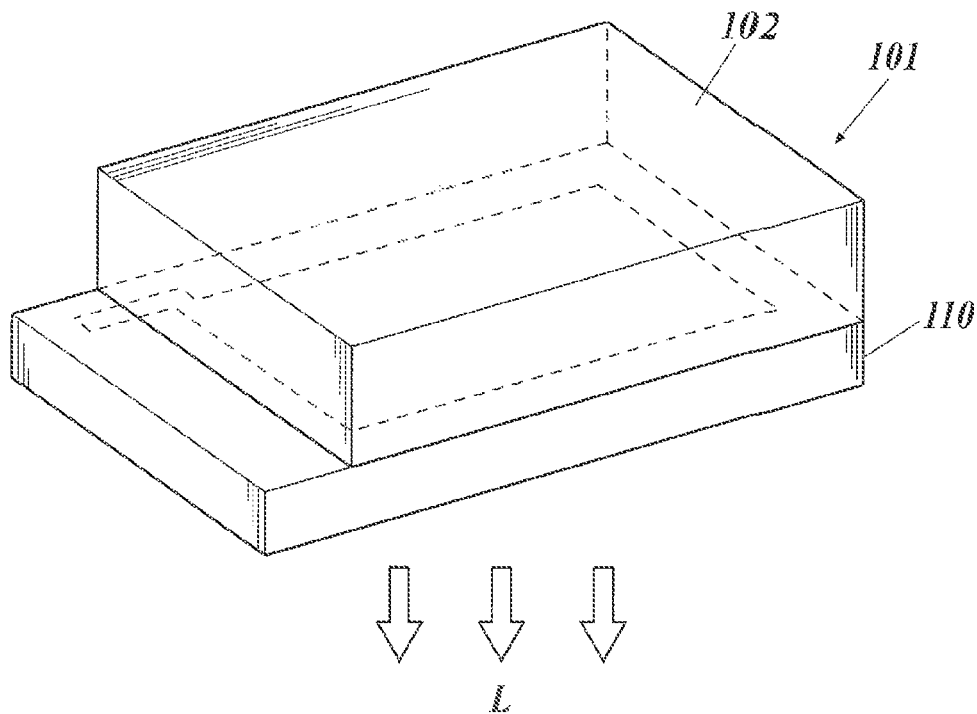
FIG. 5 is an outline diagram illustrating an example lighting device having organic EL elements.

FIG. 5 is a schematic diagram of a lighting device. An organic EL element 101 of the present invention is covered with a glass cover 102. Sealing with the glass cover is preferably performed in a glove box under a nitrogen atmosphere (e.g., a high purity nitrogen atmosphere having a purity of at least 99.999%) to avoid contact of the organic EL element 101 with air.

Figure 6:
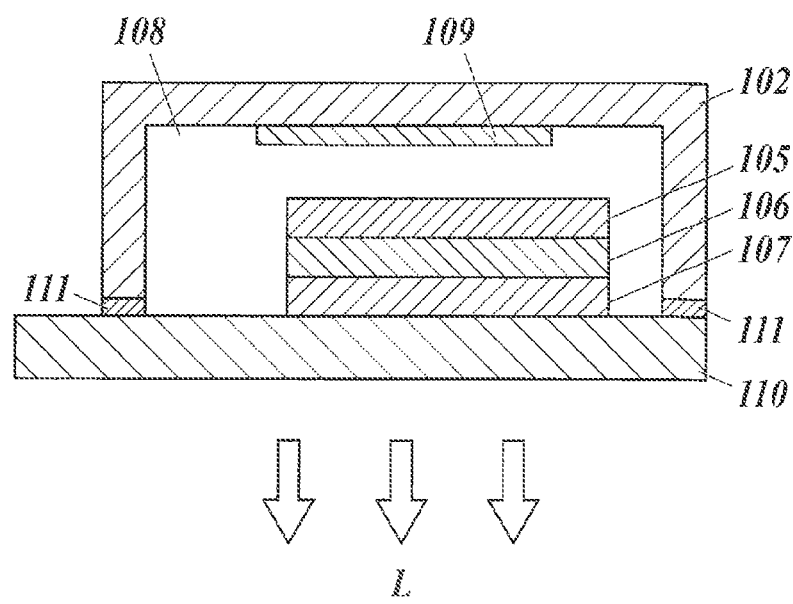
FIG. 6 is a schematic diagram illustrating an example lighting device having organic EL elements.

FIG. 6 is a cross-sectional view of the lighting device. In FIG. 6, reference numeral 105 indicates a cathode, reference numeral 106 indicates an organic functional layer at least including a light-emitting layer, and reference numeral 107 indicates a glass substrate provided with a transparent electrode (anode).

The inside of the glass cover 102 is filled with nitrogen gas 108 and is provided with a water absorbent 109.

Examples

The present invention will now be described in detail by examples, which are not intended to limit the present invention. Note that "part(s)" and "%" in examples mean "part(s) by mass" and "% by mas", respectively, unless specifically defined otherwise.

<<Evaluation of Characteristic Values (Requirement 1) of Phosphorescent Organic Metal Complex (A)>>

Light-emitting monolayer samples, which were used for producing each organic EL element described below, containing phosphorescent organic metal complexes (A) and host compounds as shown in Table 1 were produced in accordance with the method described below. The ratio ((D)/(C)) of the brightness persistence (D) in a UV irradiation test using a Hg—Xe light source to the brightness persistence (C) in a UV irradiation test using a light source of a 365-nm wavelength of each light-emitting monolayer was measured by the following process.

[Production of Light-Emitting Monolayer Sample]

(Production of Light-Emitting Monolayer 1)

As a substrate for a light-emitting monolayer, a quartz substrate of 100 by 100 by 1 mm was cleaned in isopropyl alcohol under ultrasonic waves, dried with dry nitrogen gas, and subjected to UV ozone cleaning for 5 minutes.

Subsequently, the quartz substrate was fixed to the substrate holder of a commercially available vacuum deposition apparatus. A molybdenum resistance heating boat filled with 200 mg of exemplary compound HS-180 as a host compound and a molybdenum resistance heating boat filled with 100 mg of a compound (1-1) shown below as a phosphorescent dopant compound (A) were placed in the vacuum deposition apparatus.

The pressure of a vacuum vessel was then reduced to $4 \times 10^{-4}$ Pa, and then the heating boat containing HS-180 as a host compound and the heating boat containing compound 1-1 as a phosphorescent dopant compound (A) were heated by electrification to codeposit them at deposition rates of 0.2 nm/sec and 0.035 nm/sec, respectively, to form a 30-nm thick light-emitting monolayer 1 on the quartz substrate. The dope concentration of compound 1-1 as the phosphorescent dopant compound (A) in the light-emitting layer was adjusted to 15% by volume through control of the deposition rates of the host compound and the phosphorescent dopant compound. The temperature of the quartz substrate during the deposition was 25° C.

(Production of Light-Emitting Monolayers 2 to 15)

Light-emitting monolayers 2 to 15 were produced as in (Production of light-emitting monolayer 1) except that the combinations of a phosphorescent dopant compound (A) and a host compound used were as in Table 1.

[Chem. 70]

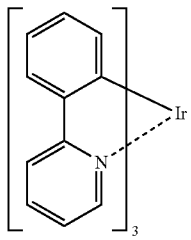

1-1

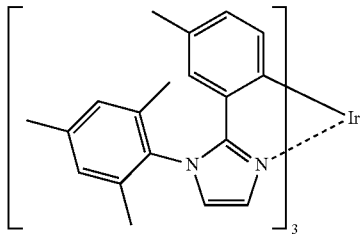

1-2

[Measurement of Shortest Wavelength Side Maximum Phosphorescent Wavelength of Phosphorescent Organic Metal Complex (A)]

The shortest wavelength side maximum phosphorescent wavelength of each of the phosphorescent organic metal complexes (A) used for producing the light-emitting monolayer samples was measured by the following process.

A sample solution was prepared by dissolving each phosphorescent organic metal complex (A) in toluene into a concentration of 1.0% by mass.

The prepared solution of the phosphorescent organic metal complex (A) in toluene was then placed into the measuring unit of a spectrophotofluorometer (F-2500) manufactured by Hitachi High-Technologies Corporation, which was used as a fluorophotometer, and the spectral characteristics from the ultraviolet to the visible region were measured to determine the maximum phosphorescent wavelength (nm) on the shortest wavelength side. The results are shown in Table 1.

[Evaluation of Light-Emitting Monolayer Sample: Ultraviolet Light Resistance Test]

1) With each light-emitting monolayer sample, the brightness persistence (C) in a UV irradiation test using a light source of a 365-nm wavelength and 2) the brightness persistence (D) in a UV irradiation test using a Hg—Xe light source were measured in accordance with the following process, and the ratio ((D)/(C)) was determined.

The UV irradiation test using a light source of a 365-nm wavelength was performed with a mercury-xenon lamp UV irradiation device LC2 manufactured by Hamamatsu Photonics K.K. The UV irradiation test using a Hg—Xe light source was performed with a mercury-xenon lamp UV irradiation device LC8 manufactured by Hamamatsu Photonics K.K.

An irradiation fiber and the samples (blue light-emitting monolayers) were disposed such that the light exiting surface of the fiber and the glass cover surface of each sample were parallel to each other with a distance of 1 cm therebetween without a UV-cut filter. Each sample was irradiated for 20 minutes. The illuminance of the light at the irradiated surface was measured with a UV power meter C6080-365 manufactured by Hamamatsu Photonics K.K.

The UV irradiation test using a light source of a 365-nm wavelength and the UV irradiation test using a Hg—Xe light source were performed under conditions that the absorbed photon energies in both tests were the same.

The brightness persistences (C) and (D) were determined by continuously irradiating each sample with light from a light source of a 365-nm wavelength or a Hg—Xe light source for 20 minutes and dividing the brightness after the irradiation for 20 minutes by the initial brightness. The ratio ((D)/(C)) of the brightness persistence (D) to the brightness persistence (C) was calculated. The results are shown in Table 1. The brightness was measured at an angle of 45 degrees from the axis of the irradiation fiber with a spectral emission brightness meter CS-1000 (manufactured by Konica Minolta, Inc.).

TABLE 1

| LIGHT-EMITTING MONOLAYER SAMPLE No. | HOST COMPOUND | PHOSPHORESCENT DOPANT (A) | | | CHARACTERISTICS OF REQUIREMENT 1: BRIGHTNESS PERSISTENCE | | |
|---|---|---|---|---|---|---|---|
| | | DOPANT | *1 (nm) | CONCENTRATION (% BY VOLUME) | 365 nm (C) | HgXe (D) | (D)/(C) |
| 1 | HS-180 | COMPOUND1-1 | 513 | 15.0 | 100 | 84 | 0.84 |
| 2 | HS-180 | COMPOUND1-2 | 485 | 15.0 | 96 | 78 | 0.82 |
| 3 | HS-180 | D-5 | 463 | 15.0 | 100 | 73 | 0.73 |
| 4 | HS-180 | D-36 | 473 | 15.0 | 60 | 58 | 0.97 |
| 5 | HS-180 | DP-1 | 475 | 15.0 | 78 | 59 | 0.76 |
| 6 | HS-180 | DP-26 | 470 | 15.0 | 92 | 81 | 0.88 |
| 7 | HS-180 | DP-49 | 455 | 15.0 | 88 | 72 | 0.82 |
| 8 | HS-180 | DP-67 | 475 | 15.0 | 90 | 84 | 0.93 |
| 9 | HS-180 | DP-73 | 475 | 15.0 | 75 | 61 | 0.81 |

TABLE 1-continued

| LIGHT-EMITTING | | PHOSPHORESCENT DOPANT (A) | | | CHARACTERISTICS OF REQUIREMENT 1: BRIGHTNESS PERSISTENCE | | |
|---|---|---|---|---|---|---|---|
| MONOLAYER SAMPLE No. | HOST COMPOUND | DOPANT | *1 (nm) | CONCENTRATION (% BY VOLUME) | 365 nm (C) | HgXe (D) | (D)/(C) |
| 10 | HS-180 | DP-78 | 473 | 15.0 | 92 | 72 | 0.78 |
| 11 | HS-180 | DP-79 | 475 | 15.0 | 93 | 85 | 0.91 |
| 12 | HS-182 | DP-68 | 473 | 15.0 | 98 | 79 | 0.81 |
| 13 | HS-194 | DP-78 | 473 | 15.0 | 92 | 72 | 0.78 |
| 14 | HS-2 | DP-1 | 475 | 15.0 | 71 | 67 | 0.94 |
| 15 | HS-2 | DP-78 | 473 | 15.0 | 81 | 71 | 0.88 |

*1: PEAK WAVELENGTH ON THE SHORTEST WAVELENGTH SIDE

The results in Table 1 evidently show that the shortest wavelength side maximum phosphorescent wavelengths of compounds 1-1 and 1-2 were respectively 513 nm and 485 nm, which are outside of the range of the shortest wavelength side maximum phosphorescent wavelength of a phosphorescent organic metal complex (A) defined in the present invention, whereas the shortest wavelength side maximum phosphorescent wavelengths of other phosphorescent organic metal complexes (A) were within the range of 480 nm or less defined in the present invention.

It was confirmed that the combinations of a phosphorescent dopant compound (A) and a host compound excluding light-emitting monolayer samples 3 and 4 satisfied the requirement of having a ratio (D)/(C) within a range (0.75 to 0.95) defined in the present invention.

<<Production of Organic EL Element>>
[Production of Organic EL Element 101]

A film of indium tin oxide (hereinafter, abbreviated as ITO) with a thickness of 100 nm was formed on a glass substrate (NA45, manufactured by NH Techno Glass Corp.) of 100 by 100 by 1.1 mm and was patterned into an anode. The resulting transparent supporting substrate provided with the ITO transparent electrode was cleaned in isopropyl alcohol under ultrasonic waves, dried with dry nitrogen gas, and subjected to UV ozone cleaning for 5 minutes.

Subsequently, the transparent supporting substrate produced above was fixed to the substrate holder of a commercially available vacuum deposition apparatus. A molybdenum resistance heating boat filled with 200 mg of exemplary compound HT-3 as a hole-transporting material, a molybdenum resistance heating boat filled with 200 mg of exemplary compound HS-180 as a host compound, a molybdenum resistance heating boat filled with 100 mg of compound 1-1 (mentioned above) as a phosphorescent dopant compound (A), a molybdenum resistance heating boat filled with 100 mg of exemplary compound D-35 as a phosphorescent dopant compound (B), and a molybdenum resistance heating boat filled with 200 mg of exemplary compound ET-11 as an electron-transporting material were placed in the vacuum deposition apparatus.

The pressure of the vacuum vessel was reduced to $4 \times 10^{-4}$ Pa, and then the heating boat containing exemplary compound HT-3 was heated by electrification to deposit exemplary compound HT-3 at a deposition rate of 0.1 nm/sec to form a 25-nm thick hole-transporting layer on the transparent supporting substrate.

The heating boats containing exemplary compound HS-180 as a host compound, compound 1-1 as a phosphorescent dopant compound (A), and exemplary compound D-35 as a phosphorescent dopant compound (B) were then heated by electrification to codeposit them at deposition rates of 0.083 nm/sec, 0.015 nm/sec, and 0.002 nm/sec, respectively, to form a 30-nm thick light-emitting monolayer on the hole-transporting layer on the transparent supporting substrate. The dope concentration of compound 1-1 as the phosphorescent dopant compound (A) in the light-emitting layer was adjusted to 15% by volume through control of the deposition rates of the host compound and the phosphorescent dopant compound. The dope concentration of exemplary compound D-35 as a phosphorescent dopant compound (B) was adjusted to 2% by volume. The substrate temperature was 25° C. during the deposition.

The heating boat containing exemplary compound ET-11 as an electron-transporting material was then heated by electrification to deposit exemplary compound ET-11 at a deposition rate of 0.1 nm/sec to form a 40-nm thick electron-transporting layer on the light-emitting layer formed above. The substrate temperature was 25° C. during the deposition.

Subsequently, a 0.5-nm thick lithium fluoride thin film and a 110-nm thick aluminum thin film were deposited to form a cathode on the electron-transporting layer formed above to produce an organic EL element 101.

[Production of Organic EL Elements 102 to 122]

Organic EL elements 102 to 122 were produced as in the production of the organic EL element 101 except that the types and the amounts of the phosphorescent organic metal complex (A) and the phosphorescent organic metal complex (B) and the type of the host compound used for forming light-emitting layers were those shown in Table 2.

[Measurement of Triplet Energy Level of Each Constituent Material]

The triplet energy levels of the phosphorescent organic metal complex (A), phosphorescent organic metal complex (B), and host compound as constituent materials of each light-emitting layer for producing organic EL elements were measured by the following process.

(1) Host materials doped with a phosphorescent organic metal complex (A) and a phosphorescent organic metal complex (B) were respectively deposited on the respective quartz substrates to provide film samples for measurement.

(2) Each quartz substrate was cooled with liquid nitrogen, and the film formed above was excited with light using a spectrophotofluorometer F-7000 (manufactured by Hitachi High-Technologies Corporation) to emit phosphorescence. The triplet energy level of each phosphorescent organic metal complex was determined from the resulting phosphorescent spectrum.

The results of the measurement demonstrated that in all organic EL elements of the present invention, the lowest excited triplet energy levels of the phosphorescent organic metal complex (A), phosphorescent organic metal complex (B), and host compound constituting the light-emitting layer had a relationship "the lowest excited triplet energy level of the phosphorescent organic metal complex (A) <the lowest excited triplet energy level of the phosphorescent organic metal complex (B) <the lowest excited triplet energy level of the host compound".

<<Evaluation of Organic EL Element>>

[Production of Lighting Device]

The non-light emitting surface of each of the organic EL elements produced above was covered with a glass cover. A glass substrate having a thickness of 300 µm was used as a sealing substrate. A sealing material, an epoxy photo-curable adhesive (e.g., LUXTRACK LC0629B manufactured by Toagosei Co., Ltd.), was applied to the periphery, and the product was placed onto the cathode of the organic EL element and was attached to the transparent supporting substrate, followed by curing the adhesive by irradiation with UV light through the glass substrate for sealing. Thus, lighting devices 101 to 122 having structures as shown in FIGS. 5 and 6 were produced.

[Evaluation of Lifetime of Element]

Each lighting device produced above was continuously driven with a constant current necessary for providing a brightness of 1000 cd/m$^2$ as initial. The time needed for reducing the brightness to a half (500 cd/m$^2$) of the initial brightness was determined as a measure of the lifetime of the element.

The lifetime of the element was a relative value to the value, 100, of a comparative organic EL element 101 (Comparative Example). A larger value means a longer lifetime of the organic EL element.

[Evaluation of durability: stability of chromaticity]

The front brightnesses of each organic EL element immediately after the start of the light emission in the evaluation of lifetime of the element and at a time when the brightness reduced to a half (500 cd/m$^2$) of the initial brightness by continuous driving were measured, and the maximum variation distance ΔE of x and y values in CIE 1931 at the front brightness of the organic EL element was determined by the expression shown below where ΔE was a relative value to the ΔE, 100, of the organic EL element 101. A smaller value means a less change and a higher stability of the chromaticity. The front brightness was measured with a spectral emission brightness meter CS-1000 (manufactured by Konica Minolta, Inc.).

$$\Delta E = (\Delta x^2 + \Delta y^2)^{1/2}$$

The results are shown in Table 2.

TABLE 2

| | | CONFIFURATION OF LIGHT-EMITTING LAYER | | | | | | RESULTS | | |
| | | PHOSPHORESCENT DOPANT (A) | | | | PHOSPHORSCENT DOPANT (B) | | LIFETIME | | |
| *3 | HOST COMPOUND | DOPANT | *1 (nm) | *4 | *2 | DOPANT | *1 (nm) | *4 | OF ELEMENT | *5 | NOTE |
|---|---|---|---|---|---|---|---|---|---|---|---|
| 101 | HS-180 | COMPOUND1-1 | 513 | 15.0 | 0.84 | D-35 | 473 | 2.00 | 100 | 100 | *6 |
| 102 | HS-180 | COMPOUND1-2 | 485 | 15.0 | 0.82 | D-5 | 463 | 2.00 | 41 | 167 | *6 |
| 103 | HS-180 | D-5 | 463 | 15.0 | 0.73 | — | — | — | 71 | 121 | *6 |
| 104 | HS-180 | D-36 | 473 | 15.0 | 0.97 | — | — | — | 67 | 132 | *6 |
| 105 | HS-180 | DP-1 | 475 | 15.0 | 0.76 | — | — | — | 96 | 98 | *6 |
| 106 | HS-180 | DP-78 | 473 | 15.0 | 0.78 | — | — | — | 97 | 101 | *6 |
| 107 | HS-180 | D-5 | 463 | 15.0 | 0.73 | D-3 | 453 | 2.00 | 78 | 110 | *6 |
| 108 | HS-180 | D-36 | 473 | 15.0 | 0.97 | D-3 | 453 | 2.00 | 84 | 121 | *6 |
| 109 | HS-180 | DP-78 | 473 | 2.0 | 0.78 | D-5 | 463 | 15.00 | 105 | 110 | *6 |
| 110 | HS-180 | DP-1 | 475 | 15.0 | 0.76 | D-5 | 463 | 2.00 | 147 | 88 | *7 |
| 111 | HS-180 | DP-73 | 475 | 15.0 | 0.81 | D-5 | 463 | 2.00 | 197 | 73 | *7 |
| 112 | HS-180 | DP-78 | 473 | 15.0 | 0.78 | D-5 | 463 | 2.00 | 196 | 69 | *7 |
| 113 | HS-180 | DP-78 | 473 | 15.0 | 0.78 | D-20 | 461 | 2.00 | 187 | 78 | *7 |
| 114 | HS-180 | DP-78 | 473 | 15.0 | 0.78 | D-42 | 464 | 2.00 | 230 | 59 | *7 |
| 115 | HS-180 | DP-26 | 470 | 15.0 | 0.88 | D-5 | 463 | 2.00 | 290 | 42 | *7 |
| 116 | HS-180 | DP-78 | 473 | 15.0 | 0.78 | D-42 | 464 | 0.36 | 240 | 32 | *7 |
| 117 | HS-194 | DP-78 | 473 | 15.0 | 0.78 | D-20 | 461 | 0.36 | 258 | 37 | *7 |
| 118 | HS-182 | DP-68 | 473 | 15.0 | 0.81 | D-20 | 461 | 0.36 | 280 | 43 | *7 |
| 119 | HS-180 | DP-67 | 475 | 15.0 | 0.93 | D-53 | 469 | 0.36 | 290 | 27 | *7 |
| 120 | HS-2 | DP-1 | 475 | 15.0 | 0.94 | D-5 | 463 | 0.36 | 410 | 13 | *7 |
| 121 | HS-2 | DP-78 | 473 | 15.0 | 0.88 | D-29 | 461 | 0.36 | 361 | 18 | *7 |
| 122 | HS-180 | DP-79 | 475 | 15.0 | 0.91 | D-5 | 463 | 0.36 | 320 | 32 | *7 |

*1: PEAK WAVELENGTH ON THE SHORTEST WAVELENGTH SIDE
*2: REQUIREMENT 1 HgXe(D)/365 nm(C)
*3: ORGANIC EL ELEMENT No.
*4: CONCENTRATION (% BY VOLUME)
*5: STABILITY OF CHORMATICITY
*6: COMPARATIVE EXAMPLE
*7: PRESENT INVENTION

The results in Table 2 evidently show that each organic EL element including a light-emitting layer satisfying the conditions defined in the present invention has a long lifetime of the element and highly stable chromaticity, compared to Comparative Examples.

INDUSTRIAL APPLICABILITY

The organic electroluminescent element of the present invention can have characteristics of a long lifetime and excellent stable chromaticity during continuous driving without deterioration of the phosphorescent organic metal complex in the light-emitting layer, and can be suitably applied to flat lighting systems, light sources for optical fibers, backlights for liquid crystal displays, backlights for liquid crystal projectors, and various light sources for display devices.

REFERENCE SIGNS LIST

1 display
3 pixel
5 scanning line
6 data line
7 power source line
10 organic EL element
11 switching transistor
12 driving transistor
13 capacitor
A display unit
B control unit
101 organic EL element
102 glass cover
105 cathode
106 organic EL layer
107 glass substrate with transparent electrode
108 nitrogen gas
109 water absorbent

The invention claimed is:

1. An organic electroluminescent element comprising an anode, a cathode, and a light-emitting layer disposed between the anode and the cathode, on a substrate, wherein
the light-emitting layer at least includes a blue light-emitting sublayer;
the blue light-emitting sublayer satisfies Requirement 1 and contains a phosphorescent organic metal complex (A) showing a phosphorescent spectrum having a maximum phosphorescent wavelength of 480 nm or less on the shortest wavelength side, a phosphorescent organic metal complex (B), and a host compound; and
the blue light-emitting sublayer contains the phosphorescent organic metal complex (A) in an amount larger than that of the phosphorescent organic metal complex (B),
Requirement 1: a blue light-emitting monolayer film composed of the phosphorescent organic metal complex (A) and the host compound formed on a quartz substrate has a ratio ((D)/(C)) within a range of 0.75 to 0.95 of the brightness persistence (D) in a UV irradiation test using a Hg—Xe light source to the brightness persistence (C) in a UV irradiation test using a light source of a 365-nm wavelength, under a same absorbed UV photon energy.

2. The organic electroluminescent element according to claim 1, wherein the lowest excited triplet energy level of the phosphorescent organic metal complex (B) is lower than the lowest excited triplet energy level of the host compound and is higher than the lowest excited triplet energy level of the phosphorescent organic metal complex (A).

3. The organic electroluminescent element according to claim 1, wherein the phosphorescent organic metal complex (A) shows a phosphorescent spectrum having a maximum phosphorescent wavelength of 475 nm or less on the shortest wavelength side.

4. The organic electroluminescent element according to claim 1, wherein the phosphorescent organic metal complex (A) shows a phosphorescent spectrum having a maximum phosphorescent wavelength of 460 nm or less on the shortest wavelength side.

5. The organic electroluminescent element according to claim 1, wherein the phosphorescent organic metal complex (A) is a compound represented by Formula (1):

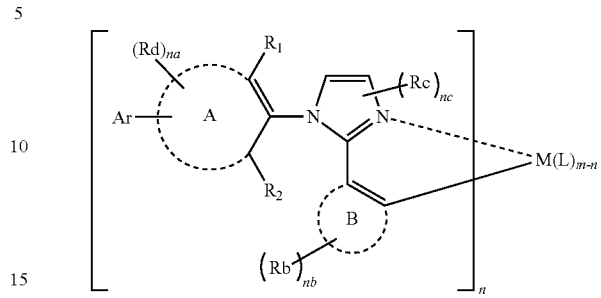

wherein, rings A and B each independently represent a 5- or 6-membered aromatic hydrocarbon or aromatic heterocyclic ring; Ar represents an aromatic hydrocarbon, aromatic heterocyclic, non-aromatic hydrocarbon, or non-aromatic heterocyclic ring; $R_1$, $R_2$, Ra, Rb, and Rc each independently represent a hydrogen atom, a halogen atom, a cyano group, or an optionally substituted alkyl, alkenyl, alkynyl, alkoxy, amino, silyl, arylalkyl, aryl, heteroaryl, non-aromatic hydrocarbon ring, or non-aromatic heterocyclic group; $n_a$ and $n_c$ each independently represent 1 or 2; $n_b$ represents an integer of 1 to 4; L represents one or more monoanionic bidentate ligands coordinated to M; M represents a transition metal atom having an atomic number of 40 or more and belonging to any one of Groups 8 to 10 in the periodic table; m-n represents an integer of 0 to 2; n represents an integer of 1 to 3; and m represents 2 or 3.

6. The organic electroluminescent element according to claim 5, wherein M in Formula (1) represents iridium.

7. The organic electroluminescent element according to claim 5, wherein ring B in Formula (1) represents a benzene ring.

8. The organic electroluminescent element according to claim 1, wherein the phosphorescent organic metal complex (B) is a compound represented by Formula (2):

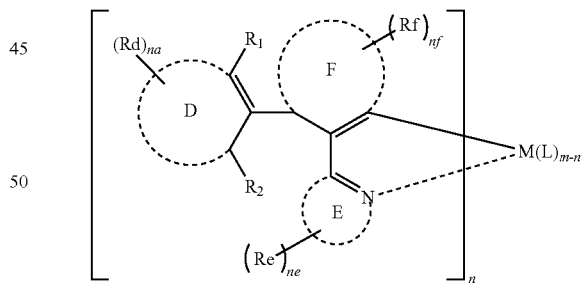

wherein, rings D, E, and F each independently represent a 5- or 6-membered aromatic hydrocarbon or aromatic heterocyclic ring or a condensed ring of a 5- or 6-membered aromatic hydrocarbon or aromatic heterocyclic ring; $R_1$, $R_2$, Rd, Re, and Rf each independently represents a hydrogen atom, a halogen atom, a cyano group, or an optionally substituted alkyl, alkenyl, alkynyl, alkoxy, amino, silyl, arylalkyl, aryl, heteroaryl, non-aromatic hydrocarbon ring, or non-aromatic heterocyclic group; $n_d$ and $n_f$ each independently represent an integer of 1 to 3; $n_e$ represents an integer of 1 to 4; $R_2$ optionally bonds to an atom constituting ring E to form a 5- or 6-membered aromatic hydrocarbon or aromatic heterocyclic ring or a condensed ring of the 5- or 6-membered aromatic hydrocarbon or aromatic heterocyclic ring; L represents one or more monoanionic bidentate ligands coordinated to M; M represents a transition metal atom having an atomic number of 40 or more and belonging to any one of Groups 8 to 10 in the periodic table; m-n represents an integer of 0 to 2; n represents an integer of 1 to 3; and m represents 2 or 3.

9. The organic electroluminescent element according to claim 1, wherein the host compound has a partial structure represented by Formula (3):

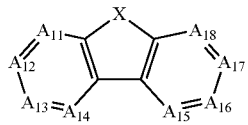

wherein, X represents an oxygen atom, a sulfur atom, or an $NR^1$ group; and $A_{11}$ to $A_{18}$ each independently represent a nitrogen atom or $CR^2$, wherein $R^1$ and $R^2$ each independently represent a bonding hand, a hydrogen atom, or a substituent; and if there are a plurality of $CR^2$'s, they may be the same or different.

10. The organic electroluminescent element according to claim 9, wherein X in Formula (3) represents an oxygen atom.

* * * * *